United States Patent
Mizutani et al.

(10) Patent No.: US 6,878,502 B2
(45) Date of Patent: Apr. 12, 2005

(54) POSITIVE RESIST COMPOSITION

(75) Inventors: Kazuyoshi Mizutani, Shizuoka (JP); Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 158 days.

(21) Appl. No.: 10/187,291

(22) Filed: Jul. 2, 2002

(65) Prior Publication Data

US 2003/0134224 A1 Jul. 17, 2003

(30) Foreign Application Priority Data

Jul. 3, 2001 (JP) ..................................... P.2001-202240
Jul. 3, 2001 (JP) ..................................... P.2001-202242
Jul. 3, 2001 (JP) ..................................... P.2001-202243

(51) Int. Cl.$^7$ ..................... G03F 7/038; G03F 7/039
(52) U.S. Cl. ..................... 430/270.1; 430/907; 430/914
(58) Field of Search .............. 430/270.1, 907, 430/914

(56) References Cited

U.S. PATENT DOCUMENTS

| 6,610,456 B2 | * | 8/2003 | Allen et al. .................. 430/907 |
| 6,753,132 B2 | * | 6/2004 | Kishimura et al. .......... 430/322 |
| 2002/0061464 A1 | * | 5/2002 | Acai et al. .................. 430/914 |
| 2002/0155376 A1 | | 10/2002 | Hashimoto et al. |
| 2002/0160297 A1 | * | 10/2002 | Fedynyshyn et al. .... 430/270.1 |
| 2003/0108811 A1 | * | 6/2003 | Mizutani et al. ............ 430/914 |

FOREIGN PATENT DOCUMENTS

| DE | 42 07 261 A1 | 9/1993 |
| DE | 42 07 264 A1 | 9/1993 |
| JP | 2002-2396781 A | 10/2002 |
| WO | WO 00/17712 A1 | 3/2000 |
| WO | WO 02/069043 A2 | 9/2002 |

OTHER PUBLICATIONS

Hiroshi Ito, et al. "Polymer design for 157 nm chemically amplified resists." Proceedings of SPIE vol. 4345, 2001, pp. 273–284.
H. Ito, et al. "Novel Fluoropolymers for Use in 157 nm Lithography." Journal of Photopolymer Science and Technology. vol. 14, No. 4,, 2001, pp. 583–593.
Fender P.J. Brock et al., "Characterization of New Aromatic Polymers for 157 nm Photoresist Applications", SPIE vol. 4345 (2001), pp. 417–427.
Theodore H. Fedynyshyn et al., "High Resolution Fluorocarbon Based Resist for 157–nm Lithography", SPIE vol. 4345 (2001), pp. 296–307.
Roderick R. Kunz et al., "Experimental VUV Absorbance Study of Fluorine–Functionalized Polystyrenes", SPIE vol. 4345 (2001), pp. 285–295.
XP–002251501—Derwent Publication—abstract (2002).
European Search Report dated Sep. 8, 2003.

* cited by examiner

Primary Examiner—Richard L. Schilling
(74) Attorney, Agent, or Firm—Sughrue Mion, PLLC

(57) ABSTRACT

A positive resist composition comprises (A) a resin which comprises a specified repeating units and (B) a compound capable of generating an acid upon irradiation with one of an actinic ray and a radiation.

13 Claims, No Drawings

POSITIVE RESIST COMPOSITION

FIELD OF THE INVENTION

The present invention relates to a positive resist composition preferably used in micro-lithographic processes for the manufacture of VLSI's and micro-tips with large capacities, and other photo-fabrication processes. More specifically, it relates to a positive resist composition capable of forming fine patterns with use of a vacuum ultraviolet ray having a wavelength not longer than 160 nm.

BACKGROUND OF THE INVENTION

Integrated circuits are still raising the degree of integration; in the manufacture of semiconductor tips such as VLSI's, it has become essential to process ultra-fine patterns comprising line widths below a quarter micron. As one of the means to reduce pattern dimension, it is well known to make short the wavelength of the exposure energy source used for resist pattern formation.

As an example, in the manufacture of semiconductor tips having a degree of integration up to 64 Mbits, the i line (365 nm) of a high-pressure mercury lamp has been used as the exposure source. As positive resists for this light source, a number of compositions based on a novolac resin and naphthoquinonediazide as a photo-sensitive material have been developed, which have achieved satisfactory results in the processing of lines having widths up to about 0.3 μm. Further, in the manufacture of semiconductor tips having a degree of integration of 256 Mega bits or higher, the KrF excimer laser light (248 nm) instead of the i line has been adopted as the exposure light source.

Further, in order to cope with the manufacture of semiconductors with a degree of integration of 1 Giga bits or higher, the use of the ArF excimer laser light (193 nm) and, further for the formation of patterns not exceeding 0.1 μm size, the use of the $F_2$ excimer laser light (157 nm) are under investigation.

To adapt themselves to the wavelength shortening in the light source, the ingredients composing resist materials and their chemical structures are also changing drastically. Since the conventional resist comprising a novolac resin and a naphthoquinonediazide compound exhibits a strong absorption in the deep UV region around 248 nm, the light is difficult to reach the bottom portion of the resist, thus the resist being of low sensitivity and giving patterns having a tapered configuration.

To solve such problems, the so-called chemical amplification resists have been developed in which a resin having a fundamental backbone of poly(hydroxystyrene) that exhibits a weak absorption in the 248 nm region and is protected by an acid-decomposable group is used as a principal ingredient, and in which a compound (photo acid generator) that generates an acid upon irradiation with a deep UV light is jointly used. The chemical amplification resist, which changes the solubility in the developer via a decomposition reaction catalyzed by the acid generated at exposed areas, can form high-resolution patterns with a small amount of exposure.

However, in the case of using an ArF excimer laser light (193 nm), a satisfactory performance was not achieved even with the chemical amplification resist since compounds having an aromatic group essentially exhibit a strong absorption at the 193 nm wavelength region.

To solve this problem, an improvement of chemical amplification resists is being investigated by replacing the acid-decomposable resin having a fundamental backbone of poly(hydroxystyrene) to another acid-decomposable resin in which an alicyclic structure not absorbing 193 nm light is introduced in the main or side chain of a polymer.

For the $F_2$ excimer laser light (157 nm), however, even the above-cited alicyclic resins proved to have a strong absorption in the 157 nm region, thus being unsatisfactory to form 0.1 μm or finer patterns. In contrast, it has been reported in Proc. SPIE, Vol. 3678, p. 13 (1999) that resins to which fluorine atoms are introduced in the form of perfluoro structure exhibit a sufficient transparency for the 157 nm radiation. Further, effective structures of such fluorine-containing resins have been proposed in Proc. SPIE, Vol. 3999, p. 330 (2000), p. 357 (2000) and p. 365 (2000), WO-00/17712, etc.

At SPIE's Micro-lithography Symposium 2001, a resist for the $F_2$ light using a copolymer of 4-[bis(trifluoromethyl)-hydroxymethyl]styrene with t-butyl methacrylate was reported. But the resist based on this copolymer had a problem that the roughness of the pattern surface after development is too large. Moreover, the number of particles in the resist fluid was large, which further increased with the expansion of storage period thus causing a problem in storage stability.

In addition to these problems, there was still another problem that a large amount of scum generated in the space portions in line-and-space patterns. In the specification of DE10054996A is disclosed a resin for $F_2$ resists obtained by copolymerizing an acrylate monomer having a fluorine atom at the α-position or in the ester moiety with p-hydroxystyrene or a tertiary ester-containing (meth) acrylate. However, this type of resist also suffered from the problem of noticeable scum generation in the space portion in line-and-space patterns.

Resists containing these fluoro-resins exhibited an insufficient dissolution contrast between the exposed and unexposed regions. Further, due to the specific water-repellent as well as oil-repellent property originating from the perfluoro structure, the improvement of the coating performance (the uniformity of the coating surface) and the suppression of development defect were also expected.

SUMMARY OF THE INVENTION

Accordingly, a first object of the invention is to provide a positive resist composition suitably used for exposure sources of 160 nm or shorter wavelength, in particular, the $F_2$ excimer laser (157 nm), and is more specifically to provide a positive resist composition exhibiting an improved surface roughness as well as an excellent storage stability. Further, it is to provide a positive resist composition with which development defect is reduced, too.

A second object of the invention is to provide a positive resist composition suitably used for exposure sources of 160 nm or shorter wavelength, in particular, the $F_2$ excimer laser (157 nm), and is more specifically to provide a positive resist composition exhibiting an improved surface roughness as well as an improved scum performance.

A third object of the invention is to provide a positive resist composition suitably used for exposure sources of 160 nm or shorter wavelength, in particular, the $F_2$ excimer laser (157 nm), and is more specifically to provide a positive resist composition exhibiting a sufficient transparency when a 157 nm light source is used, an excellent coating performance, suppressed development defect and a good dissolution contrast.

In view of the various characteristics mentioned above, the present inventors have devised the invention as a result of a focused investigation by finding that the objects of the invention can be completely achieved with use of specific compositions to be described below.

(1) A positive resist composition comprising:

(A) a resin which decomposes by the action of acid to increase the solubility in an alkali developer, the resin comprising:

a repeating unit (1) represented by the following general formula (I);

a repeating unit (2) that is copolymerizable with the repeating unit represented by the general formula (I) and has the function of decomposing by the action of acid to increase the solubility of the resin in an alkali developer; and a repeating unit (3) that is inactive to the action of acid and free of an alkali-soluble group; and (B) a compound capable of generating an acid upon irradiation with one of an actinic ray and a radiation:

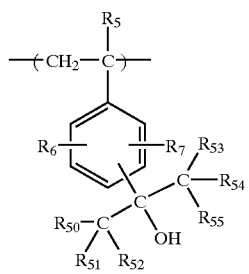

(I)

wherein $R_5$ represents a hydrogen atom, a halogen atom, a cyano group or an alkyl group which may have a substituent; $R_6$ and $R_7$, which may be the same or different, each represent a hydrogen atom, a halogen atom, a cyano group, a hydroxyl group or, an alkyl, a cycloalkyl, an alkoxyl, an acyl, an a cyloxy, an alkenyl, an aryl or an aralkyl group, each of which may have a substituent; each of $R_{50}$ to $R_{55}$, which may be the same or different, represents a hydrogen atom, a fluorine atom or an alkyl group that may have a substituent; at least one of $R_{50}$ to $R_{55}$ represents a fluorine atom or an alkyl group in which at least a hydrogen atom is substituted with a fluorine atom.

(2) The positive resist composition according to the item (1), wherein the repeating unit (3) contains at least one fluorine atom.

(3) The positive resist composition according to the item (1) or (2), wherein the repeating unit (2) is represented by the following general formula (II):

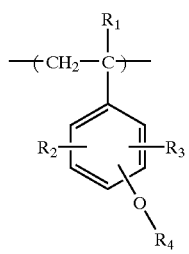

(II)

wherein $R_1$ represent a hydrogen atom, a halogen atom, a cyano group or an alkyl group which may have a substituent; $R_2$ and $R_3$, which may be the same or different, each represent a hydrogen atom, a halogen atom, a cyano group, a hydroxyl group or, an alkyl, a cycloalkyl, an alkoxyl, an acyl, an acyloxy, an alkenyl, an aryl or an aralkyl group, each of which may have a substituent; $R_4$ represents a group represented by the following general formula (IV) or (V):

(IV)

(V)

wherein $R_{11}$, $R_{12}$ and $R_{13}$, which may be the same or different, each represent an alkyl, a cycloalkyl, an alkenyl, an aralkyl, or an aryl group, each of which may have a substituent; two of $R_{11}$ to $R_{13}$ may connect together to form a ring; $R_{14}$ and $R_{15}$, which may be the same or different, each represent a hydrogen atom or an alkyl group that may have a substituent; $R_{16}$ represent an alkyl, a cycloalkyl, an aralkyl or an aryl group, each of which may have a substituent; two of $R_{14}$ to $R_{16}$ may connect together to form a ring.

(4) The positive resist composition according to the item (1) or (2), wherein the repeating unit (2) is represented by the following general formula (III):

(III)

wherein $R_{17a}$ and $R_{17}$, which may be the same or different, each represent a hydrogen atom, a halogen atom, a cyano group or an alkyl group that may have a substituent; $R_{18}$ represents $—C(R_{18d})(R_{18e})(R_{18f})$ or $—C(R_{18d'})(R_{18e'})(OR_{18f})$; $R_{18d}$ to $R_{18f}$, which may be the same or different, each represent an alkyl, a cycloalkyl, an alkenyl, an aralkyl or an aryl group, each of which may have a substituent; $R_{18d'}$ to $R_{18f'}$, which may be the same or different, each represent a hydrogen atom or, an alkyl, a cycloalkyl, an alkenyl, an aralkyl or an aryl group, each of which may have a substituent; two of $R_{18d}$ to $R_{18f}$ or two of $R_{18d'}$ to $R_{18f'}$ may connect together to form a ring; A represents a single bond or a divalent connecting group.

(5) The positive resist composition according to the item (4), wherein in the general formula (III), $R_{18}$ is represented by the following general formula (III-B):

(III-B)

wherein $R_{18h}$ represents an alkyl, a cycloalkyl, an alkenyl, an alkynyl, an aralkyl or an aryl group, each of which may have a substituent; Z represents an atomic group constituting a monocyclic or polycyclic aliphatic group together with the carbon atom in the general formula (III-B).

(6) The positive resist composition according to the item (1), wherein the repeating unit (3) is a repeating unit corresponding to a monomer selecting from the group consisting of: a (meth)acrylic acid ester; a (meth) acrylonitrile; and a styrene that may contain an alkyl group, an alkoxy group, an acyloxy group, a haloalkyl group, a chlorine atom, a bromine atom or a iodine atom as a substituent.

(7) The positive resist composition according to the item (2), wherein the repeating unit (3) is a repeating unit selecting from the group consisting of: a repeating unit corresponding to an α-trifluoroacylic acid ester; a repeating unit corresponding to a fluorine-containing alkyl ester of (meth)acrylic acid; a repeating unit corresponding to a vinylphenol ester of a benzene sulfonic acid containing one of a fluorine atom and a fluorine-substituted alkyl group; and a repeating unit represented by the following formula (IV):

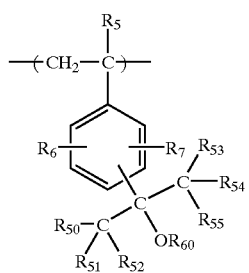

(IV)

wherein $R_5$ represents a hydrogen atom, a halogen atom, a cyano group or an alkyl group that may have a substituent; $R_6$ and $R_7$, which may be the same or different, each represent a hydrogen atom, a halogen atom, a cyano group, a hydroxyl group or, an alkyl, a cycloalkyl, an alkoxy, an acyl, an acyloxy, an alkenyl, an aryl or an aralkyl group, each of which may have a substituent; $R_{50}$ to $R_{55}$, which may be the same or different, each represent a hydrogen atom, a fluorine atom or an alkyl group that may have a substituent; at least one of $R_{50}$ to $R_{55}$ represents a fluorine atom or an alkyl group in which at least one hydrogen atom is substituted with a fluorine atom; $R_{60}$ represents an alkyl, an alkylcarbonyl, a monocyclic or polycyclic cycloalkyl, a monocyclic or polycyclic cycloalkylcarbonyl, an alkenyl, an alkenylcarbonyl, an aralkyl, an aralkylcarbonyl, an aryl or an arylcarbonyl group, each of which may have a substituent.

(8) A positive resist composition comprising:

(A1) a resin which decomposes by the action of acid to increase the solubility in an alkali developer, the resin comprising a repeating unit represented by the following general formula (I), a repeating unit represented by the following general formula (II) and a repeating unit represented by the following general formula (VI); and (B) a compound capable of generating an acid upon irradiation with one of an actinic ray and a radiation:

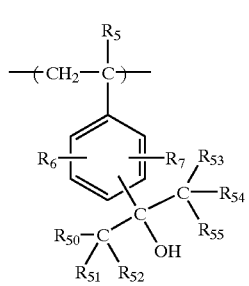

(I)

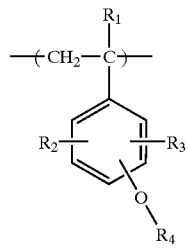

(II)

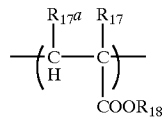

(VI)

wherein $R_1$, $R_5$, $R_{17a}$ and $R_{17}$, which may be the same or different, each represent a hydrogen atom, a halogen atom, a cyano group or an alkyl group that may have a substituent; $R_2$, $R_3$, $R_6$ and $R_7$, which may be the same or different, each represent a hydrogen atom, a halogen atom, a cyano group, a hydroxyl group or, an alkyl, a cycloalkyl, an alkoxy, an acyl, an acyloxy, an alkenyl, an aryl or an aralkyl group, each of which may have a substituent; $R_{50}$ to $R_{55}$, which may be the same or different, each represent a hydrogen atom, a fluorine atom or an alkyl group that may have a substituent; at least one of $R_{50}$ to $R_{55}$ represents a fluorine atom or an alkyl group in which at least one hydrogen atom is substituted with a fluorine atom; $R_4$ represents a group represented by the following general formula (IV) or (V); $R_{18}$ represents —$C(R_{18d})(R_{18e})(R_{18f})$ or —$C(R_{18d})(R_{18e})(OR_{18g})$; $R_{18d}$ to $R_{18g}$, which may be the same or different, represents a hydrogen atom or, an alkyl, a cycloalkyl, an alkenyl, an aralkyl or an aryl group, each of which may have a substituent; two of $R_{18d}$, $R_{18e}$ and $R_{18f}$, or two of $R_{18d}$, $R_{18e}$ and $R_{18g}$ may connect together to form a ring; at least one of $R_{18d}$, $R_{18e}$ and $R_{18f}$ or at least one of $R_{18d}$, $R_{18e}$ and $R_{18g}$ is a fluorine-containing group.

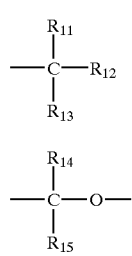

(IV)

(V)

wherein $R_{11}$, $R_{12}$ and $R_{13}$, which may be the same or different, each represent an alkyl, a cycloalkyl, an alkenyl, an aralkyl or an aryl group, each of which may have a substituent; two of $R_{11}$ to $R_{13}$ may connect together to form a ring; $R_{14}$ and $R_{15}$, which may be the same or different, each represent a hydrogen atom or an alkyl group that may have a substituent; $R_{16}$ represents an alkyl, a cycloalkyl, an aralkyl, or an aryl group, each of which may have a substituent; two of $R_{14}$ to $R_{16}$ may connect together to form a ring.

(9) The positive resist composition according to the item (8), wherein $R_{18}$ in the general formula (VI) is represented by the following general formula (VI-B):

(VI-B)

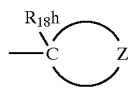

wherein $R_{18h}$ represents an alkyl, an alkenyl, an alkynyl, an aralkyl or an aryl group, each of which may have a substituent; Z represents an atomic group constituting a monocyclic or polycyclic aliphatic group together with the carbon atom in general formula (VI-B); at least one of $R_{18h}$ and Z contains a fluorine atom.

(10) The positive resist composition according to the item (8), wherein at least one of $R_5$ in the general formula (I) above, $R_1$ in the general formula (II) above and $R_{17}$ in the general formula (VI) above is a trifluoromethyl group.

(11) The positive resist composition according to the item (8), wherein the resin (A1) further contains at least one repeating unit represented by the following general formulae (III) and (VII):

(III)

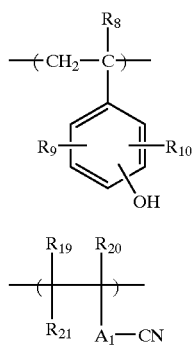

(VII)

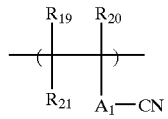

wherein $R_8$ represents a hydrogen atom, a halogen atom, a cyano group or an alkyl group that may have a substituent; $R_9$ and $R_{10}$, which may be the same or different, each represents a hydrogen atom, a halogen atom, a cyano group or, an alkyl, a cycloalkyl, an alkoxy, an acyl, an acyloxy, an alkenyl, an aryl or an aralkyl group, each of which may have a substituent; $R_{19}$ and $R_{20}$, which may be the same or different, each represent a hydrogen atom, a halogen atom, a cyano group or an alkyl group that may have a substituent; $R_{21}$ represents a hydrogen atom, a halogen atom, an alkyl group that may have a substituent, or -$A_1$-CN; $A_1$ represents a single bond or a divalent connecting group.

(12) The positive resist composition according to the item (8), wherein the resin (A1) further contains at least one of repeating units represented by the following general formulae (VIII) to (XVII):

(VIII)

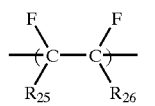

(IX)

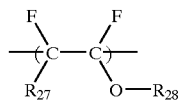

(X)

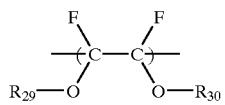

(XI)

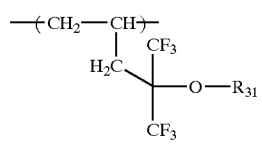

(XII)

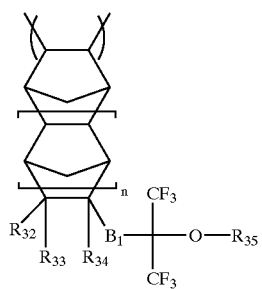

(XIII)

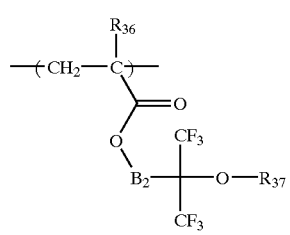

(XIV)

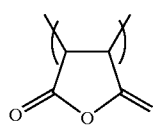

(XV)

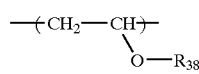

(XVI)

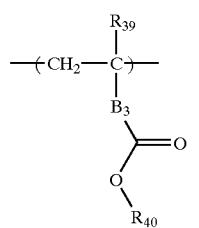

(XVII)

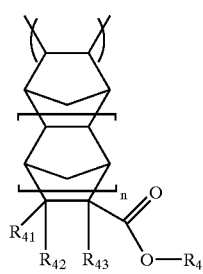

wherein $R_{25}$, $R_{26}$ and $R_{27}$, which may be the same or different, each represent a hydrogen atom, a fluorine atom or, an alkyl, a cycloalkyl or an aryl group, each of which may have a substituent; $R_{28}$, $R_{29}$ and $R_{30}$, which may be the same or different, each represent an alkyl, a cycloalkyl or an aryl group, each of which may have a substituent; $R_{25}$ and $R_{26}$, $R_{27}$ and $R_{28}$, or $R_{29}$ and $R_{30}$ may connect together to form a ring; $R_{31}$, $R_{35}$, $R_{37}$, $R_{40}$ and $R_{44}$, which may be the same or different, each represent a hydrogen atom or, an alkyl, a cycloalkyl, an acyl or an alkoxycarbonyl group, each of which may have a substituent; $R_{32}$, $R_{33}$, $R_{34}$, $R_{41}$, $R_{42}$ and $R_{43}$, which may be the same or different, each represent a hydrogen atom, a halogen atom or, an alkyl or an alkoxy group, each of which may have a substituent; $R_{36}$ and $R_{39}$, which may be the same or different, each represent a hydrogen atom, a halogen atom, a cyano group or an alkyl group that may have a substituent; $R_{38}$ represents an alkyl, a cycloalkyl, an aralkyl or an aryl group, each of which may have a substituent; $B_1$ and $B_2$ each independently represents a single bond or a divalent connecting group; $B_3$ represents a divalent connecting group; and n represents 0 or 1.

(13) The positive resist composition according to the item (1) or (8), which further comprises a resin decomposing by the action of acid to increase the solubility in an alkali developer, the resin containing the repeating units (1) and (2).

(14) The positive resist composition according to the item (1) or (8), which further comprises (D) a surfactant containing at least one of a fluorine atom and a silicon atom.

(15) The positive resist composition according to the item (1) or (8), which further comprises a basic compound containing a nitrogen atom as (E) an inhibitor of acid diffusion.

(16) The positive resist composition according to the item (1) or (8), which is a composition to be irradiated by the $F_2$ laser light having a wavelength of 157 nm.

DETAILED DESCRIPTION OF THE INVENTION

In the following, compounds used for the invention will be described in detail.

[1] Resin (A) of the Invention

The resin as component (A) for use in the invention comprises a repeating unit (1) represented by general formula (I) cited above, a repeating unit (2) that is copolymerizable with the unit represented by general formula (I) and has a function of increasing the solubility in an alkali developer via the decomposition caused by the action of acid, and a repeating unit (3) that is inactive to the action of acid and free of an alkali-soluble group, and decomposes by the action of acid to increase the solubility in an alkali developer.

Repeating unit (1) is represented by general formula (I) cited above.

Any repeating unit may be used as repeating unit (2) provided that it is copolymerizable with the unit represented by general formula (I) and has a function of increasing the solubility in an alkali developer via the decomposition caused by the action of acid; however, it is preferably represented by general formula (II) or (III) described above.

Repeating unit (3) should preferably contain a fluorine atom.

Resin (A) in the invention should preferably satisfy the condition that $R_{18}$ in general formula (III) is represented by one of the above-cited general formula (III-B).

As the alkyl group mentioned above, one can mention, for example, those of straight chain or branched chain structure with 1 to 8 carbon atoms, and specifically methyl, ethyl, propyl, n-butyl, sec-butyl, hexyl, 2-ethylhexyl and octyl as preferable examples.

The cycloalkyl group may be monocyclic or polycyclic; one can preferably mention, as monocyclic examples, those of 3 to 8 carbon atoms, i.e., for example, cyclopropyl, cyclopentyl, cyclohexyl, cycloheptyl and cyclooctyl. The polycyclic examples preferably include those of 6 to 20 carbon atoms such as, for example, adamantyl, norbornyl, isobornyl, camphanyl, dicyclopentyl, α-pinel, tricyclodecanyl, tetracyclododecyl, androstanyl, etc. The cycloalkyl group includes those in which the carbon atoms constituting the ring are partially substituted with a hetero atom such as oxygen, sulfur, nitrogen, etc.

The aryl groups are, for example, those with 6 to 15 carbon atoms, specifically including phenyl, tolyl, dimethylphenyl, 2,4,6-trimethylphenyl, naphthyl, anthryl, 9,10-dimethoxyanthryl, etc. as preferable examples.

The aralkyl groups are, for example, those with 7 to 12 carbon atoms, specifically including benzyl, phenethyl, naphthylmethyl, etc. as preferable examples.

The alkenyl groups are, for example, those with 2 to 8 carbon atoms, specifically including vinyl, allyl, butenyl and cyclohexenyl as preferable examples.

The alkoxyl groups are, for example, those with 1 to 8 carbon atoms, specifically including methoxy, ethoxy, n-propoxy, iso-propoxy, butoxy, pentoxy, allyloxy, octoxy, etc. as preferable examples.

The acyl groups are, for example, those with 1 to 10 carbon atoms, specifically including formyl, acetyl, propanoyl, butanoyl, pivaloyl, octanoyl, benzoyl etc. as preferable examples.

The acyloxy groups are preferably, for example, those with 2 to 12 carbon atoms, specifically including acetoxy, propionyloxy, benzoyloxy, etc.

The alkynyl groups are preferably, for example, those with 2 to 5 carbon atoms, specifically including ethynyl, propynyl, butynyl, etc.

The alkoxycarbonyl groups include tertiary ones such as t-butoxycarbonyl, t-amyloxycarbonyl and 1-methyl-1-cyclohexyloxycarbonyl, etc.

As the halogen atom, one can mention fluorine atom, chlorine atom, bromine atom, iodine atom, etc.

The divalent connecting group includes a divalent alkylene, cycloalkylene, alkenylene, or arylene group that may be substituted, —O—CO—$R_{22a}$—, —CO—O—$R_{22b}$— or —CO—N($R_{22c}$)—$R_{22d}$—. $R_{22a}$, $R_{22b}$ and $R_{22d}$, which may the same or different, each represent a single bond, a divalent alkylene, cycloalkylene, alkenylene, or arylene group that may have an ether group, an ester group, an amido group, a urethane group or a ureido group. $R_{22c}$ represents a hydrogen atom, or an alkyl, cycloalkyl, aralkyl or aryl group that may be substituted. The alkyl, cycloalkyl, aralkyl and aryl groups as $R_{22c}$ are the same as those which have been explained previously.

As the alkylene group, one canmention those with a straight chain or branched chain structure, including, for example, those with 1 to 8 carbon atoms such as methylene, ethylene, propylene, butylene, hexylene, octylene, etc.

As the cycloalkylene group, those with 5 to 8 carbon atoms such as cyclopentylene, cyclohexylene, etc. are mentioned.

As the alkenylene group, those with 2 to 6 carbon atoms are mentioned such as ethenylene, propenylene, butenylene, etc. all of which may preferably have a substituent.

As the arylene group, those with 6 to 15 carbon atoms are mentioned such as phenylene, tolylene, naphthylene, etc. all of which may preferably have a substituent.

As the ring resulting from the connection of two of $R_{18d}$ to $R_{18f}$, two of $R_{18d'}$ to $R_{18f'}$, two of $R_{14}$ to $R_{16}$, $R_{25}$ and $R_{26}$, $R_{27}$ and $R_{28}$, or $R_{29}$ and $R_{30}$, 3- to 8-membered ones are, for example, mentioned. Specific cyclic groups include cyclopropane, cyclopentane, cyclohexane, tetramethylene oxide, pentamethylene oxide, hexamethylene oxide, furan, pyran, dioxonol, 1,3-dioxolane, etc.

Z represents an atomic group constituting a monocyclic or polycyclic aliphatic group together with the carbon atom in general formula (III-B). As the monocyclic aliphatic group, those with 3 to 8 carbon atoms are preferred including, for example, cyclopropyl, cyclopentyl, cyclohexyl, cycloheptyl, cyclooctyl, etc. As the polycyclic aliphatic group, those with 6 to 20 carbon atoms are preferred including, for example, admantyl, norbornyl, isobornyl, camphanyl, dicyclopentyl, α-pynel, tricyclodecanyl, tetracyclododecyl, androstanyl, etc.

The alkyl group, cycloalkyl group, alkoxy group, acyl group, acyloxy group, alkynyl group, alkenyl group, aryl group, aralkyl group, alkoxycarbonyl group, alkylene group, cycloalkylene group, alkenylene group, arylene group, etc. described heretofore each may have a substituent.

Substituents that these groups may have include those having an active hydrogen such as an amino group, an amido group, a ureido group, a urethane group, a hydroxyl group, a carboxyl group, etc., a halogen (F, Cl, Br and I) atom, an alkoxy (methoxy, ethoxy, propoxy, butoxy, etc.) group, a thioether group, an acyl (acetyl, propanoyl, benzoyl, etc.) group, an acyloxy (acetoxy, propanoyloxy, benzoyloxy, etc.) group, an alkoxycarbonyl (methoxycarbonyl, ethoxycarbonyl, propoxycarbonyl, etc.) group, an alkyl (methyl, ethyl, propyl and butyl) group, a cycloalkyl (cyclohexyl) group, an aryl (phenyl) group, a cyano group, nitro group, etc.

In the invention, at least one of $R_5$ in general formula (I), $R_1$ in general formula (II), and $R_{17}$ in general formula (III) is preferably a trifluoromethyl group.

The group that is contained in the resin (A) of the invention and decomposed by the action of acid to exhibit alkali-solubility includes, for example, —O—C($R_{18d}$)($R_{18e}$) ($R_{18f}$), —O—C($R_{18d}$)($R_{18e}$)(O$R_{18f}$), —O—COO—C($R_{18d}$) ($R_{18e}$)($R_{18f}$), —O—C ($R_{01}$)($R_{02}$)COO—C($R_{18d}$)($R_{18e}$) ($R_{18f}$), —COO—C($R_{18d}$)($R_{18e}$)($R_{18f}$), —COO—C($R_{18d}$) ($R_{18e}$)(O$R_{18f}$), etc. $R_{18d}$ to $R_{18f}$ have the same meaning as described above. $R_{01}$ and $R_{02}$ each represent a hydrogen atom, an alkyl group, a cycloalkyl group, an alkenyl group, an aralkyl group or an aryl group all of which may be substituted with one of the substituents enumerated above.

Preferable examples include the ether or ester group of a tertiary alkyl group such as t-butyl, t-amyl, 1-alkyl-1-cyclohexyl, 2-alkyl-2-adamantyl, 2-adamantyl-2-propyl, 2-(4-methylcyclohexyl)-2-propyl, etc., the acetal or acetal ester group of 1-alkoxy-1-ethoxy, tetrahydropyranyl, etc., a t-alkylcarbonate group, a t-alkylcarbonylmethoxy group, etc. More preferable examples are the acetal groups of a 1-alkoxy-1-ethoxy group a tetrahydropyranyl group, etc.

In the case of an acetal group, the resin is actively decomposed by acid. Accordingly, due to the expanded range of selection for the acid-generating compound to be jointly used, the resin is advantageous as regard to sensitivity enhancement, the property shift occurring in the period between exposure and post-baking, etc. Particularly preferable acetal groups are those containing the alkoxy group derived from the aforementioned perfluoroalkyl group as the 1-alkoxy component of the acetal. With such a compound, the transmittance of short wavelength rays (for example, the 157 nm light from an $F_2$ excimer laser) can be further raised.

As specific examples of the repeating unit (1), the following ones are mentioned, but the scope of the invention is not limited by them.

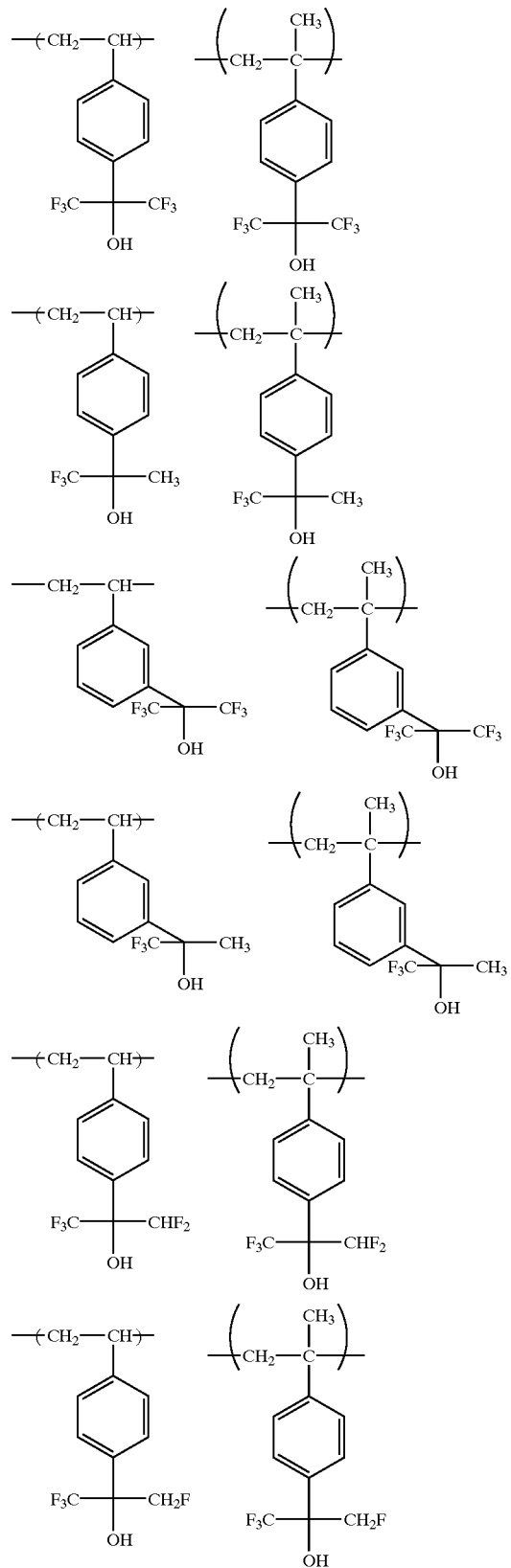

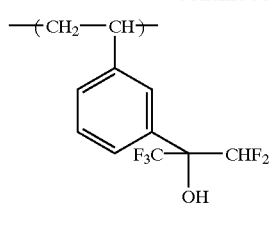
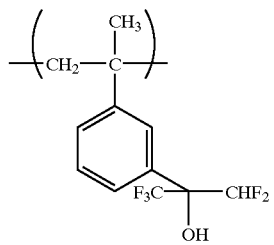
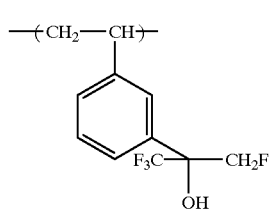
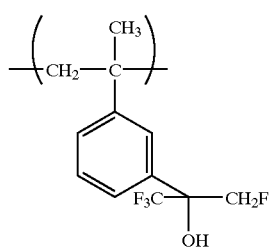
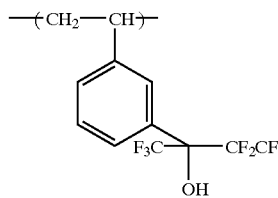
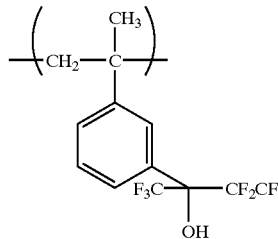
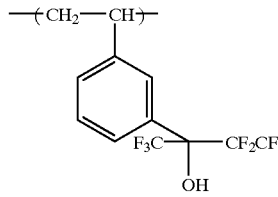
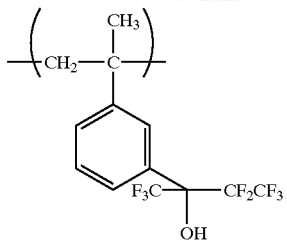
Specific examples of repeating unit (2) represented by general formula (II) are shown below, but the scope of the invention is not limited by them.
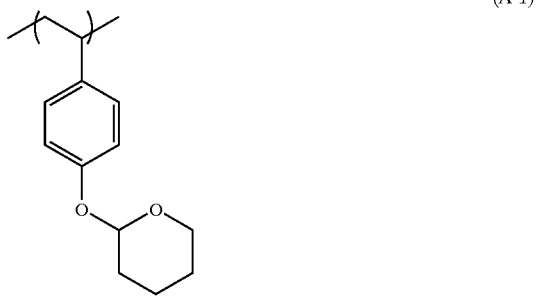
(A-1)
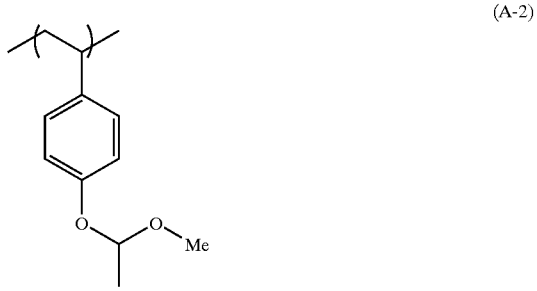
(A-2)
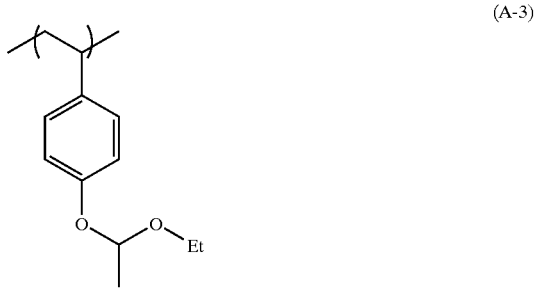
(A-3)
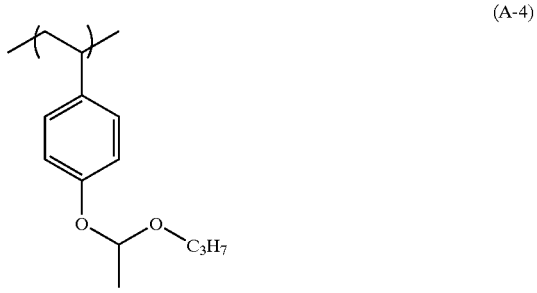
(A-4)

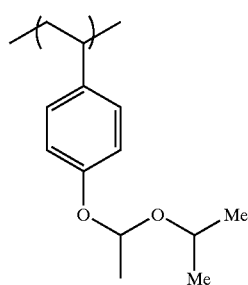 (A-5)
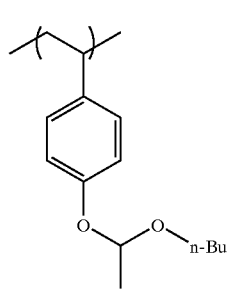 (A-6)
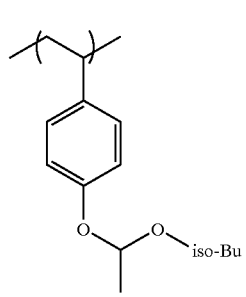 (A-7)
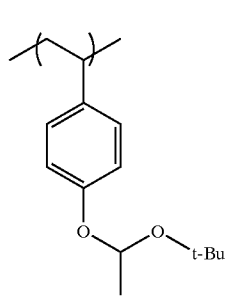 (A-8)
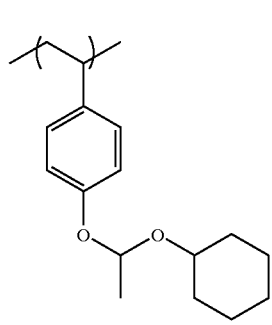 (A-9)
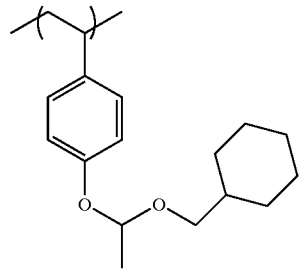 (A-10)
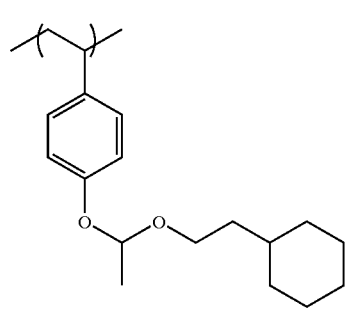 (A-11)
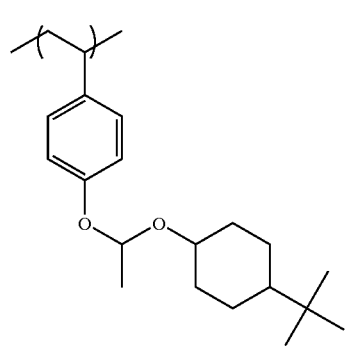 (A-12)
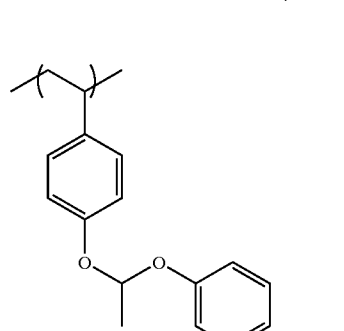 (A-13)
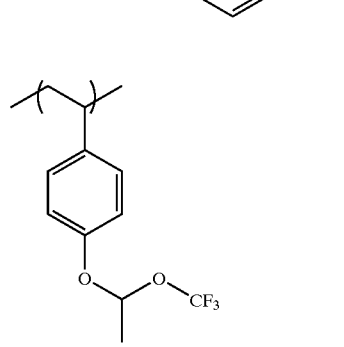 (A-14)

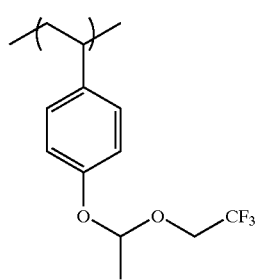 (A-15)
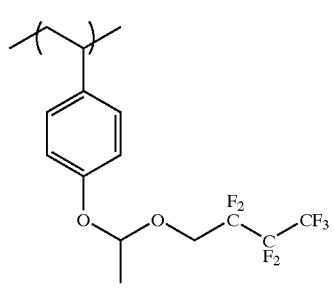 (A-16)
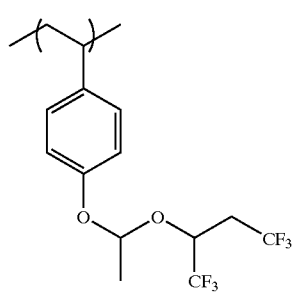 (A-17)
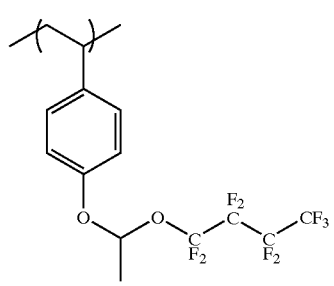 (A-18)
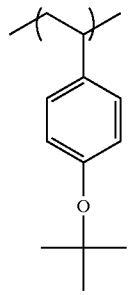 (A-19)
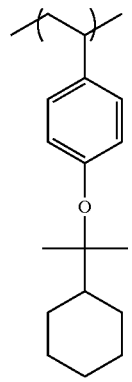 (A-20)
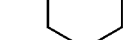 (A-21)
 (A-22)
 (A-23)

(A-24) 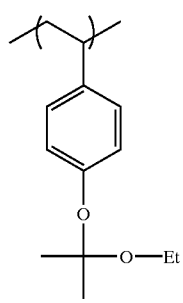
(A-25) 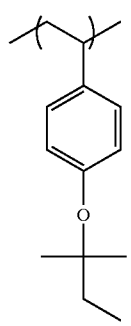
(A-26) 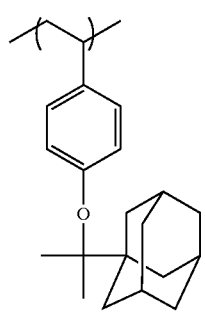
(A-27) 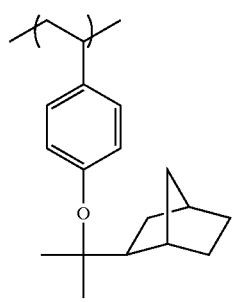
(A-28) 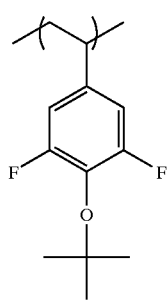
(A-29) 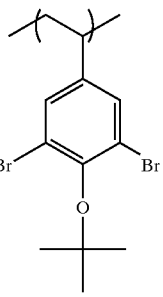
(A-30) 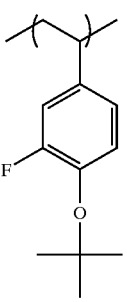
(A-31) 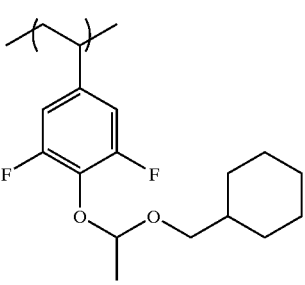
(A-32) 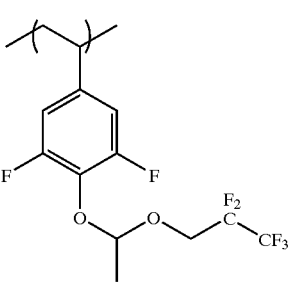
(A-33) 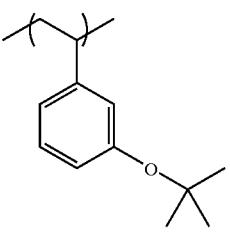

(A-34)
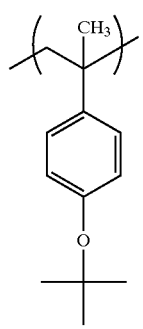
(A-35)
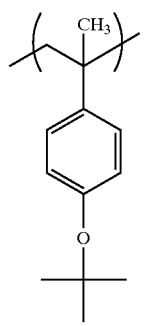
(A-36)
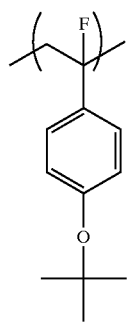
(A-37)
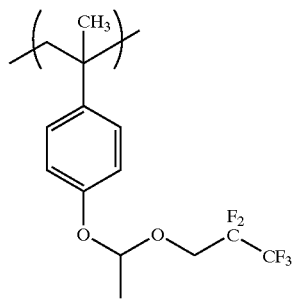
(A-38)
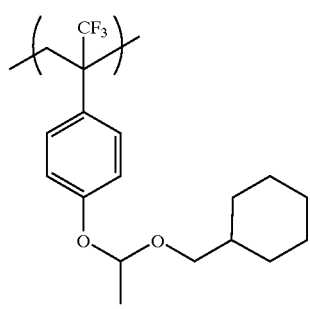
(A-39)
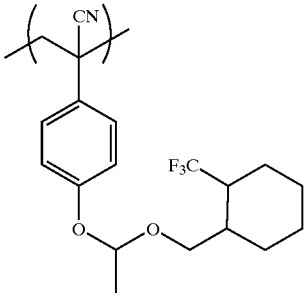
(A-40)
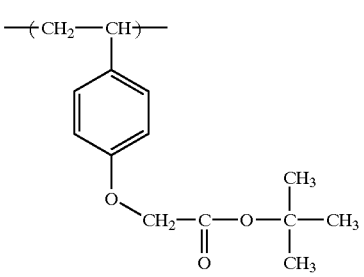
(A-41)
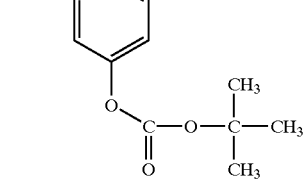
Specific examples of repeating unit (2) represented by general formula (III) are shown below, but the scope of the invention is not limited by them.
(B-1)
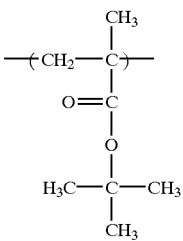
(B-2)
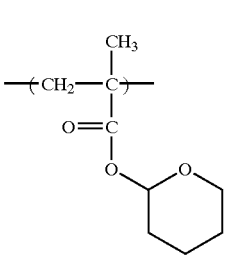

(B-3) 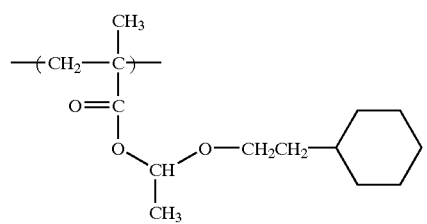
(B-4) 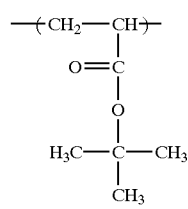
(B-5) 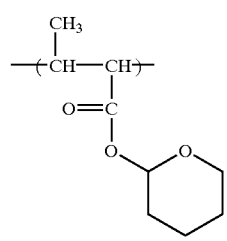
(B-6) 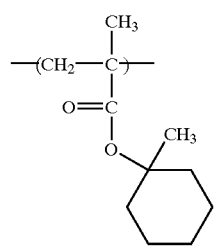
(B-7) 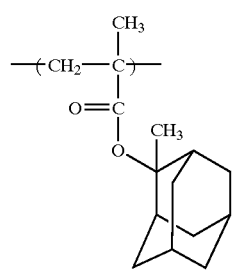
(B-8) 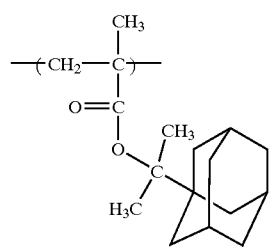
(B-9) 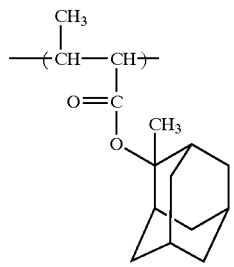
(B-10) 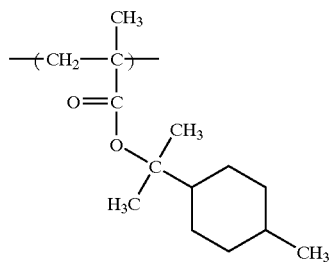
(B-11) 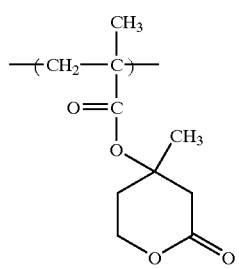
(B-12) 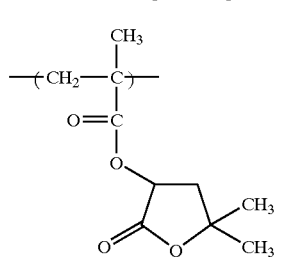
(B-13) 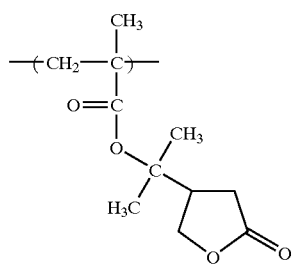
(B-14) 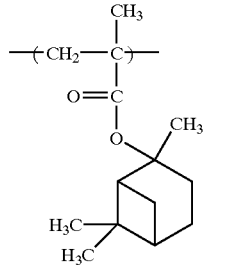

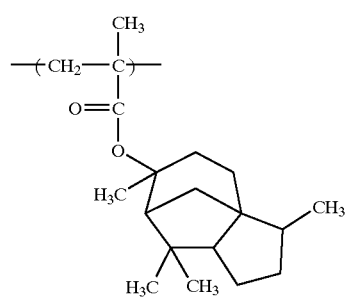 (B-15)
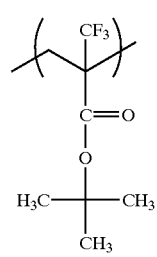 (B-16)
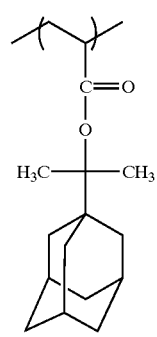 (B-17)
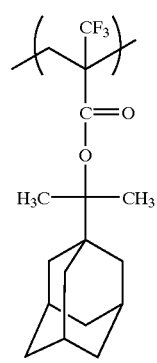 (B-18)
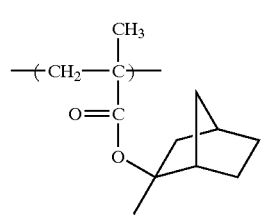 (B-19)
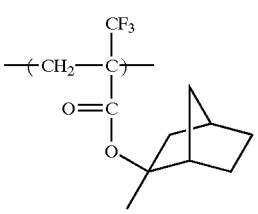 (B-20)
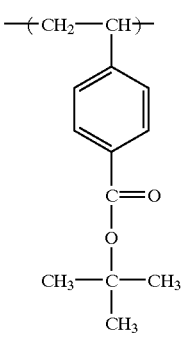 (B-21)
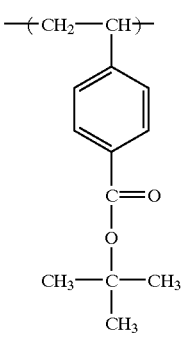 (B-22)
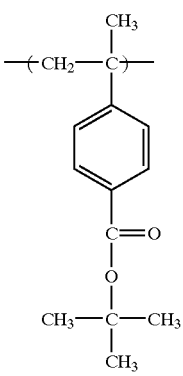 (B-23)

(B-24)

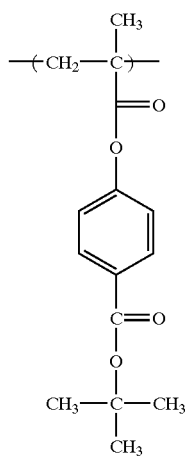

(B-25)

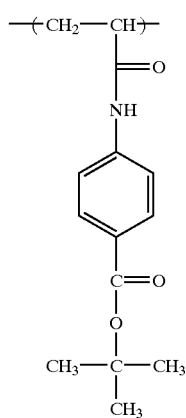

(B-26)

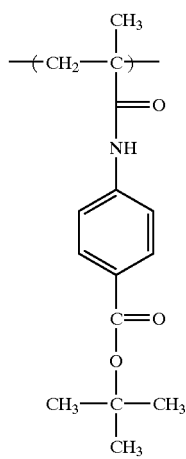

Repeating unit (3) is one that is inactive to the action of acid and free of any alkali-soluble group; this unit has no such a group that is decomposed by acid to exhibit alkali-solubility as was explained hereinabove. To be inactive to the action of acid means that no chemical reaction results by the action of acid. This repeating unit is preferably selected from the group consisting of (meth)acrylic acid esters, (meth)acrylonitrile, and styrene that may contain an alkyl, alkoxy, acyloxy or haloalkyl group, or a chlorine, bromide or iodine atom as a substituent.

To make sure, as the alkali-soluble group that repeating unit (3) does not contain, those, for example, having a pKa value not exceeding 11 are mentioned such as a phenolic hydroxide group, active methylene group, imide group, carboxyl group, sulfonic acid group, sulfinic acid group, etc.

The monomer usable as repeating unit (3) includes, for example, those shown below. That is, such examples are compounds having one addition-polymerizable unsaturated bond chosen from, for example, acrylic acid esters, acrylamide derivatives, methacrylic acid esters, methacrylamide derivatives, allyl compounds, vinyl ethers, vinyl esters, styrene derivatives, crotonic acid esters, etc. except those defined above.

Specific examples include the following. Acrylic acid esters such as, for example, alkyl (the number of the carbon atoms in the alkyl group being preferably 1 to 10) acrylates (for example, methyl acrylate, ethyl acrylate, propyl acrylate, amyl acrylate, cyclohexyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate, etc.) and aryl acrylates (for example, phenyl acrylate, etc.); methacrylic acid esters such as, for example, alkyl (the number of the carbon atoms in the alkyl group being preferably 1 to 10) methacrylates (for example, methyl methacrylate, ethyl methacrylate, propyl methacrylate, isopropyl methacrylate, amylmethacrylate, hexylmethacrylate, cyclohexylmethacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfurylmethacrylate, etc.), and aryl methacrylates (for example, phenyl methacrylate, cresyl methacrylate, naphthyl methacrylate, etc.); acrylamide derivatives such as acrylamide and N-alkylacrylamides (the alkyl group preferably having 1 to 10 carbon atoms, specifically including, for example, methyl, ethyl, propyl, butyl, t-butyl, heptyl, octyl, cyclohexyl, benzyl, hydroxyethyl, etc.), N-arylacrylamide (the aryl group being, for example, phenyl, tolyl, nitrophenyl, naphthyl, cyanophenyl, hydroxyphenyl, carboxyphenyl, etc.), N,N-dialkylacrylamides (the alkyl group preferably having 1 to 10 carbon atoms, including, for example, methyl, ethyl, butyl, isobutyl, ethylhexyl, cyclohexyl, etc.), N,N-diarylacrylamides (the aryl group being, for example phenyl, etc.), N-methyl-N-phenylacrylamide, N-hydroxyethyl-N-methylacrylamide and N-2-acetamidoethyl-N-acetylacrylamide, etc.; methacrylamides such as methacrylamide and N-alkylmethacrylamides (the alkyl group preferably having 1 to 10 carbon atoms, specifically including, for example, methyl, ethyl, t-butyl, ethylhexyl, hydroxyethyl, cyclohexyl, etc.), N-arylmethacrylamides (the aryl group being, for example, phenyl, etc.), N,N-dialkylmethacrylamides (the alkyl group including, for example, methyl, ethyl, propyl, butyl, etc.), N,N-diarylmethacrylamides (the aryl group being, for example, phenyl, etc.), N-hydroxyethyl-N-methylmethacrylamide, N-methyl-N-phenylmethacrylamide, N-ethyl-N-phenylmethacrylamide, etc.; allyl compounds such as allyl esters (including, for example, allyl acetate, allyl capronate, allyl caprylate, allyl laurate, allyl palmitate, allyl stearate, allyl benzoate, allyl acetoacetate, allyl lactate, etc.), allyloxyethanol, etc.; vinyl ethers such as, for example, alkylvinyl ethers (including, for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers such as, for example, vinyl phenyl ether, vinyl tolyl ether, vinyl chlorophenyl ether, vinyl 2,4-dichlorophenyl ether, vinyl naphthyl ether, vinyl anthranyl ether, etc.; vinyl esters such as, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, vinyl naphthoate, etc.; styrene derivatives such as, for example, styrene and alkylstyrenes (including, for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc.), alkoxystyrenes (including, for example, methoxystyrene, 4-methoxy-3-methylstyrene, dimethoxystyrene, etc.), halogenated styrenes (including, for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), carboxystyrenes and vinylnaphthalene; crotonic acid esters such as, for example, alkyl crotonates (including, for example, butyl crotonate, hexyl crotonate, glycerin monocrotonate, etc.); dialkyl itaconates (including, for example, dimethyl itaconate, diethyl itaconate, dibutyl itaconate, etc.); dialkyl esters of maleic acid or fumaric acid (including, for example, dimethyl maleate, dibutyl maleate, etc.), etc. In addition to these, any addition-polymerizable unsaturated compound that is copolymerizable may be used in general.

Repeating unit (3) should preferably be inactive to the action of acid, free of any alkali-soluble group, and contains at least one fluorine atom.

As this repeating unit (3), one can mention α-trifluoroacrylic acid esters, the fluorine-containing alkyl esters of (meth)acrylic acid, the benzenesulfonic acid esters of vinyl phenol that contain a fluorine atom or a fluorine-substituted alkyl group (exemplified by trifluoromethyl group) as substituent, and the repeating units represented by the following general formula (IV).

The ester moiety of α-trifluoroacrylic acid esters consists of an alkyl group that contains preferably 1 to 20 carbon atoms and is of straight chain, branched chain or cyclic structure. But more preferably, the ester moiety consists of a straight chain, branched chain, or cyclic alkyl group containing 1 to 10 carbon atoms or a cyclic alkyl group containing 6 to 14 carbon atoms.

The ester moiety of the fluorine-containing alkyl ester of (meth) acrylic acid consists of an alkyl group in which at least one hydrogen atom is substituted with a fluorine atom and which is of straight chain, branched chain or cyclic structure with 1 to 20 carbon atoms. More preferably, the ester moiety is an alkyl group in which at least one hydrogen atom is substituted with a fluorine atom and which is of straight chain, branched chain or cyclic structure with 1 to 10 carbon atoms, or a cyclic alkyl group of 6 to 14 carbon atoms in which at least one hydrogen atom is substituted with a fluorine atom.

The number of the fluorine atoms usually lies in the range of from 1 to 38, and preferably from 2 to 19. As the fluorine-containing alkyl group, those that have no fluorine atom on the carbon atom bonded to the ester group are preferred.

The definitions and specific examples of $R_5$, $R_6$, $R_7$ and $R_{50}$ to $R_{55}$ in formula (IV) are the same as those of the corresponding groups in formula (I).

$R_{60}$ represents an alkyl group, an alkylcarbonyl group, a monocyclic or polycyclic cycloalkyl group, a monocyclic or polycyclic cycloalkylcarbonyl group, an alkenyl group, an alkenylcarbonyl group, an aralkyl group, an aralkylcarbonyl group, an aryl group or an arylcarbonyl group. To the alkyl, cycloalkyl, alkenyl, aralkyl, and aryl moieties of these groups, these that have been explained as the substituents in formulae (I) to (III) can be applied. As the group represented by $R_{60}$, those in which at least one hydrogen atom is substituted with a fluorine atom are preferred.

In the following, specific examples of repeating unit (3) are enumerated, but the scope of the invention is not limited by them.

$CF_3CH_2OCO(CH_3)C{=}CH_2$
$CF_3CF_3CH_2OCO(CH_3)C{=}CH_2$
$F(CF_2)_4CH_2CH_2OCO(CH_3)C{=}CH_2$
$F(CF_2)_4CH_2CH(OH)CH_2OCO(CH_3)C{=}CH_2$
$F(CF_2)_6CH_2CH_2OCO(CH_3)C{=}CH_2$
$F(CF_2)_6CH_2CH(OH)CH_2OCO(CH_3)C{=}CH_2$
$F(CF_2)_8CH_2CH_2OCO(CH_3)C{=}CH_2$
$F(CF_2)_8CH_2CH(OH)CH_2OCO(CH_3)C{=}CH_2$
$F(CF_2)_{10}CH_2CH_2OCO(CH_3)C{=}CH_2$
$CF_3CF(CF_2)_2CH_2CH_2OCO(CH_3)C{=}CH_2$
$CF_3CF(CF_2)_2CH_2CH(OH)CH_2OCO(CH_3)C{=}CH_2$
$CF_3CF(CF_2)_4CH_2CH_2OCO(CH_3)C{=}CH_2$
$CF_3CF(CF_2)_4CH_2CH(OH)CH_2OCO(CH_3)C{=}CH_2$
$CF_3CF(CF_2)_6CH_2CH_2OCO(CH_3)C{=}CH_2$
$CF_3CF(CF_2)_6CH_2CH(OH)CH_2OCO(CH_3)C{=}CH_2$
$H(CF_2)_2CH_2OCO(CH_3)C{=}CH_2$
$H(CF_2)_4CH_2OCO(CH_3)C{=}CH_2$
$H(CF_2)_6CH_2OCO(CH_3)C{=}CH_2$
$H(CF_2)_8CH_2OCO(CH_3)C{=}CH_2$
$(CF_3)_2CHOCO(CH_3)C{=}CH_2$
$CF_3CHFCF_2CH_2OCO(CH_3)C{=}CH_2$
$CF_3CH_2OCOCH{=}CH_2$
$CF_3CF_3CH_2OCOCH{=}CH_2$
$F(CF_2)_4CH_2CH_2OCOCH{=}CH_2$
$F(CF_2)_4CH_2CH(OH)CH_2OCOCH{=}CH_2$
$F(CF_2)_6CH_2CH_2OCOCH{=}CH_2$
$F(CF_2)_6CH_2CH(OH)CH_2OCOCH{=}CH_2$
$F(CF_2)_8CH_2CH_2OCOCH{=}CH_2$
$F(CF_2)_8CH_2CH(OH)CH_2OCOCH{=}CH_2$
$F(CF_2)_{10}CH_2CH_2OCOCH{=}CH_2$
$CF_3CF(CF_2)_2CH_2CH_2OCOCH{=}CH_2$
$CF_3CF(CF_2)_2CH_2CH(OH)CH_2OCOCH{=}CH_2$
$CF_3CF(CF_2)_4CH_2CH_2OCOCH{=}CH_2$
$CF_3CF(CF_2)_4CH_2CH(OH)CH_2OCOCH{=}CH_2$
$CF_3CF(CF_2)_6CH_2CH_2OCOCH{=}CH_2$
$CF_3CF(CF_2)_6CH_2CH(OH)CH_2OCOCH{=}CH_2$
$H(CF_2)_2CH_2OCOCH{=}CH_2$
$H(CF_2)_4CH_2OCOCH{=}CH_2$
$H(CF_2)_6CH_2OCOCH{=}CH_2$
$H(CF_2)_8CH_2OCO(CH_3)C{=}CH_2$
$(CF_3)_2CHOCOCH{=}CH_2$
$CF_3CHFCF_2CH_2OCOCH{=}CH_2$
$CH_3OCO(CF_3)C{=}CH_2$
$CH_3CH_2OCO(CF_3)C{=}CH_2$
$CH_3CH_2CH_2OCO(CF_3)C{=}CH_2$
$(CH_3)_2CHOCO(CF_3)C{=}CH_2$ (CH$_3$)$_2$CHCH$_2$OCO(CF$_3$)C=CH$_2$
CH$_3$CH$_2$CH$_2$CH$_2$OCO(CF$_3$)C=CH$_2$
C$_6$H$_5$CH=CH$_2$
C$_6$H$_4$FCH=CH$_2$

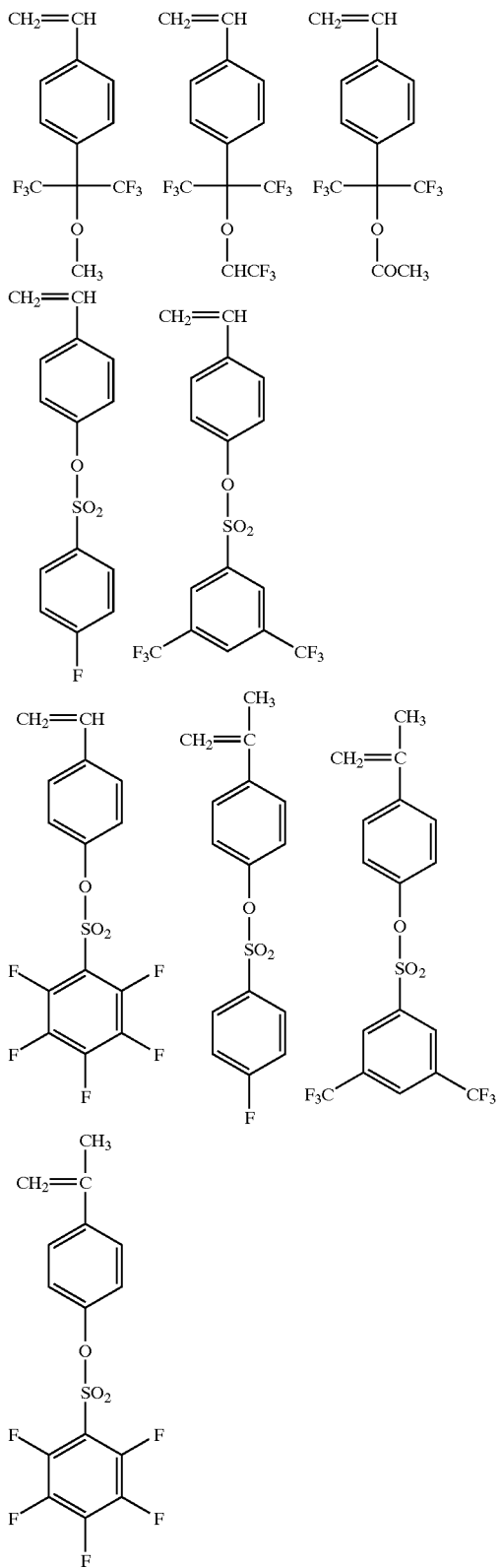

The content of the repeating unit (1) represented by general formula (I) is usually 30 to 85 mol %, preferably 40 to 80 mol %, and still more preferably 50 to 70 mol % in resin (A).

The content of the repeating unit (2) is usually 10 to 50 mol %, preferably 20 to 40 mol %, and still more preferably 25 to 35 mol % in resin (A).

The content of the repeating unit (3) is usually 2 to 40 mol %, preferably 3 to 30 mol %, and still more preferably 5 to 20 mol % in resin (A).

Resin (A) of the invention can contain, in addition to the repeating units cited above, another polymerizable monomer as a copolymerization component for the purpose of further improving various properties of the positive-type resist of the invention.

Each repeating structural unit shown by the specific examples enumerated hereinabove may consist of single species or plural species used as mixtures.

A preferable range of the molecular weight of resin (A) of the invention comprising the repeating units enumerated hereinabove is from 1,000 to 200,000, and more preferably from 3,000 to 20,000 in terms of weight-average value for practical use. The molecular weight distribution lies in the range of 1 to 10, preferably 1 to 3, and more preferably 1 to 2 for practical use. Resins having a narrower molecular weight distribution excel in resolution, give rise to smooth resist configuration with smoother side walls of the resist pattern, and excel in the roughness characeristics. Based on the total solid content of the composition, resin (A) of the invention is used at a content of 50 to 99.5% by weight, preferably 60 to 98% by weight, and more preferably 65 to 95% by weight.

Further, it is desirable to incorporate resin (A') that contains the above-cited repeating units (1) and (2) and decomposes by the action of acid to enhance the solubility in an alkali developer from the viewpoint of development defect reduction.

The molecular weight of resin (A') is substantially the same as that of resin (A).

Resin (A') is usually used in a content of from 2 to 30% by weight, preferably 5 to 20% by weight, and more preferably 10 to 15% by weight relative to resin (A).

Resin (A1) of the invention will be described.

Resin (A1) of the invention contains repeating units represented by each of the above-cited general formulae (I), (II) and (VI) and is capable of increasing the solubility in an alkali developer by the action of acid.

Resin (A1) of the invention may further contain at least one repeating unit represented by the above-cited general formulae (III) and (VII) to (XVII).

In general formulae (I), (II) and (VI), $R_1$, $R_5$, $R_{17a}$ and $R_{17}$, which may be the same or different, each represent a hydrogen atom, a halogen atom, a cyano group or an alkyl group that may have a substituent; $R_2$, $R_3$, $R_6$ and $R_7$, which may be the same or different, each represent a hydrogen atom, a halogen atom, a cyano group, a hydroxyl group or an alkyl, a cycloalkyl, an alkoxy, an acyl, an acyloxy, an alkenyl, an aryl or an aralkyl group that may have a substituent; $R_{50}$ to $R_{55}$, which may be the same or different, each represent a hydrogen atom, a fluorine atom or an alkyl group that may have a substituent with the condition that at least one of $R_{50}$ to $R_{55}$ represents a fluorine atom or an alkyl group in which at least one hydrogen atom is substituted with a fluorine atom; $R_4$ represents a group represented by the following general formula (IV) or (V); $R_{18}$ represents —C($R_{18d}$)($R_{18e}$)($R_{18f}$) or —C($R_{18d}$)($R_{18e}$)(OR$_{18g}$); $R_{18d}$ to $R_{18g}$, which may be the same or different, each represent a hydrogen atom or an alkyl, a cycloalkyl, an alkenyl, an aralkyl or an aryl group that may have a substituent; and two of $R_{18d}$, $R_{18e}$ and $R_{18f}$ or two of $R_{18d}$, $R_{18e}$ and $R_{18g}$ may connect together to form a ring with the condition that at least one of $R_{18d}$, $R_{18e}$ and $R_{18f}$ or at least one of $R_{18d}$, $R_{18e}$ and $R_{18g}$ is a fluorine-containing group.

In general formula (IV), $R_{11}$, $R_{12}$ and $R_{13}$, which may be the same or different, each represent an alkyl, a cycloalkyl, an alkenyl, an aralkyl or an aryl group that may have a substituent; and two of $R_{11}$ to $R_{13}$ may connect together to form a ring.

In general formula (V), $R_{14}$ and $R_{15}$, which may be the same or different, each represent a hydrogen atom or an alkyl group that may have a substituent; $R_{16}$ represents an alkyl, a cycloalkyl, an aralkyl, or an aryl group that may have a substituent; and two of $R_{14}$ to $R_{16}$ may connect together to form a ring.

In general formula (VI-B), $R_{18h}$ represents an alkyl, alkenyl, alkynyl, aralkyl or aryl group that may have a substituent. Z represents an atomic group constituting a monocyclic or polycyclic alicyclic group together with the carbon atom in general formula (VI-B). However, either of $R_{18h}$ or Z contains a fluorine atom.

In general formula (III), $R_8$ represent a hydrogen atom, a halogen atom, a cyano group or an alkyl group which may have a substituent; and $R_9$ and $R_{10}$, which may be the same or different, each represent a hydrogen atom, a halogen atom, a cyano group, or an alkyl, a cycloalkyl, an alkoxyl, an acyl, an acyloxy, an alkenyl, an aryl or an aralkyl group that may have a substituent.

In general formula (VII), $R_{19}$ and $R_{20}$, which may be the same or different, each represent a hydrogen atom, a halogen atom, a cyano group or an alkyl group which may have a substituent; and $R_{21}$ represents a hydrogen atom, a halogen atom, or an alkyl group that may have a substituent or -$A_1$-CN, wherein $A_1$ represents a single bond or a divalent connecting group.

In general formulae (VIII) to (XVII), $R_{25}$, $R_{26}$ and $R_{27}$, which may be the same or different, each represent a hydrogen atom, a fluorine atom, or an alkyl, a cycloalkyl or an aryl group that may have a substituent; $R_{28}$, $R_{29}$ and $R_{30}$, which may be the same or different, each represent an alkyl, a cycloalkyl or an aryl group that may have a substituent; $R_{25}$ and $R_{26}$, $R_{27}$ and $R_{28}$, or $R_{29}$ and $R_{30}$ may connect together to form a ring; $R_{31}$, $R_{35}$, $R_{37}$, $R_{40}$ and $R_{44}$, which may be the same or different, each represent an alkyl, a cycloalkyl, an acyl or an alkoxycarbonyl group that may have a substituent; $R_{32}$, $R_{33}$, $R_{34}$, $R_{41}$, $R_{42}$ and $R_{43}$, which may be the same or different, each represent a hydrogen atom, a halogen atom or an alkyl or an alkoxy group that may have a substituent; $R_{36}$ and $R_{39}$, which may be the same or different, each represent a hydrogen atom, a halogen atom, a cyano group or an alkyl group that may have a substituent; $R_{38}$ represents an alkyl, a cycloalkyl, an aralkyl or an aryl group that may have a substituent; $B_1$ and $B_2$ each represent a single bond or a divalent connecting group; $B_3$ represents a divalent connecting group; and n represents 0 or 1.

As the alkyl group mentioned above, one can mention, for example, those of straight chain or branched chain structure with 1 to 8 carbon atoms, and specifically methyl, ethyl, propyl, n-butyl, sec-butyl, hexyl, 2-ethylhexyl and octyl as preferable examples.

The cycloalkyl group may be monocyclic or polycyclic; one can preferably mention, as monocyclic examples, those of 3 to 8 carbon atoms, i.e., for example, cyclopropyl, cyclopentyl, cyclohexyl, cycloheptyl and cyclooctyl. The polycyclic examples preferably include those of 6 to 20 carbon atoms such as, for example, adamantyl, norbornyl, isobornyl, camphanyl, dicyclopentyl, a-pinel, tricyclodecanyl, tetracyclododecyl, androstanyl, etc. The cycloalkyl group includes those in which part of the carbon atoms constituting the ring is substituted with a hetero atom such as oxygen, sulfur, nitrogen, etc.

The aryl groups are, for example, those with 6 to 15 carbon atoms, specifically including phenyl, tolyl, dimethylphenyl, 2,4,6-trimetylphenyl, naphthyl, anthryl, 9,10-dimethoxyanthryl, etc. as preferable examples.

The aralkyl groups are, for example, those with 7 to 12 carbon atoms, specifically including benzyl, phenethyl, naphthylmethyl, etc. as preferable examples.

The alkenyl groups are, for example, those with 2 to 8 carbon atoms, specifically including vinyl, allyl, butenyl and cyclohexenyl as preferable examples.

The alkoxyl groups are, for example, those with 1 to 8 carbon atoms, specifically including methoxy, ethoxy, n-propoxy, iso-propoxy, butoxy, pentoxy, allyloxy, octoxy, etc. as preferable examples.

The acyl groups are, for example, those with 1 to 10 carbon atoms, specifically including formyl, acetyl, propanoyl, butanoyl, pivaloyl, octanoyl, benzoyl etc. as preferable examples.

The acyloxy groups are preferably, for example, those with 2 to 12 carbon atoms, specifically including acetoxy, propionyloxy, benzoyloxy, etc.

The alkynyl groups are preferably, for example, those with 2 to 5 carbon atoms, specifically including ethynyl, propynyl, butynyl, etc.

The alkoxycarbonyl groups include tertiary ones such as t-butoxycarbonyl, t-amyloxycarbonyl, 1-methyl-1-cyclohexyloxycarbonyl, etc.

As the halogen atom, one can mention fluorine atom, chlorine atom, bromine atom, iodine atom, etc.

The divalent connecting group includes a divalent alkylene, cycloalkylene, alkenylene, or arylene group that may have a substituent, —O—CO—$R_{22a}$—, —CO—O—$R_{22b}$— or —CO—N($R_{22c}$)—$R_{22d}$—. $R_{22a}$, $R_{22b}$ and $R_{22d}$ which may the same or different, each represent a single bond, a divalent alkylene, cycloalkylene, alkenylene, or arylene group that may contain an ether group, an ester group, an amido group, a urethane group or a ureido group. $R_{22c}$ represents a hydrogen atom, or an alkyl, a cycloalkyl, an aralkyl or an aryl group that may have a substituent.

As the alkylene group, one can mention those with a straight chain or branched chain structure, including, for example, those with 1 to 8 carbon atoms such as methylene, ethylene, propylene, butylene, hexylene, octylene, etc.

As the cycloalkylene group, those with 5 to 8 carbon atoms such as cyclopentylene, cyclohexylene, etc. are mentioned.

As the alkenylene group, those with 2 to 6 carbon atoms are mentioned such as ethenylene, propenylene, butenylene, etc. all of which may preferably have a substituent.

As the arylene group, those with 6 to 15 carbon atoms are mentioned such as phenylene, tolylene, naphthylene, etc. all of which may preferably have a substituent.

The alkyl, cycloalkyl, aralkyl and aryl groups as $R_{22c}$ are the same as those which have been explained previously.

As the ring resulting from the connection of two of $R_{18d}$ to $R_{18f}$, two of $R_{18d}$, $R_{18e}$ and $R_{18g}$, two of $R_{11}$ to $R_{13}$, two of $R_{14}$ to $R_{16}$, $R_{25}$ and $R_{26}$, $R_{27}$ and $R_{28}$, or $R_{29}$ and $R_{30}$, 3- to 8-membered ones are mentioned as examples. Specific rings include cyclopropane, cyclopentane, cyclohexane, tetramethylene oxide, pentamethylene oxide, hexamethylene oxide, furan, pyran, dioxonol, 1,3-dioxolane, etc.

Z represents an atomic group constituting a monocyclic or polycyclic alicyclic group together with the carbon atom in general formula (VI-B). As the monocyclic alicyclic group, those with 3 to 8 carbon atoms are preferred including, for example, cyclopropyl, cyclopentyl, cyclohexyl, cycloheptyl, cyclooctyl, etc. As the polycyclic alicyclic group, those with 6 to 20 carbon atoms are preferred, including, for example, admantyl, norbornyl, isobornyl, camphanyl, dicyclopentyl, α-pynel, tricyclodecanyl, tetracyclododecyl, androstanyl, etc.

The alkyl group, cycloalkyl group, alkoxy group, acyl group, a cyloxy group, alkynyl group, alkenyl group, aryl group, aralkyl group, alkoxycarbonyl group, alkylene group, cycloalkylene group, alkenylene group, arylene group, etc. described heretofore each may have a substituent.

Substituents that these groups may have include those having an active hydrogen such as an amino group, an amido group, a ureido group, a urethane group, a hydroxyl group, a carboxyl group, etc., a halogen (F, Cl, Br and I) atom, an alkoxy (methoxy, ethoxy, propoxy, butoxy, etc.) group, a thioether group, an acyl (acetyl, propanoyl, benzoyl, etc.) group, an acyloxy (acetoxy, propanoyloxy, benzoyloxy, etc.) group, an alkoxycarbonyl (methoxycarbonyl, ethoxycarbonyl, propoxycarbonyl, etc.) group, an alkyl (methyl, ethyl, propyl and butyl) group, a cycloalkyl (cyclohexyl) group, an aryl (phenyl) group, a cyano group, a nitro group, etc.

In the invention, at least one of $R_5$ in general formula (I), $R_1$ in general formula (II), and $R_{17}$ in general formula (VI) is preferably a trifluoromethyl group.

The group that is contained in resin (A) of the invention and decomposed by the action of acid to exhibit solubility in alkalis includes, for example, —O—C($R_{18d}$)($R_{18e}$)($R_{18f}$), —O—C($R_{18d}$)($R_{18e}$)(O$R_{18g}$), —O—COO—C($R_{18d}$)($R_{18e}$)($R_{18f}$), —O—C($R_{01}$)($R_{02}$)COO—C($R_{18d}$)($R_{18e}$)($R_{18f}$), —COO—C($R_{18d}$)($R_{18e}$)($R_{18f}$), —COO—C($R_{18d}$)($R_{18e}$)(O$R_{18g}$), etc. $R_{18d}$ to $R_{18g}$ have the same meaning as above except hydrogen atom. $R_{01}$ and $R_{02}$ each represent a hydrogen atom, an alkyl group, a cycloalkyl group, an alkenyl group, an aralkyl group or an aryl group all of which may have a substituent enumerated above.

Preferable examples include the ether or ester group of a tertiary alkyl group such as t-butyl, t-amyl, 1-alkyl-1-cyclohexyl, 2-alkyl-2-adamantyl, 2-adamantyl-2-propyl, 2-(4-methylcyclohexyl)-2-propyl, etc., the acetal or acetal ester of 1-alkoxy-1-ethoxy group, tetrahydropyranyl group, etc., a t-alkylcarbonate group, a t-alkylcarbonylmethoxy group, etc. More preferable examples are the acetals of a 1-alkoxy-1-ethoxy group, tetrahydropyranyl, etc.

In the case of an acetal group, the resin is actively decomposed by acid. Accordingly, due to the expansion of the range of selection of the acid-generating compound to be jointly used, the resin is advantageous as regard to sensitivity enhancement, the property shift occurring in the period between exposure and post-baking, etc. Particularly preferable acetal groups are those containing the alkoxy group derived from the aforementioned perfluoroalkyl group as the 1-alkoxy component of the acetal. With such a compound, the transmittance of short wavelength rays (for example, the 157 nm light from an $F_2$ excimer laser) can be further raised.

The repeating unit(s) represented by general formula (II) is (are) used in the content range of preferably 5 to 60 mol %, more preferably 10 to 50 mol %, and still more preferably 15 to 35 mol % in resin (A1).

The repeating unit(s) represented by general formula (I) is (are) used in the content range of preferably 10 to 90 mol %, more preferably 20 to 80 mol %, and still more preferably 30 to 70 mol % in resin (A1).

The repeating unit(s) represented by general formula (VI) is (are) used in the content range of preferably 3 to 50 mol %, more preferably 5 to 40 mol %, and still more preferably 10 to 30 mol % in resin (A1).

The repeating unit(s) represented by general formula (III) is (are) used in the content range of preferably 0 to 30 mol %, more preferably 3 to 20 mol %, and still more preferably 5 to 15 mol % in resin (A1).

The repeating unit(s) represented by general formula (VII) is (are) used in the content range of preferably 0 to 50 mol %, more preferably 10 to 40 mol %, and still more preferably 25 to 35 mol % in resin (A1).

The repeating unit(s) represented by general formulae (VIII) to (X) is (are) used in the content range of preferably 0 to 50 mol %, more preferably 10 to 40 mol %, and still more preferably 25 to 35 mol % in resin (A1).

The repeating unit(s) represented by general formulae (XI) to (XIII) is (are) used in the range of preferably 0 to 40 mol %, more preferably 2 to 30 mol %, and still more preferably 3 to 20 mol % in resin (A1).

The repeating unit(s) represented by general formula (XIV) is (are) used in the content range of preferably 0 to 40 mol %, preferably 5 to 30 mol %, and still more preferably 10 to 20 mol % in resin (A1).

The repeating unit(s) represented by general formula (XV) is (are) used in the content range of preferably 0 to 40 mol %, more preferably 2 to 30 mol %, and still more preferably 3 to 20 mol % in resin (A1).

The repeating unit(s) represented by general formula (XVI) is (are) used in the content range of preferably 0 to 30 mol %, more preferably 2 to 20 mol %, and still more preferably 3 to 10 mol % in resin (A1).

The repeating unit(s) represented by general formula (XVII) is (are) used in the content range of preferably 0 to 30 mol %, preferably 2 to 20 mol %, and still more preferably 3 to 10 mol % in resin (A1).

Resin (A1) of the invention can contain, in addition to the repeating units cited above, still another polymerizable monomer as a copolymerization component for the purpose of improving various properties of the positive-type resist of the invention.

The copolymerization monomer usable for such a purpose includes those to be shown below. For example, such monomers are compounds having one addition-polymerizable unsaturated bond chosen from the group consisting of, for example, acrylic acid esters, acrylamide and related compounds, methacrylic acid esters, methacrylamide and related compounds, allyl compounds, vinyl ethers, vinyl esters, styrene and related compounds, crotonic acid esters, etc., except those cited above.

Specific examples include the following. Acrylic acid esters such as, for example, alkyl (the number of the carbon atoms in the alkyl group being preferably 1 to 10) acrylates (for example, methyl acrylate, ethyl acrylate, propylacrylate, amyl acrylate, cyclohexyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate, etc.) and aryl acrylates (for example, phenyl acrylate, etc.); methacrylic acid esters such as, for example, alkyl (the number of the carbon atoms in the alkyl group being preferably 1 to 10) methacrylates (for example, methyl methacrylate, ethyl methacrylate, propyl methacrylate, isopropyl methacrylate, amylmethacrylate, hexylmethacrylate, cyclohexylmethacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfurylmethacrylate, etc.), and aryl methacrylates (for example, phenyl methacrylate, cresyl methacrylate, naphthyl methacrylate, etc.); acrylamide and related compounds such as acrylamide and N-alkylacrylamides (the alkyl group preferably having 1 to 10 carbon atoms, specifically including, for example, methyl, ethyl, propyl, butyl, t-butyl, heptyl, octyl, cyclohexyl, benzyl, hydroxyethyl, etc.), N-arylacrylamide (the aryl group being, for example, phenyl, tolyl, nitrophenyl, naphthyl, cyanophenyl, hydroxyphenyl, carboxyphenyl, etc.), N,N-dialkylacrylamides (the alkyl group preferably having 1 to 10 carbon atoms, including, for example, methyl, ethyl, butyl, isobutyl, ethylhexyl, cyclohexyl, etc.), N,N-diarylacrylamides (the aryl group being, for example, phenyl, etc.), N-methyl-N-phenylacrylamide, N-hydroxyethyl-N-methylacrylamide, N-2-acetamidoethyl-N-acetylacrylamide, etc.; methacrylamide and related compounds such as methacrylamide, N-alkylmethacrylamides (the alkyl group preferably having 1 to 10 carbon atoms, specifically including, for example, methyl, ethyl, t-butyl, ethylhexyl, hydroxyethyl, cyclohexyl, etc.), N-arylmethacrylamides (the aryl group being, for example, phenyl, etc.), N,N-dialkylmethacrylamides (the alkyl group including, for example, ethyl, propyl, butyl, etc.), N,N-diarylmethacrylamides (the aryl group being, for example, phenyl, etc.), N-hydroxyethyl-N-methylmethacrylamide, N-methyl-N-phenylmethacrylamide, N-ethyl-N-phenylmethacrylamide, etc.; allyl compounds such as allyl esters (including, for example, allyl acetate, allyl capronate, allyl caprylate, allyl laurate, allyl palmitate, allyl stearate, allyl benzoate, allyl acetoacetate, allyl lactate, etc.), allyloxyethanol, etc.; vinyl ethers such as, for example, alkyl vinyl ethers (including, for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers (for example, vinyl phenyl ether, vinyl tolyl ether, vinyl chlorophenyl ether, vinyl 2,4-dichlorophenyl ether, vinyl naphthyl ether, vinyl anthranyl ether, etc.); vinyl esters such as, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl P-phenyl butyrate, vinyl cyclohexylcarboxylate, vinyl benzoate, vinyl salicylate, vinyl chlorobenzoate, vinyl tetrachlorobenzoate, vinyl naphthoate, etc.; styrene and related compounds such as, for example, styrene, alkylstyrenes (including, for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc.), alkoxystyrenes (including, for example, methoxystyrene, 4-methoxy-3-methylstyrene, dimethoxystyrene, etc.), halogenated styrenes (including, for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), carboxystyrenes and vinylnaphthalene; crotonic acid esters such as, for example, alkyl crotonates (including, for example, butyl crotonate, hexyl crotonate, glycerin monocrotonate, etc.); dialkyl itaconates (including, for example, dimethyl itaconate, diethyl itaconate, dibutyl itaconate, etc.); the dialkyl esters of maleic acid or fumaric acid (including, for example, dimethyl maleate, dibutyl maleate, etc.), etc. In addition to these, any addition-polymerizable unsaturated compound that is copolymerizable may be used as a general rule.

Specific examples of repeating units represented by general formula (I) and those represented by general formula (II) are the same as the respective specific examples cited hereinabove.

Specific examples of repeating unit represented by general formula (VI) are shown below, but the scope of the invention is not limited by them.

(VI-1)

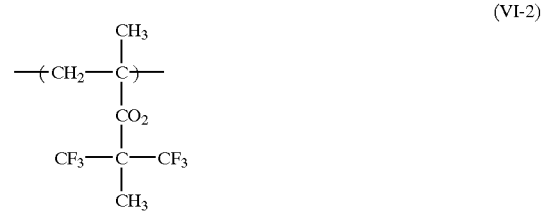

(VI-2)

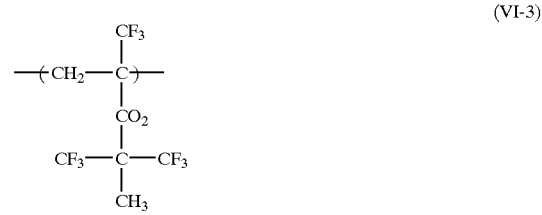

(VI-3)

(VI-4)

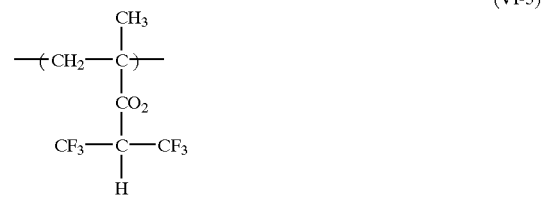

(VI-5)

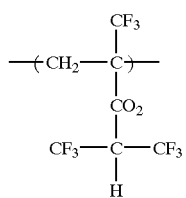 (VI-6)
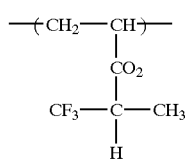 (VI-7)
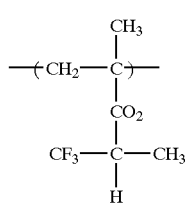 (VI-8)
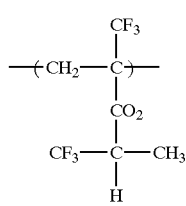 (VI-9)
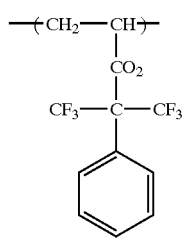 (VI-10)
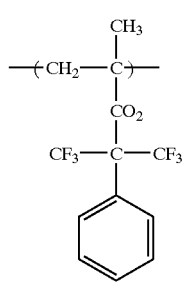 (VI-11)
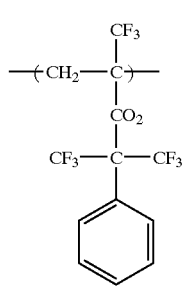 (VI-12)
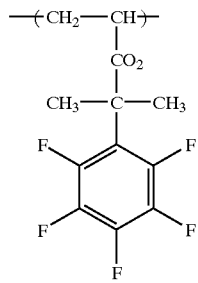 (VI-13)
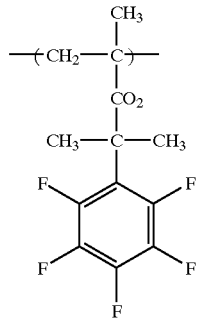 (VI-14)
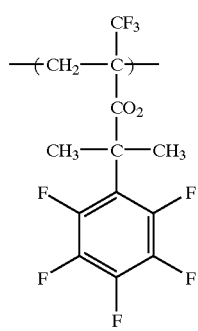 (VI-15)
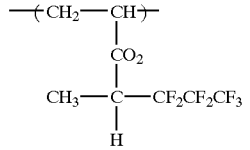 (VI-16)
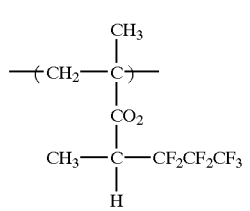 (VI-17)
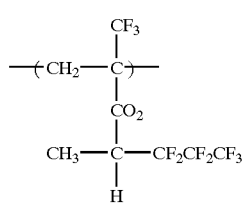 (VI-18)

-continued (VI-19) 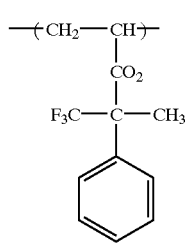

(VI-20) 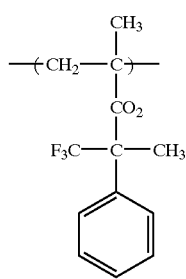

(VI-21) 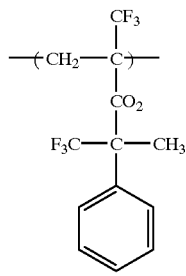

Specific examples of repeating unit represented by general formula (III) are shown below, but the scope of the invention is not limited by them.

(III-1) 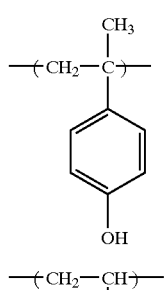

(III-2) 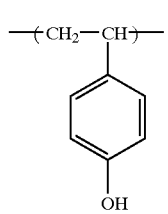

(III-3) 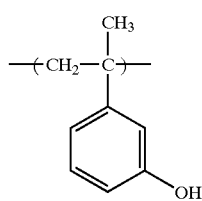

Specific examples of repeating unit represented by general formula (VII) are shown below, but the scope of the invention is not limited by them.

(VII-1) 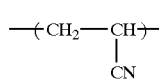

(VII-2) 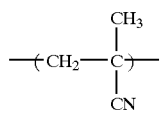

(VII-3) 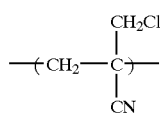

(VII-4) 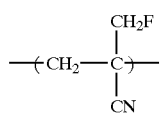

(VII-5) 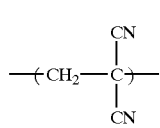

(VII-6) 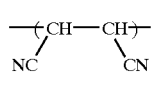

(VII-7) 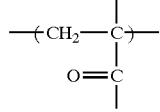

(VII-8) 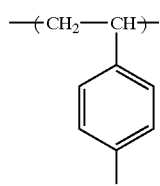

(VII-9) 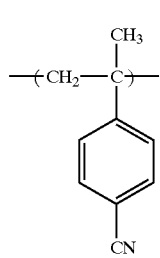

Specific examples of repeating units represented by general formulae (VIII) to (XVII) are shown below, but the scope of the invention is not limited by them.

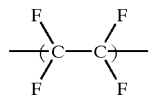 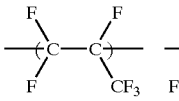 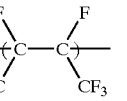

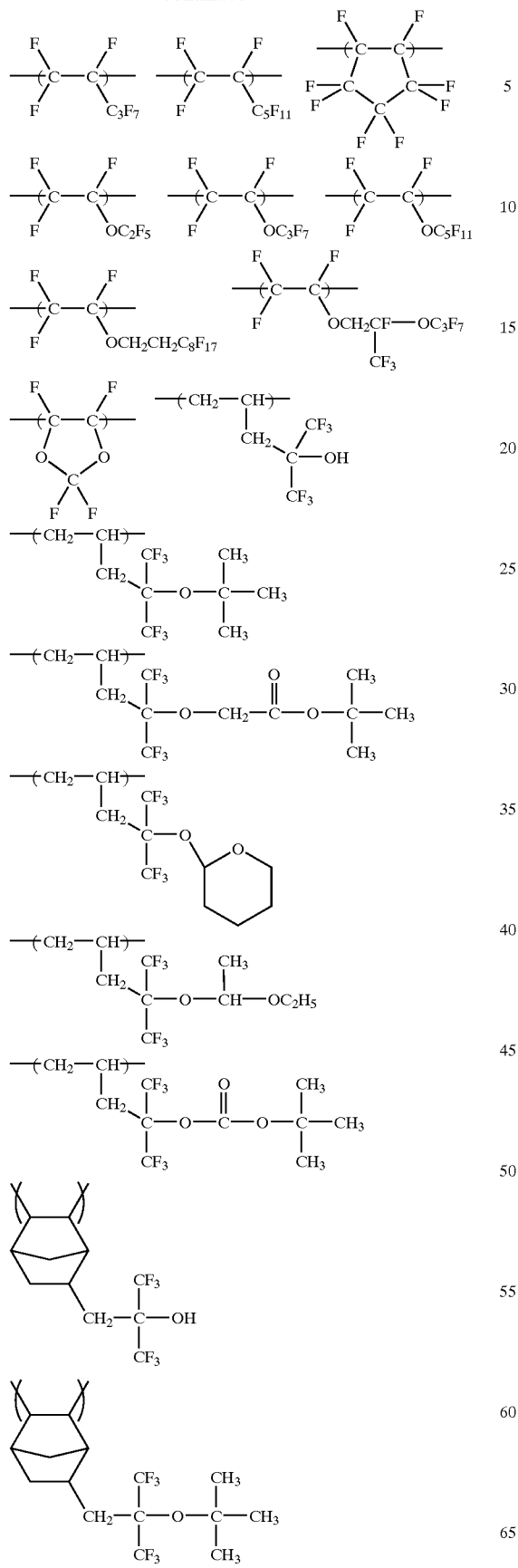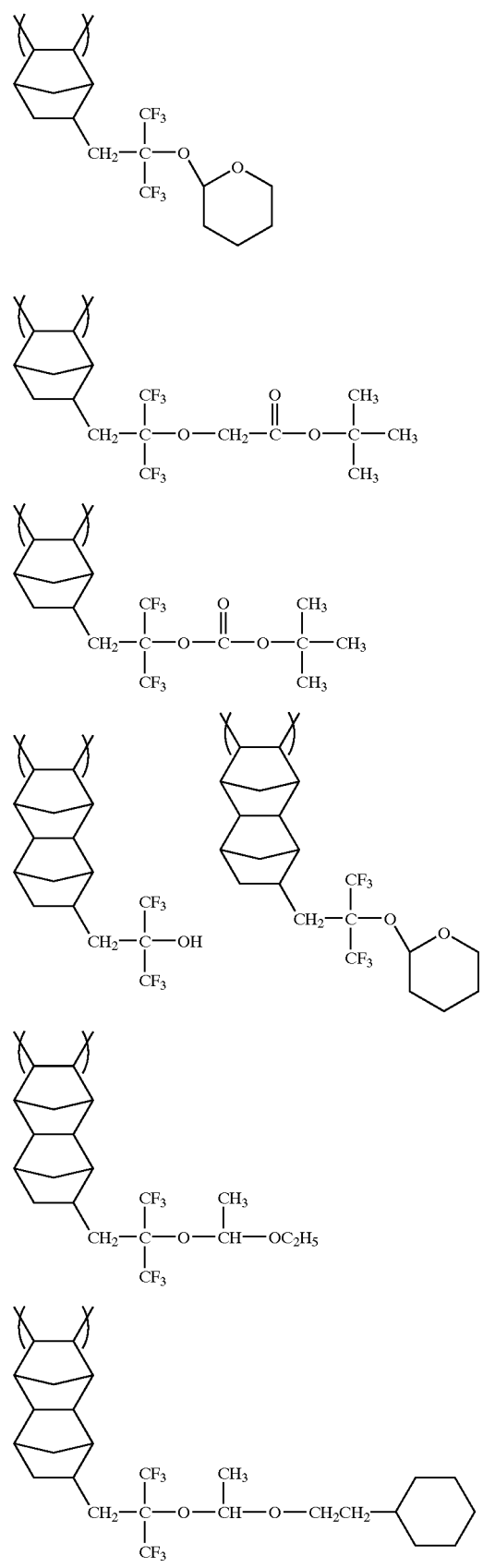

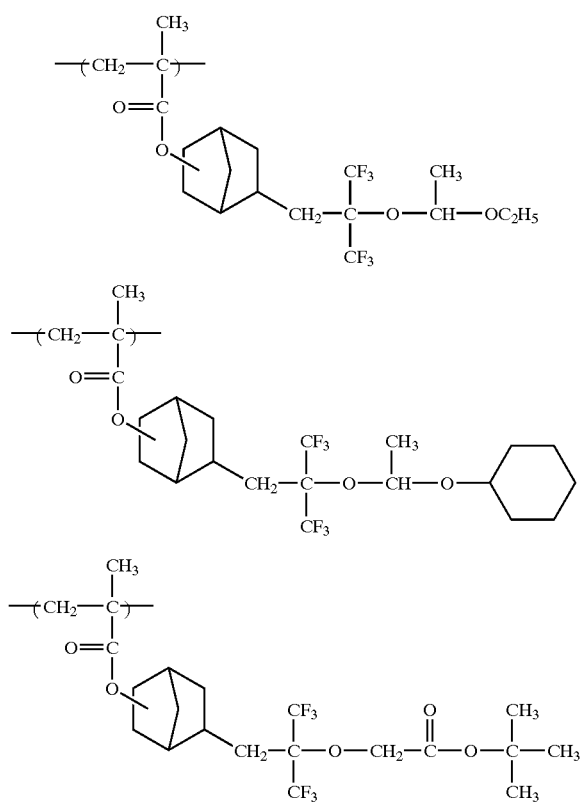
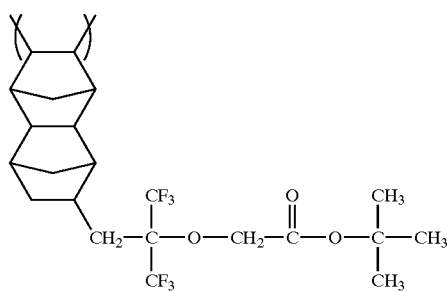
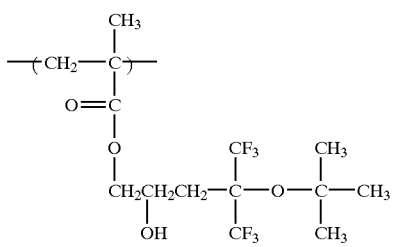
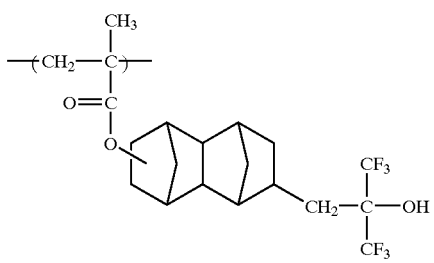
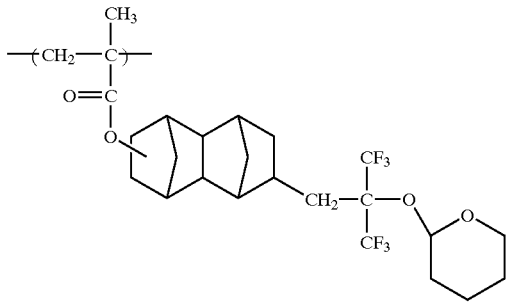
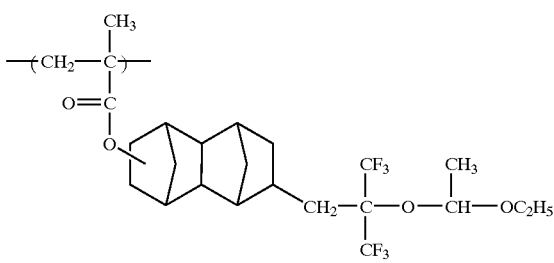
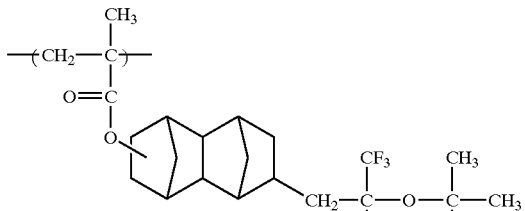
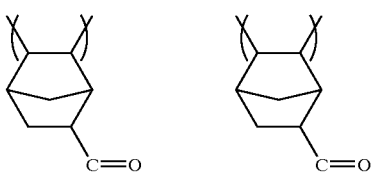

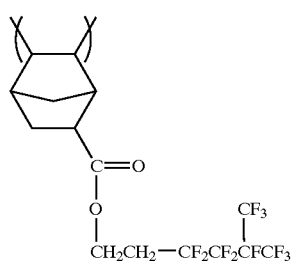
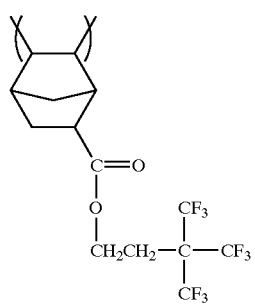
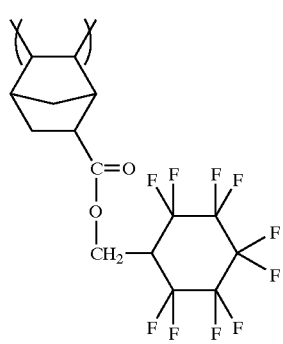
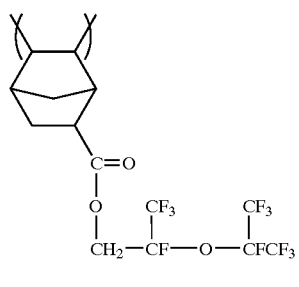
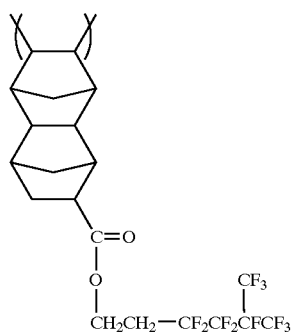
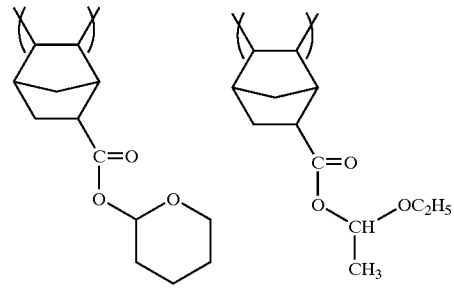
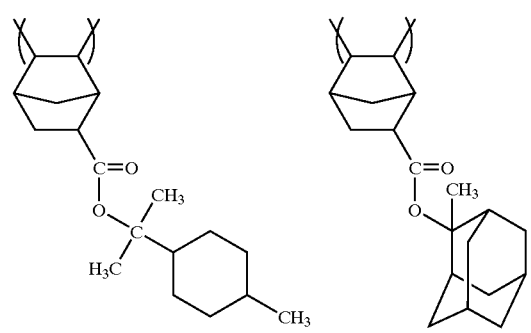
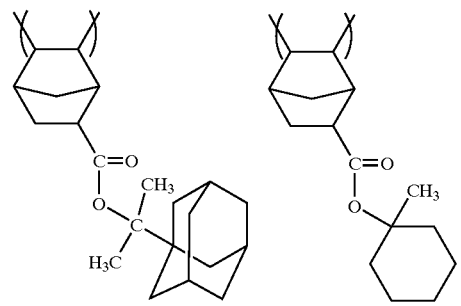
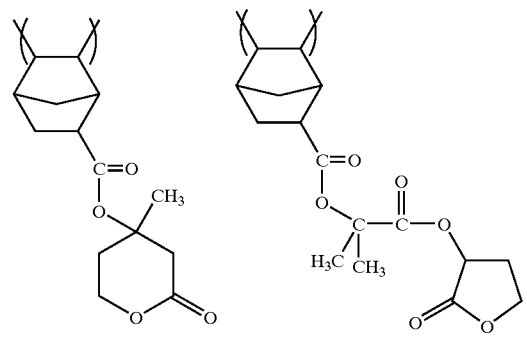
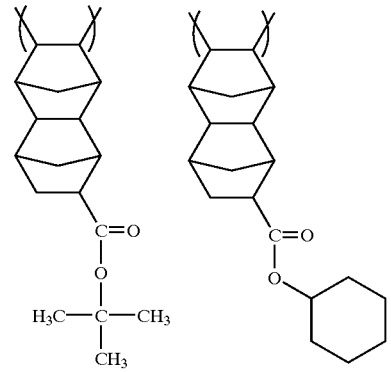

-continued

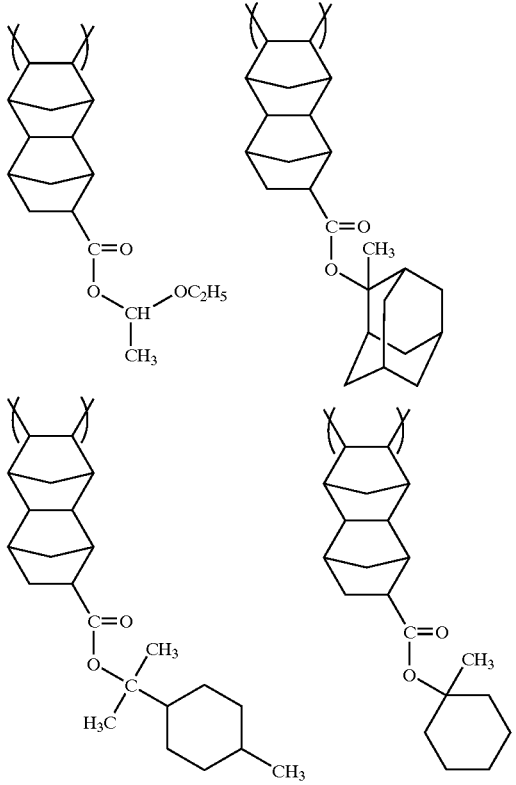

As specific examples of the repeating unit represented by general formula (XV), those resulting from the vinyl ethers enumerated above can be mentioned.

Specifically enumerated are, for example, alkyl vinyl ethers (including, for example, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethyleneglycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers (including, for example, vinyl phenyl ether, vinyl tolyl ether, vinyl chlorophenyl ether, vinyl 2,4-dichlorophenyl ether, vinyl naphthyl ether, vinyl anthranyl ether, etc.), etc.

As specific examples of the repeating unit represented by general formula (XVI), one can mention, for example, acrylic acid esters such as, for example, alkyl (the number of the carbon atoms in the alkyl group being preferably 1 to 10) acrylates (for example, methyl acrylate, ethyl acrylate, propyl acrylate, amyl acrylate, cyclohexyl acrylate, ethylhexyl acrylate, octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate, etc.) and aryl acrylates (for example, phenyl acrylate, etc.); methacrylic acid esters such as, for example, alkyl (the number of the carbon atoms in the alkyl group being preferably 1 to 10) methacrylates (for example, methyl methacrylate, ethyl methacrylate, propyl methacrylate, isopropyl methacrylate, amylmethacrylate, hexylmethacrylate, cyclohexylmethacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, etc.), aryl methacrylates (for example, phenyl methacrylate, cresyl methacrylate, naphthyl methacrylate, etc.), etc.

Each repeating unit shown as the specific examples mentioned above may be used individually or in combination of two or more thereof.

A preferable range of the molecular weight of the resin (A1) of the invention comprising the repeating units mentioned above is from 1,000 to 200,000, and more preferably from 3,000 to 20,000 in terms of weight average value for practical use. The molecular weight distribution lies in the range of 1 to 10, preferably 1 to 3, and more preferably 1 to 2 for practical use. Resins having a narrower molecular weight distribution excel in resolution and resist configuration with smoother sidewalls of the resist pattern, and excel in the roughness characteristics. Based on the total solid content of the composition, resin (A1) of the invention is used in an addition level of preferably 50 to 99.5% by weight, more preferably 60 to 98% by weight, and still more preferably 65 to 95% by weight.

[2] Compounds Which Generate an Acid Upon Irradiation With One of an Actinic Ray and a Radiation (Compound (B) of the Invention)

The compound which generates an acid upon irradiation with one of an actinic ray and a radiation can be suitably selected from photo-initiators for cationic photopolymerization, photo-initiators for radical photopolymerization, photodecolouring agents for dyes, photodiscolouring agents and compounds which generate an acid upon irradiation with the known kinds of light now in practical use for in micro-resist fabrication, etc., (including UV light of 400 to 200 nm wavelength, deep UV light, particularly preferably the g-line, h-line and i-line and KrF excimer laser light), the ArF excimer laser light, the $F_2$ excimer laser light, electron beam, X-ray, molecular beam or ion beam. Further, mixtures of these compounds may also be appropriately used.

Still other compounds that generate an acid upon irradiation with one of an actinic ray and a radiation include the onium salts such as the diazonium salts described in, for example, S. I. Schlesinger, Photogr. Sci. Eng., 18, 387 (1974), T. S. Bal et al, Polymer, 21, 423 (1980), etc., the ammonium salts described in U.S. Pat. Nos. 4,069,055, 4,069,056, and Re 27,992, Japanese Patent Laid-Open No. 140140/1991, etc., the phosphonium salts described in D. C. Necker et al., Macromolecules, 17, 2468 (1984), C. S. Wen et al., Teh, Proc. Conf. Rad. Curing ASIA, p. 478, Tokyo, October (1988), U.S. Pat. Nos. 4,069,055 and 4,069,056, etc., the iodonium salts described in J. V. Crivello et al., Macromolecules, 10 (6) 1307 (1977), Chem. & Eng. News, Nov. 28, p. 31 (1988), European Patent Nos. 104,143, 339,049 and 410,201, Japanese Patent Laid-Open Nos. 150848/1990 and 296514/1990, etc., the sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patent Nos. 370,693, 161,811, 410, 201, 339,049, 233,567, 297,443, and 297,442, U.S. Pat. Nos. 4,933,377, 3,902,114, 4,760,013, 4,734,444, and 2,833,827, German Patent Nos. 2,904,626, 3,604,580 and 3,604,581, etc., the selenonium salts described in J. V. Crivello et al., Macromolecules, 10 (6), 1307 (1977), J. V. Crivello et al., Polymer Sci., Polymer Chem. Ed., 17, 1047 (1979), etc., the arsonium salts described in C. S. Wen et al., Teh, Proc. Conf. Rad. Curing ASIA, p. 478, Tokyo, October (1988), etc., etc.; the organic halogen compounds described in U.S. Pat. No. 3,905,815, Japanese Patent Publication No. 4605/1971, Japanese Patent Laid-Open Nos. 36281/1973, 32070/1980, 239736/1985, 169835/1986, 169837/1986, 58241/1987, 212401/1987, 70243/1988, and 298339/1988, etc.; the organometallic/organic halogen compounds described in K. Meier et al., J. Rad. Curing 13 (4), 26 (1986), T. P. Gill et al., Inorg. Chem., 19, 3007 (1980), D. A. struc, Acc. Chem. Res., 19 (12), 377 (1896), Japanese Patent Laid-Open No. 161445/1990, etc.; the photo-acid generators having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patent Nos. 0290,750, 046,083, 156,535, 271,851, and 0,388,343, U.S. Pat. Nos. 3,901,710 and 4,181,531, Japanese Patent Laid-Open Nos. 198538/1985, 133022/1988, etc.; compounds which are photochemically decomposed to generate sulfonic acid represented by the iminosulfonate described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patent Nos. 0199,672, 84515, 044,115, 618,564 and 0101,122, U.S. Pat. Nos. 4,371,605, and 4,431,774, Japanese Patent Laid-Open Nos. 18143/1989, 245756/1990, and 140109/1991, etc.; and the disulfone compounds described in Japanese Patent Laid-Open Nos. 166544/1986, etc.

Furthermore, compounds in which these groups or compounds capable of generating an acid upon irradiation with these actinic rays or radiations are introduced in the main chain or a side chain of a polymer, exemplified by those described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al, Makromol. Chem., 152, 153, 163 (1972), J. V. Crivello et al., J. Polymer Sci., Polymer Chem. Ed., 17, 3845 (1979), U.S. Pat. No. 3,849,137, German Patent No. 3,914,407, Japanese Patent Laid-Open Nos. 26653/1988, 164824/1980, 69263/1987, 146038/1988, 163452/1988, 153853/1987 and 146029/1988, etc. can be used.

Moreover, compounds which generate an acid by the action of light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European Patent No. 126,712, etc. can also be used.

Of the compounds which generate an acid upon irradiation with one of an actinic light and a radiation, those which are particularly used effectively will be described below.

(1) Oxazole derivatives represented by the following general formula (PAG1) or S-triazine derivatives represented by general formula (PAG2), each being substituted with a trihalomethyl group.

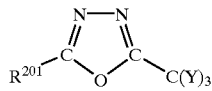

(PAG1)

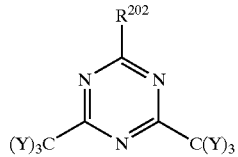

(PAG2)

In the formulae, $R^{201}$ is a substituted or unsubstituted aryl or alkenyl group, $R^{202}$ is a substituted or unsubstituted aryl, alkenyl or alkyl group, or —$CY_3$, where Y is a chlorine or bromine atom.

Some specific compounds are enumerated below, but the useful compounds are not restricted to them.

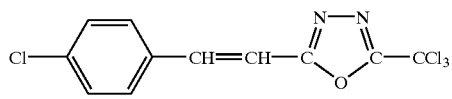

(PAG1-1)

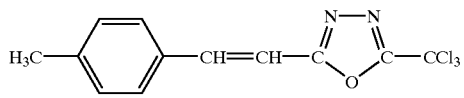

(PAG1-2)

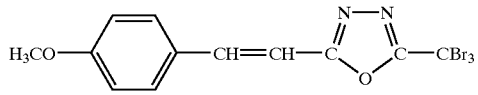

(PAG1-3)

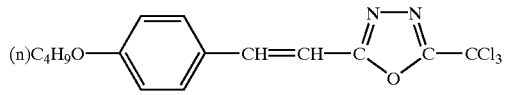

(PAG1-4)

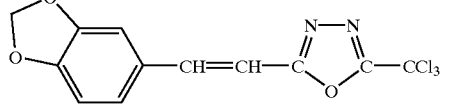

(PAG1-5)

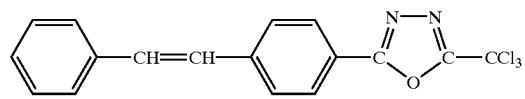

(PAG1-6)

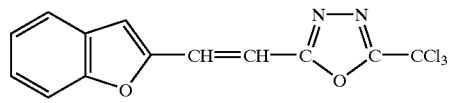

(PAG1-7)

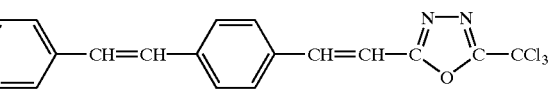

(PAG1-8)

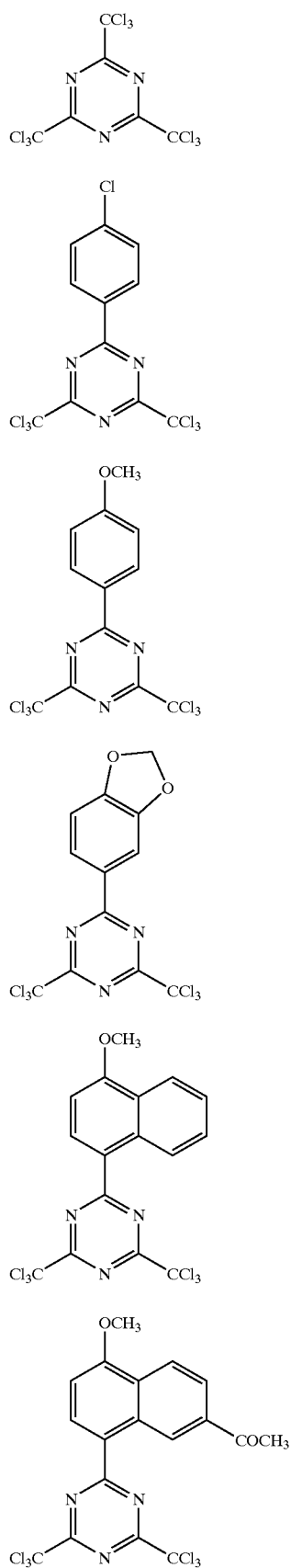
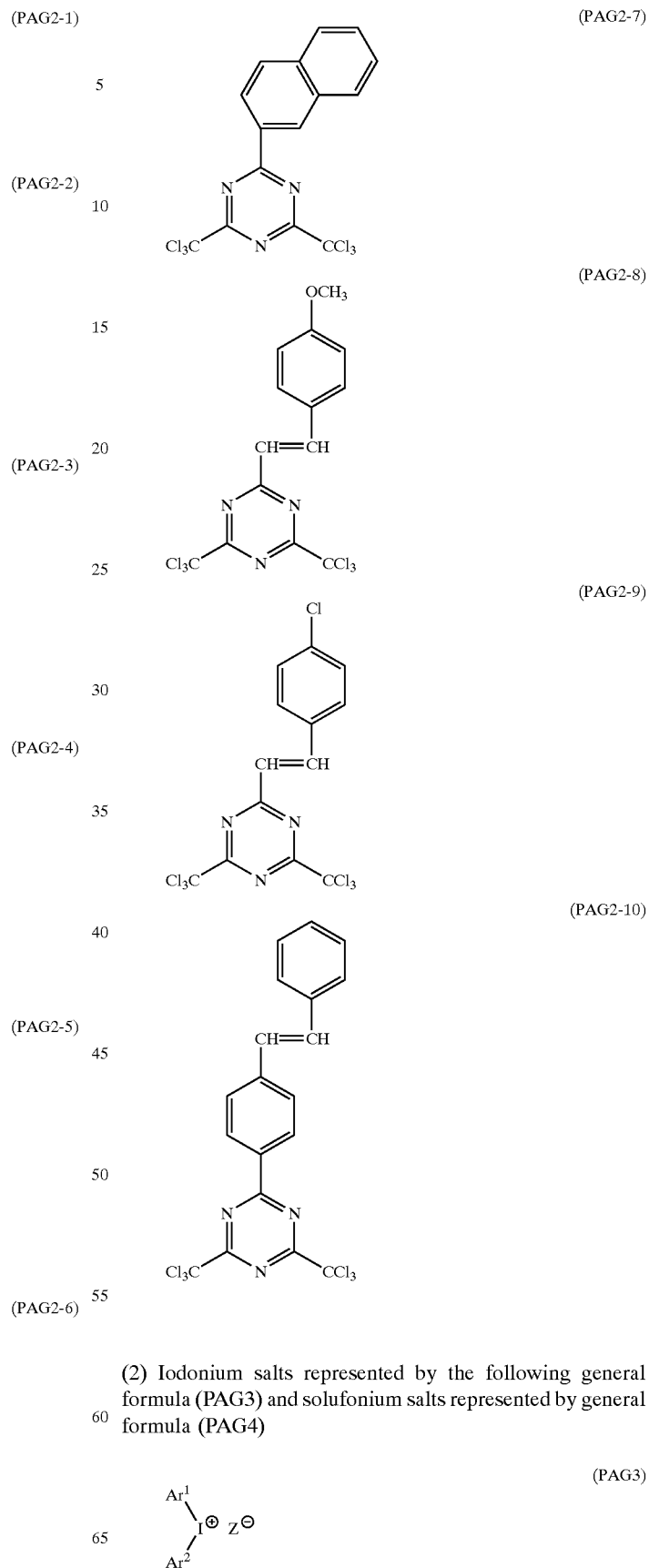
(2) Iodonium salts represented by the following general formula (PAG3) and solufonium salts represented by general formula (PAG4)

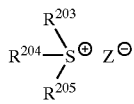
(PAG4)

In the formulae, $Ar^1$ and $Ar^2$ each independently represent a substituted or unsubstituted aryl group. As preferable substituents, one can mention an alkyl group, a haloalkyl group, a cycloalkyl group, an aryl group, an alkoxy group, anitro group, a carboxyl group, an alkoxycarbonyl group, a hydroxy group, a mercapto group, and a halogen atom.

$R^{203}$, $R^{204}$, and $R^{205}$ each independently represent a substituted or unsubstituted alkyl or aryl group, and preferably an aryl group having 6 to 14 carbon atoms, an alkyl group having 1 to 8 carbon atoms or a substituted derivative of the two. Preferable substituents for the aryl group include an alkoxy group of 1 to 8 carbon atoms, an alkyl group of 1 to 8 carbon atoms, a cycloalkyl group, a nitro group, a carboxyl group, a mercapto group, a hydroxy group and a halogen atom. And preferred substituents for the alkyl group include an alkoxy, carboxyl or alkoxycarbonyl group of 1 to 8 carbon atoms.

$Z^-$ represents an anion, specifically including the anions of an alkylsulfonic acid, cycloalkylsulfonic acid, perfluoroalkylsulfonic acid each of which may have a substituent, an arylsulfonic acid (exemplified by benzenesulfonic acid, naphthalenesulfonic acid and anthracenesulfonic acid each of which may have a substituent).

Two of $R^{203}$, $R^{204}$ and $R^{205}$ may connect together via a single bond thereof or a substituent. And, $Ar^1$ and $Ar^2$ may connect together via a single bond thereof or a substituent.

Typical examples include the following compounds, to which preferable compounds are not restricted.

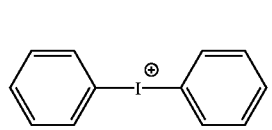
(PAG3-1)

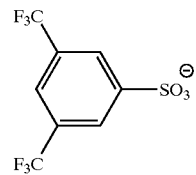

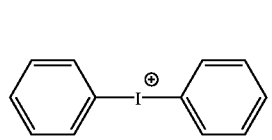
(PAG3-2)

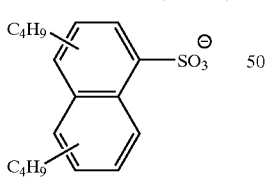

(PAG3-3)

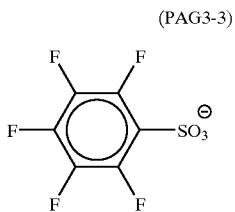

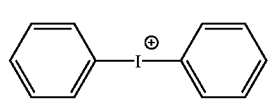
(PAG3-4)

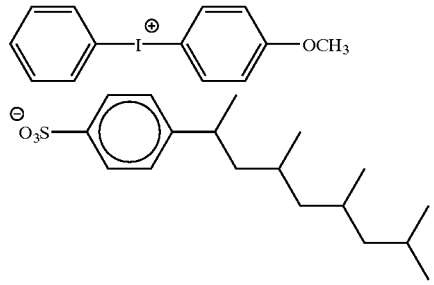
(PAG3-5)

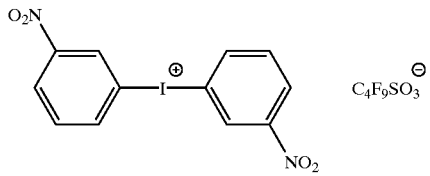
(PAG3-6)

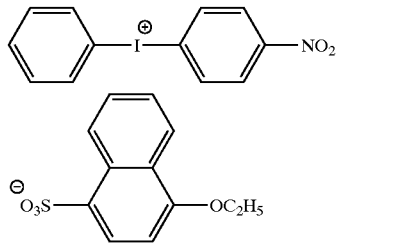
(PAG3-7)

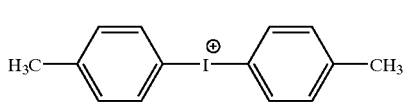

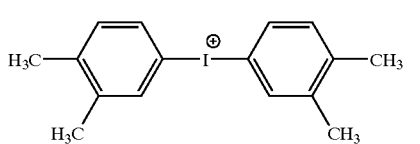
(PAG3-8)

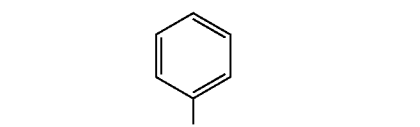
(PAG3-9)

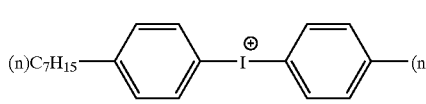

(PAG3-10)

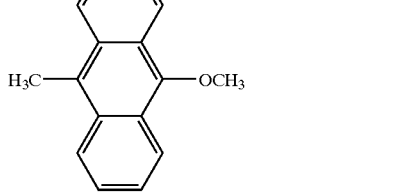

(PAG3-11)
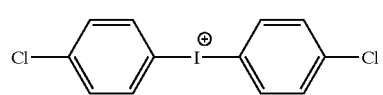
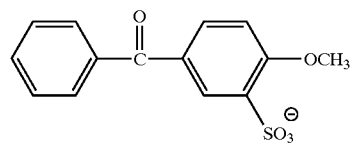
(PAG3-12)
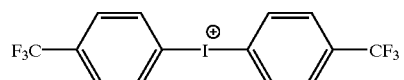
(PAG3-13)
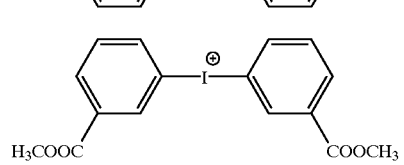
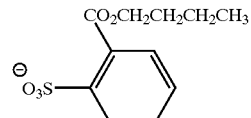
(PAG3-14)
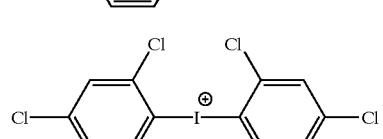
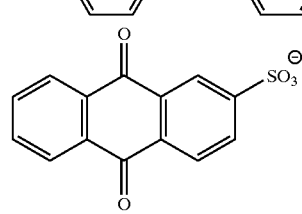
(PAG3-15)
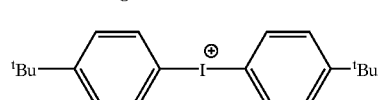
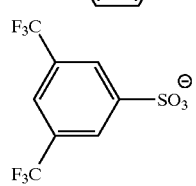
(PAG3-16)
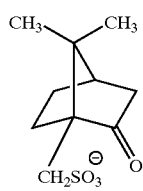
(PAG3-17)
(PAG3-18)
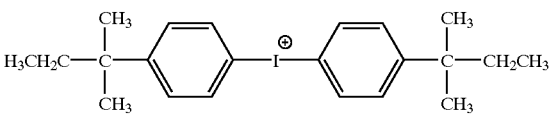
(PAG3-19)
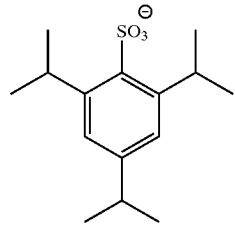
(PAG3-20)
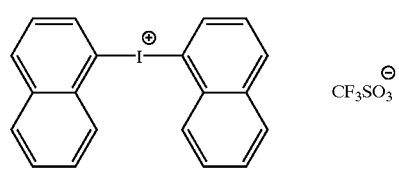
(PAG3-21)
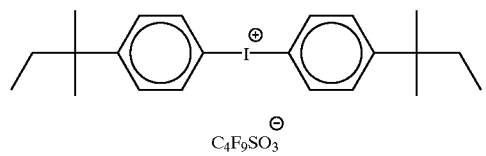
(PAG3-22)
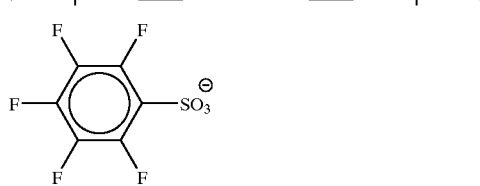
(PAG4-1)
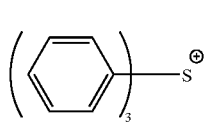
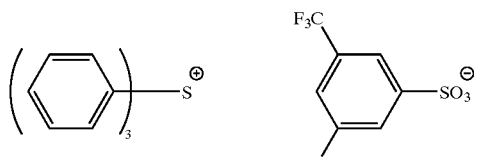
(PAG4-2)
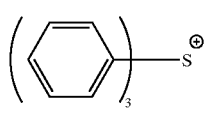
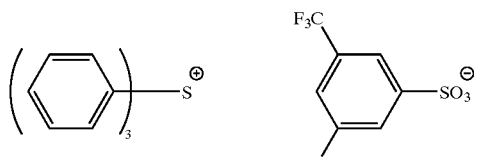

-continued (PAG4-3) (PAG4-4) (PAG4-5) (PAG4-6) (PAG4-7) (PAG4-8) (PAG4-9) (PAG4-10) (PAG4-11) (PAG4-12) (PAG4-13) (PAG4-14) (PAG4-15) (PAG4-16) (PAG4-17) (PAG4-18) (PAG4-19) (PAG4-20)

-continued
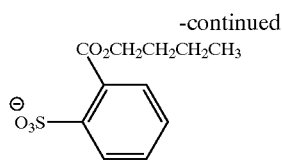
(PAG4-21)
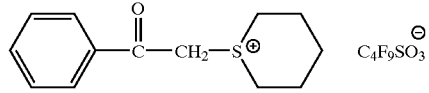
(PAG4-22)
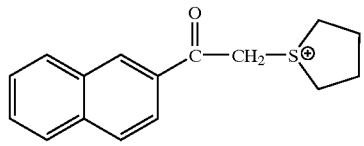
(PAG4-23)
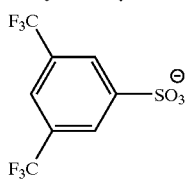
(PAG4-24)
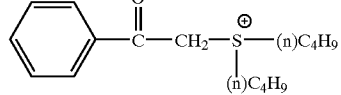
(PAG4-25)
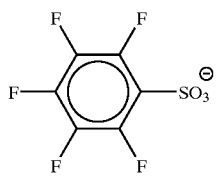
(PAG4-26)
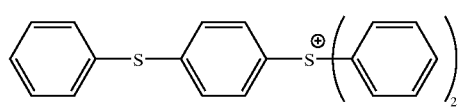
(PAG4-27)
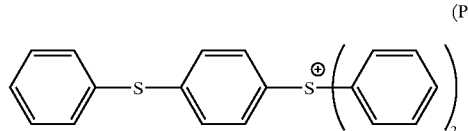
-continued
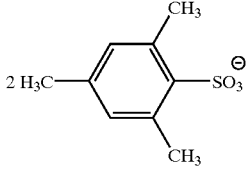
(PAG4-28)
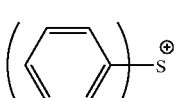 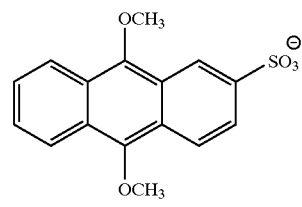
(PAG4-29)
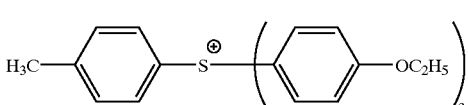
(PAG4-30)
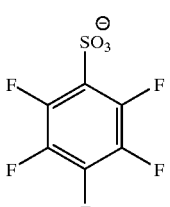
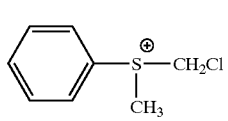 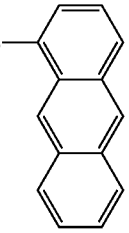
(PAG4-31)
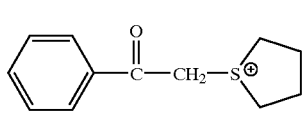 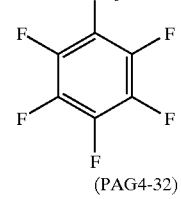
(PAG4-32)
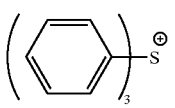 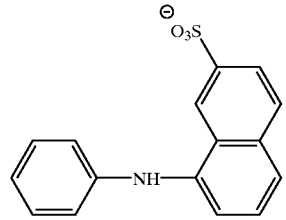
The above-mentioned onium salts represented by general formulae (PAG3) and (PAG4) are known in the art and can be synthesized, for example, by the methods described in J. W. Knapczyk et al., J. Am. Chem. Soc., 91, 145 (1969), A. L. Maycok et al., J. Org. Chem., 35, 2532, (1970), E. Goethas et al., Bull. Soc. Chem. Belg., 73, 546, (1964), H. M. Leicester, J. Am. Chem. Soc., 51, 3587 (1929), J. V.

Crivello et al., J. Polym. Chem. Ed., 18, 2677 (1980), U.S. Pat. Nos. 2,807,648 and 4,247,473, Japanese Patent Laid-Open No.101331/1978, etc.

(3) Disulfonic acid derivatives represented by general formula (PAG5) and iminosulfonate derivatives represented by general formula (PAG6).

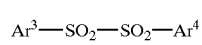
(PAG5)

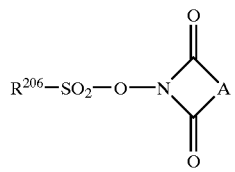
(PAG6)

In the formulae, $Ar^3$ and $Ar^4$ each independently represent a substituted or unsubstituted aryl group, $R^{206}$ represents a substituted or unsubstituted alkyl or aryl group, and A represents a substituted or unsubstituted alkylene, alkenylene or arylene group.

Typical examples include those cited below, to which, however, preferable compounds are not restricted.

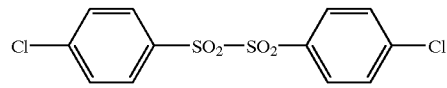
(PAG5-1)

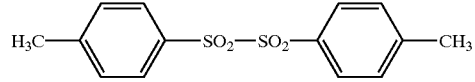
(PAG5-2)

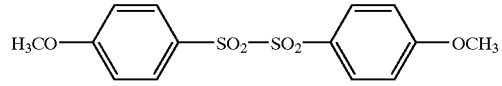
(PAG5-3)

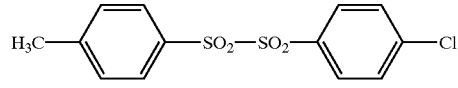
(PAG5-4)

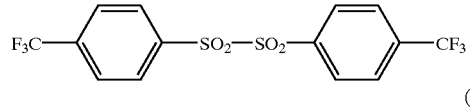
(PAG5-5)

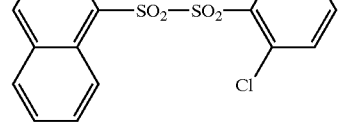
(PAG5-6)

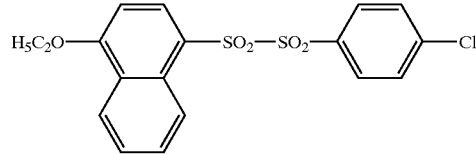
(PAG5-7)

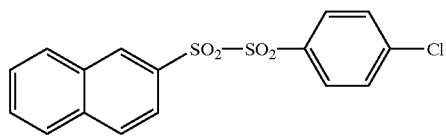
(PAG5-8)

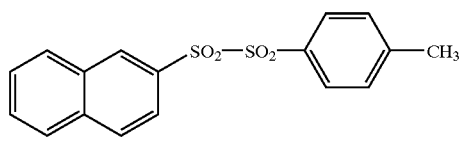
(PAG5-9)

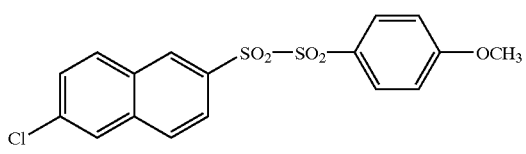
(PAG5-10)

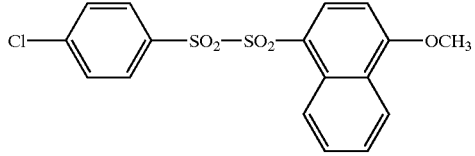
(PAG5-11)

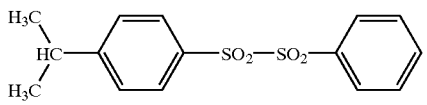
(PAG5-12)

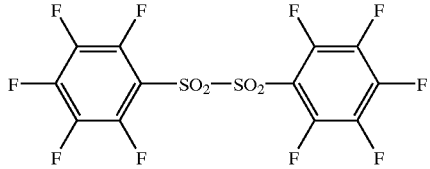
(PAG5-13)

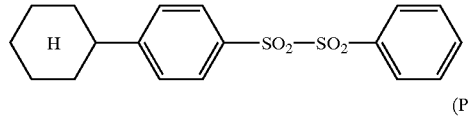
(PAG5-14)

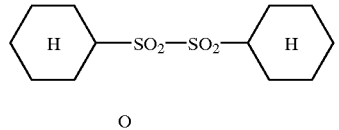
(PAG5-15)

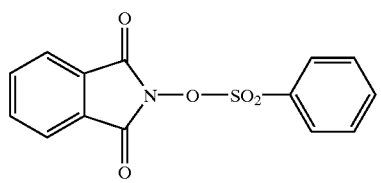
(PAG6-1)

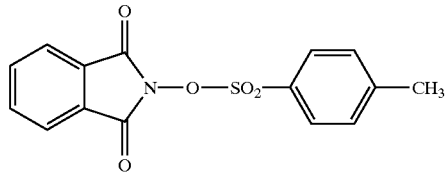
(PAG6-2)

-continued (PAG6-3)
(PAG6-4)
(PAG6-5)
(PAG6-6)
(PAG6-7)
(PAG6-8)
(PAG6-9)
(PAG6-10)
(PAG6-11)
(PAG6-12)
(PAG6-13)
(PAG6-14)
(PAG6-15)
(PAG6-16)
(PAG6-17)
(PAG6-18)

-continued (PAG6-19)
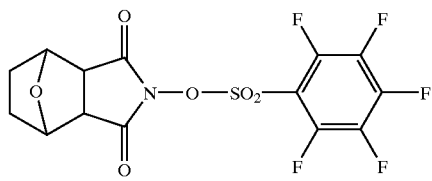

(PAG6-20)
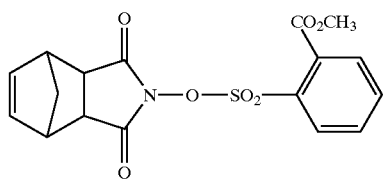

(4) Diazosulfone derivatives represented by the following general formula (PAG7)

(PAG7)
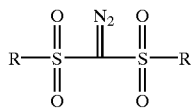

Here, R represents an alkyl group of straight chain, branches chain or cyclic structure, or an aryl group that may be substituted.

Specific examples are shown below, but the scope of the invention is not limited by them.

(PAG7-1)
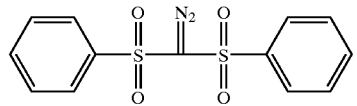

(PAG7-2)
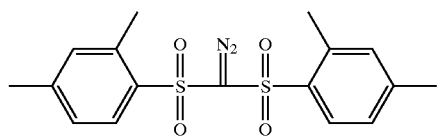

(PAG7-3)
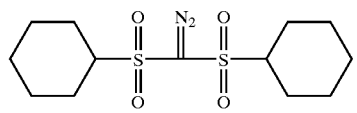

(PAG7-4)
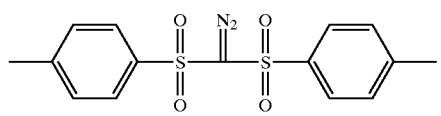

(PAG7-5)
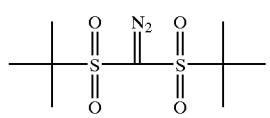

(5) The oximesulfonate derivatives represented by the following general formula (PAG8).

(PAG8)
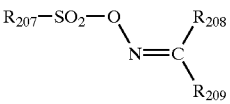

In the formula, $R_{207}$ represents a substituted or unsubstituted alkyl, cycloalkyl, aryl or aralkyl group; $R_{208}$ and $R_{209}$ each represent a substituted or unsubstituted alkyl, cycloalkyl, aryl, aralkyl, cyano or acyl group; $R_{208}$ and $R_{209}$ may combine together to form a carbocyclic ring or a heterocycylic ring including an oxygen, nitrogen or sulfur atom.

In the following, some specific examples are enumerated not to restrict the scope of the invention thereto at all.

(PAG8-1)
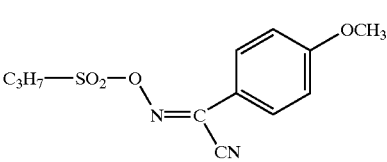

(PAG8-2)
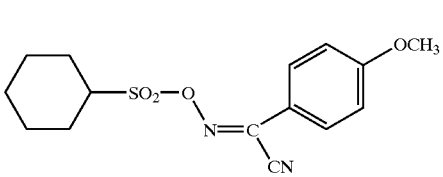

(PAG8-3)
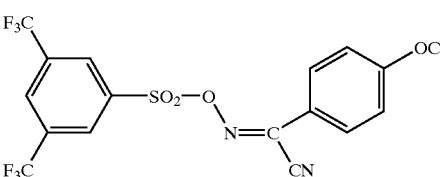

(PAG8-4)
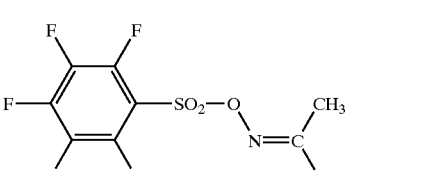

(PAG8-5)
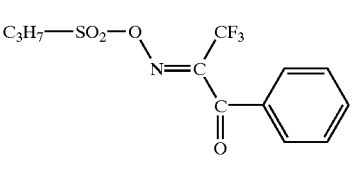

(PAG8-6)
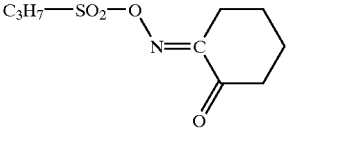

(PAG8-7)
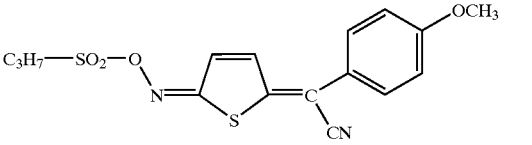

-continued

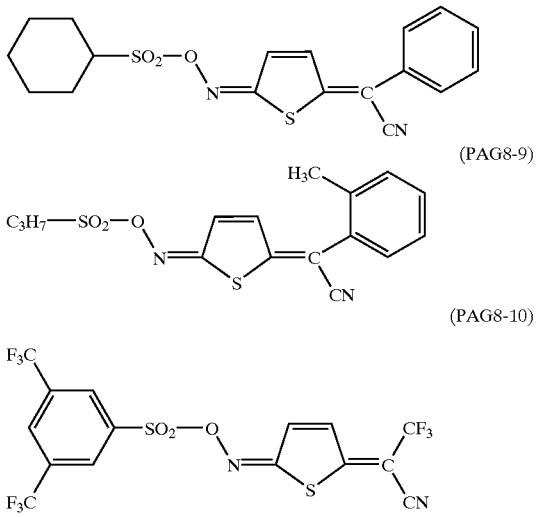

(PAG8-8)

(PAG8-9)

(PAG8-10)

Among the photo-acid generators enumerated above, those represented by formulae (PAG3) to (PAG8) and capable of generating an organic sulfonic acid are preferred. In particular, such photo-acid generators that generate either a benzenesulfonic acid having a fluorine atom or a fluorine-substituted alkyl group as a substituent or a fluorine-containing alkylsulfonic acid are preferred. Nonaflate, pentafluorobenzenesulfonate and 3,5-bis(trifluoromethyl)benzenesulfonate are still more preferred.

The added amount of the compound in (B) of the invention that generates an acid upon irradiation with one of an actinic ray or a radiation usually lies in the range of 0.1 to 20% by weight, preferably 0.5 to 10% by weight, and more preferably 1 to 7% by weight based on the total solid content of the composition of the invention. These compounds may be used individually or in combination of two or more thereof.

[3] Solvent in (C) of the Invention

The composition of the invention is dissolved in a solvent which can dissolve each ingredient cited above and coated on a substrate. Preferable solvents used for such purpose include 1-methoxy-2-propanol acetate, 1-methoxy-2-propanol, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropinonate, ethyl ethoxypropionate, methylpyruvate, ethyl pyruvate, propyl pyruvate, N,N-dimethylformamide, dimethylsulfoxide, N-methylpyrrolidone, tetrahydrofuran, etc. Among them, 1-methoxy-2-propanol acetate and 1-methoxy-2-propanol are particularly preferred. These solvents may be used individually or as a mixture of two or more thereof.

In the present invention, the amount of the components other than the solvent (total solid content) is usually 3 to 30 wt %, preferably 5 to 25 wt % based on content of the solvent.

[4] Surfactant Containing at Least One of a Group Consisting of a Fluorine Atom and a Silicon Atom (D).

The positive resist composition of the invention can be incorporated with a surfactant containing at least one of a group consisting of a fluorine atom and a silicon atom. More specifically, the positive resist composition of the invention can contain one or more compounds selected from the group consisting of fluorine-containing surfactants, silicone-based surfactants and those containing both of fluorine and silicon atoms. The incorporation of the surfactant containing at least one of a group consisting of a fluorine atom and a silicon atom acts to effectively suppress the generation of development defect and improve coating performance.

As such surfactants, those set forth, for example, in the following patents can be used. Japanese Patent Laid-Open Nos. 36,663/1987, 226,746/1986, 226,745/1986, 170,950/1987, 34,540/1988, 230,165/1995, 62,834/1996, 54,432/1997 and 5,988/1997, U.S. Pat. Nos. 5,405,720, 5,360,692, 5,529,881, 5,296,330, 5,436,098, 5,576,143, 5,296,143, 5,294,511 and 5,824,451. Moreover, the following commercially available surfactants can be used as they are.

As such commercially available surfactants, fluorine-containing or silicone-based surfactants such as, for example, Eftop EF301, EF303 and EF352 (all manufactured by Shin-Akita Kasei K.K.), Florad FC430 and 431 (both manufactured by Sumitomo 3M, Inc.), Megafac F171, F173, F176, F189 and R08 (all manufactured by Dainippon Ink and Chemicals, Inc.), Asahi-Gard AG710, Surflon S-382, SC101, 102, 103, 104, 105 and 106, (all manufactured by Asahi Glass Co., Ltd.), Troysol S-366 (manufactured by Troy Chemical Industries, Inc.), etc. can be cited. Further, a polysiloxane polymer KP-341 (manufactured by Shin-Etsu Chemical Co., Ltd.) can also be used as a silicon-based surfactant.

The incorporated amount of the surfactant is usually 0.001 to 2% by weight, preferably 0.01 to 1% by weight on the basis of the solid content in the composition of the invention. These surfactants may be used individually or in combination of two or more thereof.

[5] Acid Diffusion-Suppressing Agent Applicable to the Invention (E)

The composition of the invention is preferably incorporated with an acid diffusion-suppressing agent in order to prevent the performance shift caused not only by the time elapsed after the irradiation with an actinic ray or a radiation till post-baking (T-top shape formation, sensitivity fluctuation, patterned line width fluctuation, etc.), but also by the time elapse after coating, and further to suppress an excessive diffusion of acid during post-baking (which leads to the deterioration of pattern resolution). The acid diffusion-suppressing agent usually comprises an organic basic compound such as, for example, those containing a basic nitrogen, and a compound whose conjugated acid has a pKa value not less than 4 is preferably used.

Specifically, the structures represented by the following general formulae (A) to (E) are preferably employed.

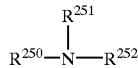

(A)

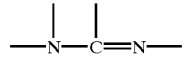

(B)

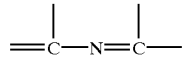

(C)

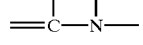

(D)

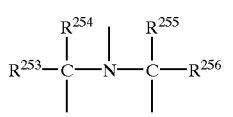

(E)

In the formulae, $R^{250}$, $R^{251}$ and $R^{252}$, which may be the same or different, each represent a hydrogen atom, an alkyl group having 1 to 6 carbon atoms, an aminoalkyl group having 1 to 6 carbon atoms, a hydroxyalkyl group having 1 to 6 carbon atoms, and a substituted or unsubstituted aryl group having 6 to 20 carbon atoms. Here, $R^{251}$ and $R^{252}$ may connect together to form a ring.

$R^{253}$, $R^{254}$, $R^{255}$ and $R^{256}$, which may be the same or different, each represent an alkyl group having 1 to 6 carbon atoms.

More preferable compounds are nitrogen-containing basic compounds having two or more nitrogen atoms each lying in different chemical environments within a single molecule. Particularly preferable compounds are those containing both of a substituted or unsubstituted amino group and a cyclic structure including a nitrogen atom, or those containing an alkylamino group.

Specific examples of preferable compounds include substituted or unsubstituted guanidines, substituted or unsubstituted aminopyridines, substituted or unsubstituted aminoalkylpyridines, substituted or unsubstituted aminopyrrolidines, substituted or unsubstituted indazoles, imidazole, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, substituted or unsubstituted aminoalkylmorpholine, etc. Preferable substituents include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group, a cyano group, etc.

Particularly preferable compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperadine, N-(2-aminoethyl)piperadine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, etc. However, the invention is not restricted to those enumerated compounds.

These nitrogen-containing basic compounds can be used individually or in combination of two or more thereof.

The use ratio of the acid-generating agent and the organic basic compound in the composition should preferably lie in the range of 2.5 to 300 in the molar ratio of (acid-generating agent)/(organic basic compound). In the case where this molar ratio is below 2.5, the sensitivity becomes low and the pattern resolution sometimes deteriorates, while, with a molar ratio over 300, not only resist patterns tend to fatten, resulting in resolution deterioration when the time after exposure till post-baking elapses too long, but also the pattern resolution sometimes deteriorates. The molar ratio of (acid-generator)/(organic basic compound) is preferably 5.0 to 200, and more preferably 7.0 to 150.

In the manufacture of high precision LSI's, pattern formation in a resist film is performed by first coating the positive resist composition of the invention on a substrate (examples: a transparent substrate such as a silicon/silicon dioxide film, a glass substrate, an ITO plate, etc.), then conducting irradiation of the coating by means of an actinic light or radiation exposing apparatus, and thereafter conducting post-baking, developing, rinsing and drying. Via these procedures, a good-quality resist pattern can be formed.

As the developer for the positive-type resist of the invention, one can use an aqueous solution of an alkali compound including inorganic alkali compounds such as sodium hydroxide, potassium hydroxide, sodium carbonate, sodium silicate, sodium metasilicate, aqueous ammonia, etc., and organic ones such as primary amines exemplified by ethylamine, n-propylamine, etc., secondary amines exemplified by diethylamine, di-n-butylamine, etc., tertiary amines exemplified by triethylamine, methyldiethylamine, etc., alcohol amines exemplified by dimethylethanolamine, triethanolamine, etc., quaternary ammonium salts exemplified by tetramethylammonium hydroxide, tetraethylammonium hydroxide, choline, etc., cyclic amines exemplified by pyrole, piperidine, etc. and the like. The aqueous alkali solution enumerated above can further contain an alcohol such as isopropyl alcohol, etc. and a surfactant such as nonionic one each at an appropriate amount.

Among the developers mentioned above, quaternary ammonium salts are preferred, and tetramethylammonium hydroxide and choline are still more preferred.

EXAMPLES

In the following, the invention is explained more in detail with reference to Examples, by which, however, the content of the invention is not limited at all.

Synthesis Example 1

Into 60 ml of 1-methoxy-2-proanol were dissolved 18.9 g (0.07 mol) of 4-[bis(trifluoromethyl)-hydroxymethyl] styrene, 3.52 g (0.02 mol) of 4-t-butoxystyrene, 1.04 g (0.01 mol) of styrene. To the resulting solution, 0.25 g of 2,2'-azobis(2,4-dimethylvaleronitrile) (manufactured by Wako Pure Chemical Industries, Ltd. with a trade Name of V-65) was added as a polymerization initiator. This solution was added dropwise to 10 ml of 1-methoxy-2-propanol heated to 70° C. over the period of 2 hours under stirring along with the injection of nitrogen gas. After the completion of addition, stirring was continued for 4 hours. Thereafter, the reaction solution was thrown into 1 liter of a methanol/ion-exchanged water (1/1) mixture under vigorous stirring. The deposited resin was washed with ion-exchanged water, filtered and dried in vacuo to give 16.1 g of a white resin. By an NMR measurement, it was confirmed that this resin has the structure of P-1 (consisting of the repeating units listed in Table 1 in molar ratios of 70/20/10 from the leftmost repeating unit). A GPC measurement proved that the weight average molecular weight of the resin (calculated in terms of polystyrene) was 15,000.

Each of the resins shown in Table 1 was synthesized in a similar manner.

TABLE 1

| Resin (A) | Structure | Molecular Weight |
|---|---|---|
| P-1 | poly(styrene with C(CF$_3$)$_2$OH / styrene with O-C(CH$_3$)$_3$ / styrene) (70/20/10) | 15000 |
| P-2 | poly(styrene with C(CF$_3$)$_2$OH / styrene with O-C(CH$_3$)$_3$ / methacrylate of cyclohexyl) (70/20/10) | 23000 |
| P-3 | poly(styrene with C(CF$_3$)$_2$OH / styrene with O-C(CH$_3$)$_3$ / methacrylate of adamantyl) (60/25/15) | 29000 |
| P-4 | poly(styrene with C(CF$_3$)$_2$OH / styrene with O-C(CH$_3$)$_3$ / acrylate of 2-(4-methylcyclohexyl)propyl / styrene with O-C(O)CH$_3$) (55/25/15/5) | 26000 |

TABLE 1-continued
| Resin (A) | Structure | Molecular Weight |
|---|---|---|
| P-5 | 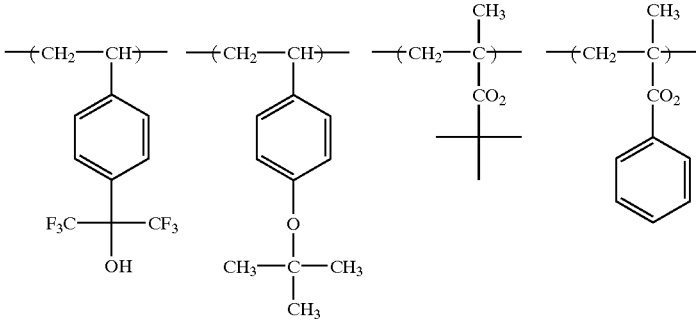 (55/25/15/5) | 27000 |
| P-6 | 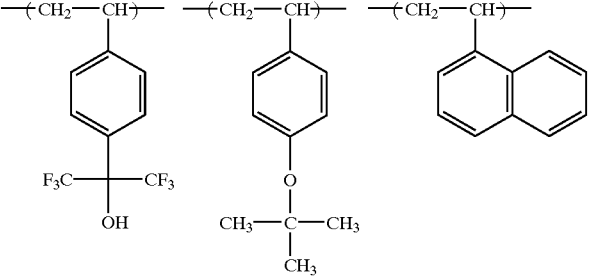 (60/25/15) | 37000 |
| P-7 | 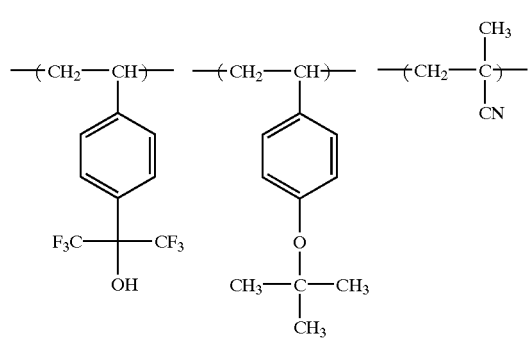 (60/30/10) | 19000 |
| P-8 | 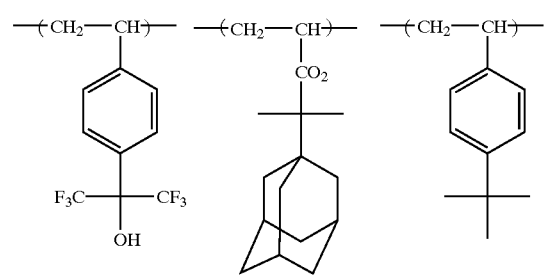 (60/30/10) | 30000 |

TABLE 1-continued
| Resin (A) | Structure | Molecular Weight |
|---|---|---|
| P-9 | 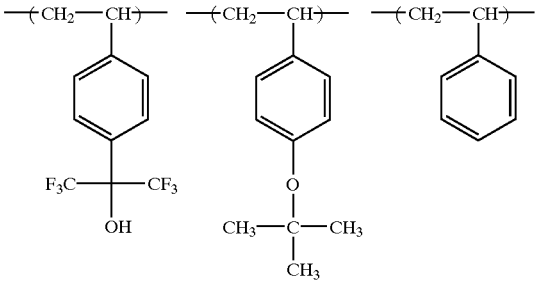<br>(50/30/20) | 25000 |
| P-10 | 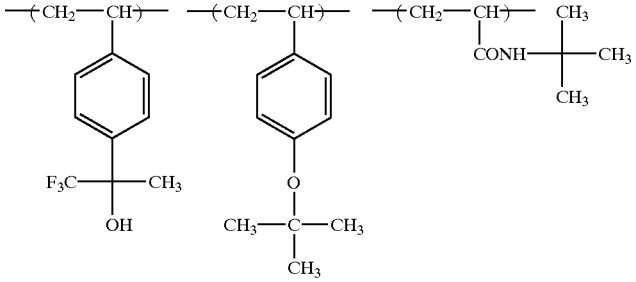<br>(60/25/15) | 21000 |
| P-11 | 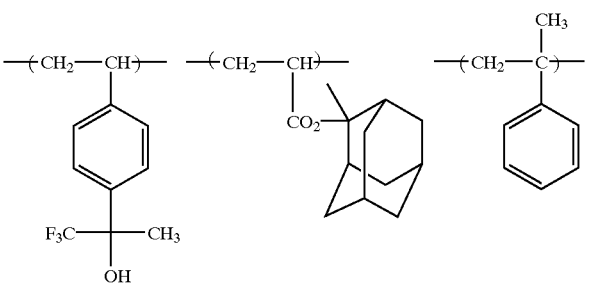<br>(60/30/10) | 10000 |
| P-12 | 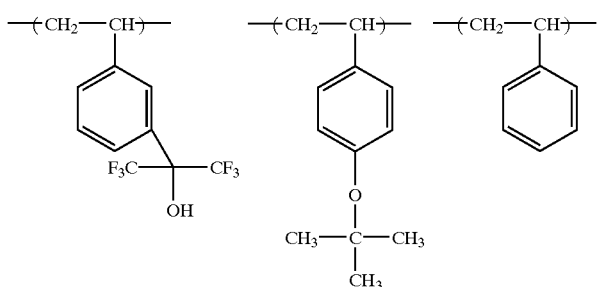<br>(60/25/15) | 19000 |

TABLE 1-continued

| Resin (A) | Structure | Molecular Weight |
|---|---|---|
| B-1 | 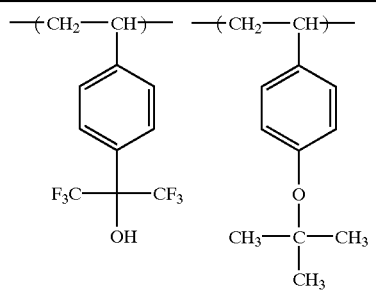 (70/30) | 16000 |
| B-2 | 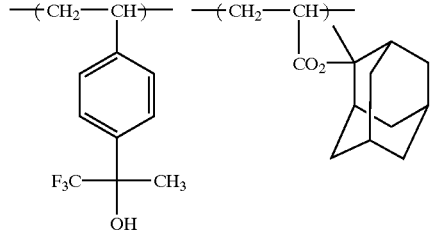 (70/30) | 21000 |
| B-3 | 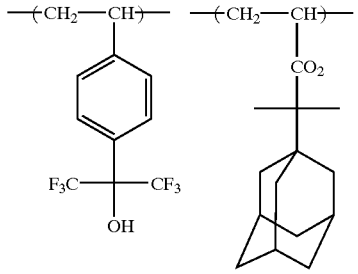 (65/35) | 23000 |
| C-1 | 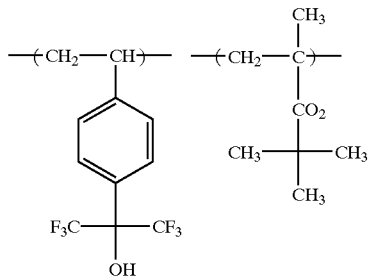 (65/35) | 17000 |

Examples 1 to 15 and Comparative Example 1

As Examples 1 to 6, to 1.36 g of each of resins (P-1) to (P-6) shown in Table 1 above, 0.02 g of the nonaflate salt of triphenylsulfonium (PAG4-3) and 0.02 g of an imidosulfonate compound (PAG6-19) were added; the mixture was dissolved in 8.5 g of 1-methoxy-2-propanol acetate; and, to the solution, 0.005 g of dicyclohexylmethylamine and 0.01 g of Megafac R08 (manufactured by Dainippon Ink and Chemicals, Inc.) as a fluorine-containing surfactant were added to give a resist composition of the invention. As Examples 7 to 12, to 1.36 g of each of resins (P-7) to (P-12), 0.04 g of the nonaflate salt of triphenylsulfonium (PAG4-3) was added; the mixture was dissolved in 8.5 g of 1-methoxy-2-propanol acetate; and, to the solution, 0.005 g of dicyclohexylmethylamine and 0.01 g of Megafac R08 (manufactured by Dainippon Ink and Chemicals, Inc.) as a fluorine-containing surfactant were added to give a resist composition of the invention.

As Example 13, a resist composition was prepared in a similar manner as in Example 1 except that, instead of 1.36 g of (P-1), 1.2 g of (P-1) and 0.16 g of a complementary resin (B-1) were used.

As Example 14, a resist composition was prepared in a similar manner as in Example 8 except that instead of 1.36 g of (P-8), 1.2 g of (P-8) and 0.16 g of a complementary resin (B-1) were used.

As Example 15, a resist composition was prepared in a similar manner as in Example 5 except that instead of 1.36 g of (P-5), 1.2 g of (P-5) and 0.16 g of a complementary resin (B-3) were used.

Further, as Comparative Example 1, a resist composition was prepared in a similar manner as in Example 1 except that the resin was changed to (C-1) shown in Table 1.

After filtered through a Teflon filter of 0.1 m aperture size, each resist solution prepared above was coated, with use of a spin coater, on a silicon wafer that had been subjected to a hexamethyldisilazane treatment, and dried on a vacuum contact type-hot plate kept at 110° C. for 90 sec to give a 0.3 μm thick resist film. The resist film thus obtained was subjected to an image exposure with a KrF excimer stepper (FPA-3000EX5, a product of Canon, Inc.), followed by post-baking at 110° C. for 90 sec. Thereafter, the resist film was developed with a 0.262 N TMAH aqueous solution to give a L/S pattern of 0.15 μm rule.

[Surface Roughness] The degree of roughness at the surface of the line area in the 0.15 μm rule line-and-space pattern was examined with an SEM for visual evaluation. The samples in which substantially no roughness (unevenness) was observed were evaluated as A, those in which roughness was faintly recognized were evaluated as B, and those in which roughness was clearly recognized were evaluated as C.

[Number of Particles and Particle Increment after Storage Time Passage] For each resist composition solution (coating solution) prepared above, the number of particles therein was counted just after the preparation of the solution (Initial Particle Number) and that after one-week storage at 4° C. (Particle Number after Storage Time Passage) with use of a particle counter manufactured by Rion K. K. In addition to the initial particle number, the particle increment was calculated by (Particle Number After Time Passage)–(Initial Particle Number) for evaluation. The number of particles with a size of 0.3 μm or larger present in one ml of the resist composition solution was counted.

[Number of Development Defect] For each resist pattern prepared according to the procedures described above, the number of development defect was measured with use of a KLA-2112 inspector manufactured by KLA-Tencor Corp. The primary data obtained was regarded as the number of development defect.

The results are shown in Table 2.

TABLE 2

| | Resin (A) | Jointly Used Resin | Surface Roughness | Number of Particles in Fluid Initial Value | Number of Particles in Fluid Increment | Development Defect |
|---|---|---|---|---|---|---|
| Example | | | | | | |
| 1 | P-1 | None | A | 36 | 57 | 36 |
| 2 | P-2 | None | A | 47 | 73 | 38 |
| 3 | P-3 | None | B | 29 | 51 | 38 |
| 4 | P-4 | None | A | 38 | 62 | 38 |
| 5 | P-5 | None | A | 46 | 63 | 49 |

TABLE 2-continued

| | Resin (A) | Jointly Used Resin | Surface Roughness | Number of Particles in Fluid Initial Value | Number of Particles in Fluid Increment | Development Defect |
|---|---|---|---|---|---|---|
| 6 | P-6 | None | A | 37 | 74 | 51 |
| 7 | P-7 | None | B | 47 | 57 | 38 |
| 8 | P-8 | None | A | 34 | 72 | 45 |
| 9 | P-9 | None | A | 49 | 83 | 39 |
| 10 | P-10 | None | B | 29 | 79 | 45 |
| 11 | P-11 | None | A | 26 | 57 | 42 |
| 12 | P-12 | None | A | 27 | 61 | 49 |
| 13 | P-1 | B-1 | B | 48 | 81 | 22 |
| 14 | P-8 | B-2 | A | 46 | 72 | 23 |
| 15 | P-5 | B-3 | B | 40 | 74 | 24 |
| Comparative Example | | | | | | |
| 1 | C-1 | None | C | 110 | 187 | 55 |

It has been confirmed that, according to the invention, the particle number in the resist fluid is desirably small immediately after preparation as well as after storage, and the surface roughness was excellent.

Synthesis Example 2

Into 60 ml of 1-methoxy-2-propanol were dissolved 18.9 g (0.07 mol) of 4-[bis(trifluoromethyl)-hydroxymethyl] styrene, 3.52 g (0.02 mol) of 4-t-butoxystyrene, 1.94 g (0.01 mol) of pentafluorostyrene. To the resulting solution, 0.25 g of 2,2'-azobis(2,4-dimethylvaleronitrile) (V-65 manufactured by Wako Pure Chemical Industries, Ltd.) was added as a polymerization initiator. This solution was added dropwise to 10 ml of 1-methoxy-2-propanol heated to 70° C. over the period of 2 hours under stirring along with the injection of nitrogen gas. After the completion of addition, stirring was continued for 4 hours. Thereafter, the reaction solution was thrown into 1 liter of a methanol/ion-exchanged water (1/1) mixture under vigorous stirring. The deposited resin was washed with ion-exchanged water, filtered and dried in vacuo to give 16.1 g of a white resin. By NMR measurement, it was confirmed that this resin has the structure of P-21 (consisting of the repeating units listed in Table 1 in molar ratios of 70/20/10 starting from the leftmost repeating unit). A GPC measurement proved that the weight average molecular weight of the resin (calculated in terms of polystyrene) was 19,000.

Each of the resins shown in Table 3 was synthesized in a similar manner.

TABLE 3
| Resin (A) | Structure | Molecular weight |
|---|---|---|
| P-21 | 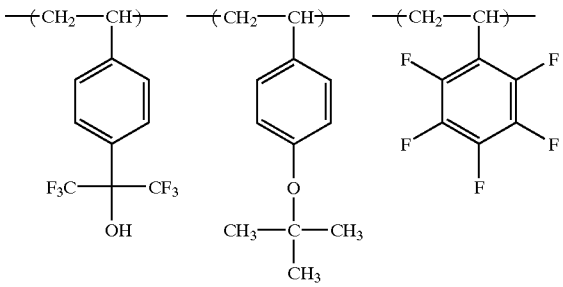 (70/20/10) | 19000 |
| P-22 | 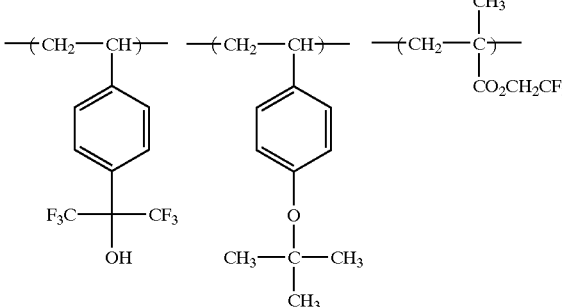 (70/20/10) | 26000 |
| P-23 | 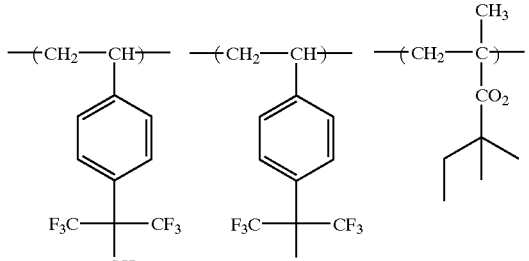 (60/25/15) | 19000 |
| P-24 | 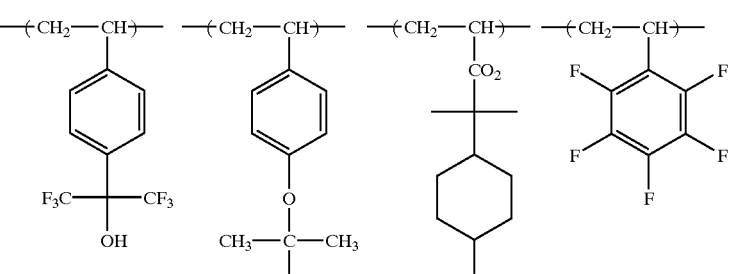 (55/25/15/5) | 28000 |

TABLE 3-continued
| Resin (A) | Structure | Molecular weight |
|---|---|---|
| P-25 | 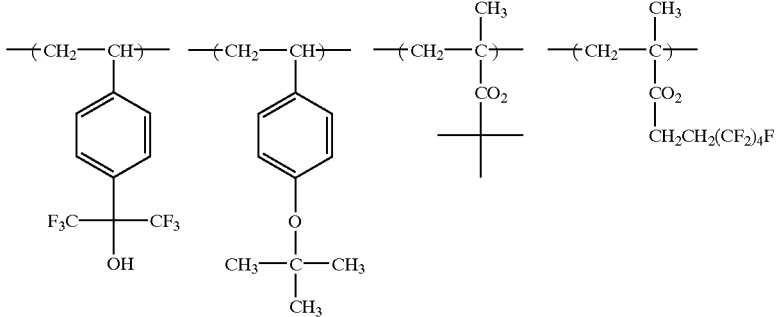 (55/25/15/5) | 23000 |
| P-26 | 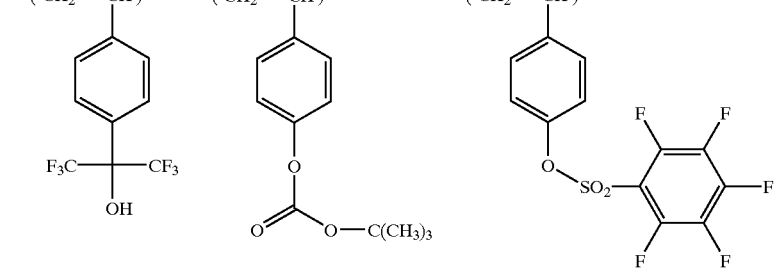 (60/25/15) | 31000 |
| P-27 | 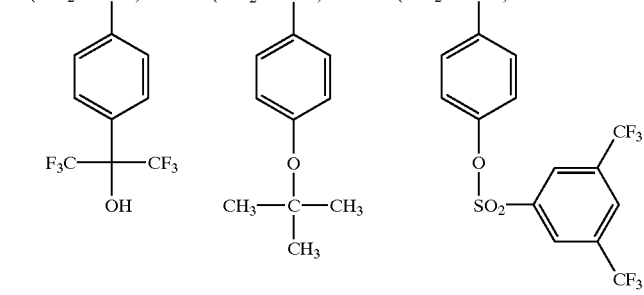 (60/30/10) | 16000 |
| P-28 | 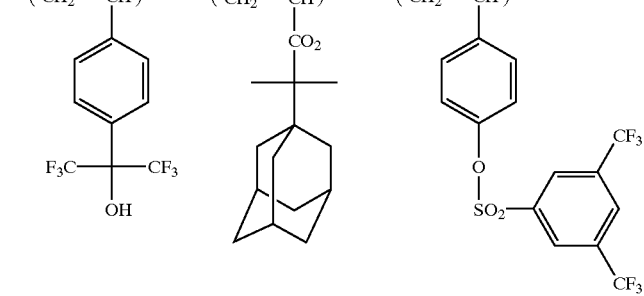 (60/30/10) | 26000 |

TABLE 3-continued

| Resin (A) | Structure | Molecular weight |
|---|---|---|
| P-29 | Terpolymer: −(CH₂−CH)− with phenyl-C(CF₃)(CH₃)OH / −(CH₂−CH)− with phenyl-C(CF₃)(CH₃)OCH₂CF₃ / −(CH₂−CH)− with phenyl-O-C(CH₃)₃ (50/30/20) | 20000 |
| P-30 | Terpolymer: −(CH₂−CH)− with phenyl-C(CF₃)(CH₃)OH / −(CH₂−CH)− with phenyl-C(CF₃)(CH₃)OCH₃ / −(CH₂−CH)− with CO₂−CH₂CH₂(CF₂)₄CF(CF₃)₂ (60/25/15) | 13000 |
| P-31 | Terpolymer: −(CH₂−CH)− with phenyl-C(CF₃)(CH₃)OH / −(CH₂−CH)− with CO₂-adamantyl / −(CH₂−C(CH₃))− with CO₂−CH₂(CF₂)₆H (60/30/10) | 17000 |
| P-32 | Terpolymer: −(CH₂−CH)− with meta-phenyl-C(CF₃)₂OH / −(CH₂−CH)− with phenyl-O-CH₂OCH₃ / −(CH₂−C(CH₃))− with CH₂CF₂CHF₂ (60/25/15) | 18000 |

Examples 21 to 32 and Comparative Examples 2 to 3

To 1.36 g of each of resins (P-21) to (P-26) shown in Table 3 above, 0.02 g of the nonaflate salt of triphenylsulfonium (PAG4-3) and 0.02 g of an imidosulfonate compound (PAG6-19) were added; the mixture was dissolved in 8.5 g of 1-methoxy-2-propanol acetate; and, to the solution, 0.005 g of dicyclohexylmethylamine and 0.01 g of Megafac R08 (manufactured by Dainippon Ink and Chemicals, Inc.) as a fluorine-containing surfactant were added to give a resist composition of the invention. To 1.36 g of each of resins (P-27) to (P-32), 0.04 g of the nonaflate salt of triphenylsulfonium (PAG4-3) was added; the mixture was dissolved in 8.5 g of 1-methoxy-2-propanol acetate. To the resulting solution, 0.005 g of dicyclohexylmethylamine and 0.01 g of Megafac R08 (manufactured by Dainippon Ink and Chemicals, Inc.) as a fluorine-containing surfactant were added to give a resist composition of the invention.

As Comparative Example 2, a resist solution was prepared in a similar manner as in Example 21 except that the resin component described above was changed to a copolymer of 4-[bis(trifluoromethyl)-hydroxymethyl]styrene and t-butyl methacrylate (copolymerization molar ratio=65/35, weight average molecular weight=17000) (Resin C-2).

As Comparative Example 3, a resist solution was prepared in a similar manner as in Example 21 except that the resin component described above was changed to a copolymer of 4-(hydroxymethyl)styrene, 4-(t-butoxy)sytrene and 2,2,2-trifluoromethyl methacrylate (copolymerization molar ratio=40/40/20, weight average molecular weight=18000) (Resin C-3).

After filtered through a Teflon filter of 0.1 μm aperture size, each resist solution prepared above was coated, with use of a spin coater, on a silicon wafer that had been subjected to a hexamethyldisilazane treatment, and dried on a vacuum contact type-hot plate kept at 110° C. for 90 sec to give a 0.3 μm thick resist film. The coated film was subjected to an image exposure with a KrF excimer stepper (FPA-3000EX5, a product of Canon, Inc.). Then, after post-baked at 110° C. for 90 sec, the resist film was developed with a 0.262 N TMAH aqueous solution to give a L/S pattern of 0.13 μm rule.

[Surface Roughness] The degree of roughness at the top surface of the line area in the 0.13 μm/0.13 μm line-and-space pattern was examined with an SEM for visual evaluation. The samples in which substantially no roughness (unevenness) was recognized were evaluated as A, those in which roughness was faintly recognized were evaluated as B, and those in which roughness was clearly recognized were evaluated as C.

[Scum] The space areas in the 0.13 μm/0.13 μm line-and-space pattern were examined with an SEM for visual evaluation. The samples in which substantially no scum was observed were evaluated as A, those in which scum was faintly observed were evaluated as B, and those in which scum was noticeably observed were evaluated as C.

The results are shown in Table 4.

TABLE 4

|  | Resin | Surface Roughness | Scum |
|---|---|---|---|
| Example 21 | P-21 | A | A |
| 22 | P-22 | A | B |
| 23 | P-23 | B | A |
| 24 | P-24 | A | A |
| 25 | P-25 | A | B |
| 26 | P-26 | A | B |
| 27 | P-27 | B | A |
| 28 | P-28 | A | A |
| 29 | P-29 | A | A |
| 30 | P-30 | B | B |
| 31 | P-31 | A | B |
| 32 | P-32 | A | A |
| Comparative Example 2 | C-2 | C | C |
| Comparative Example 3 | C-3 | C | C |

It was confirmed that the resist compositions comprising a fluorine atom-containing resin according to the invention are preferable giving little surface roughness and scum.

Synthesis Example 3 (Synthesis of Resin P-41)

Into 60 ml of 1-methoxy-2-propanol were dissolved 18.9 g (0.07 mol) of 4-[bis (trifluoromethyl)-hydroxymethyl] styrene, 3.52 g (0.02 mol) of 4-(t-butoxy)styrene, and 2.36 g (0.01 mol) of 1,1-bis(trifuloromethyl)-ethyl acrylate. To the solution 0.25 g of 2,2'-azobis(2,4-dimethylvaleronitrile) (V-65 manufactured by Wako Pure Chemical Industries, Ltd.) was added as a polymerization initiator. This solution was added dropwise to 10 ml of 1-methoxy-2-propanol heated to 70° C. over the period of 2 hours under stirring along with the injection of nitrogen gas. After the completion of addition, stirring was continued for 4 hours. Thereafter, the reaction solution was thrown into 1 liter of a methanol/ion-exchanged water (1/1) mixture under vigorous stirring. The deposited resin was washed with ion-exchanged water, filtered and dried in vacuo to give 15.6 g of a white resin. By NMR measurement, it was confirmed that this resin has the molar composition of 70/20/10. A GPC measurement proved that the weight average molecular weight of the resin (calculated in terms of polystyrene) was 13,000.

In a similar manner, the following resins of the invention were synthesized.

| | Structure | Molecular Weight |
|---|---|---|
| P-41 | —(CH₂—CH)— —(CH₂—CH)— —(CH₂—CH)— with substituents (see figure); (70/20/10) | 13000 |

-continued
| | Structure | Molecular Weight |
|---|---|---|
| P-42 | 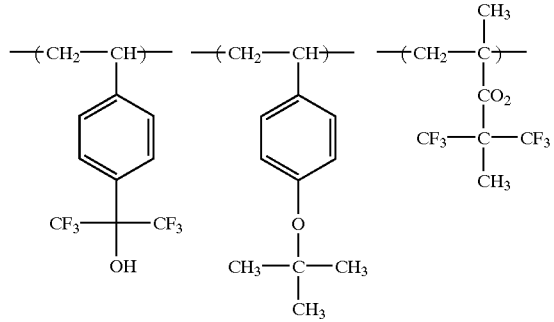 (70/20/10) | 25000 |
| P-43 | 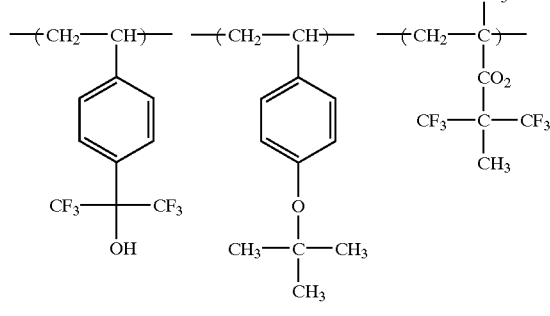 (60/25/15) | 19000 |
| P-44 | 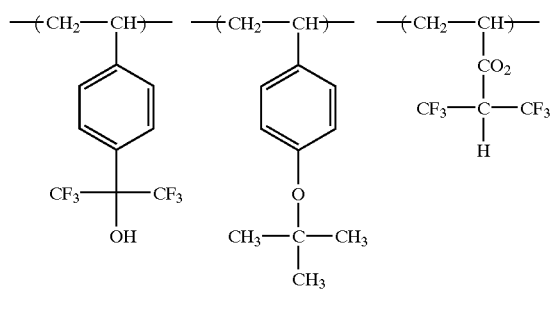 (60/25/15) | 26500 |
| P-45 | 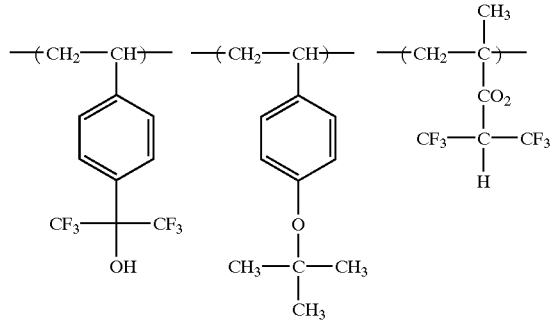 (60/25/15) | 31000 |

-continued
| | Structure | Molecular Weight |
|---|---|---|
| P-46 | 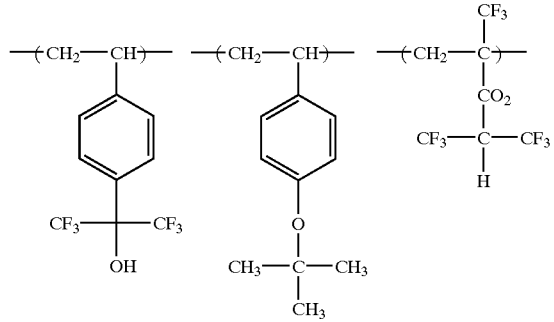<br>(60/25/15) | 9600 |
| P-47 | 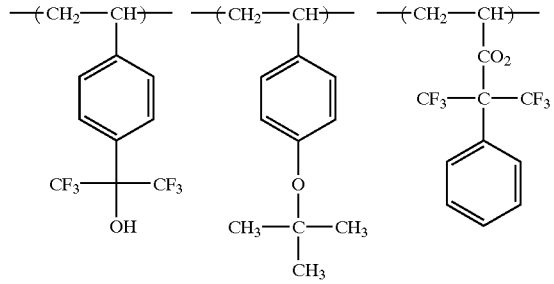<br>(60/30/10) | 17900 |
| P-48 | 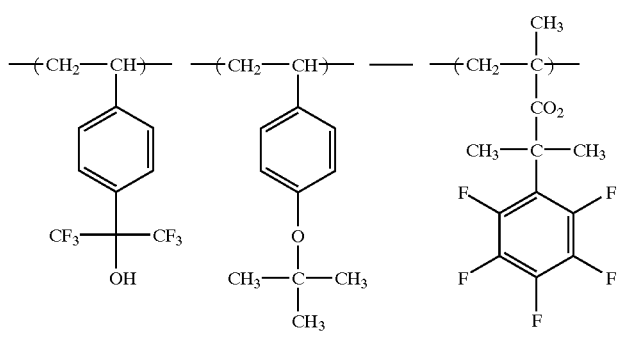<br>(60/30/10) | 35000 |
| P-49 | 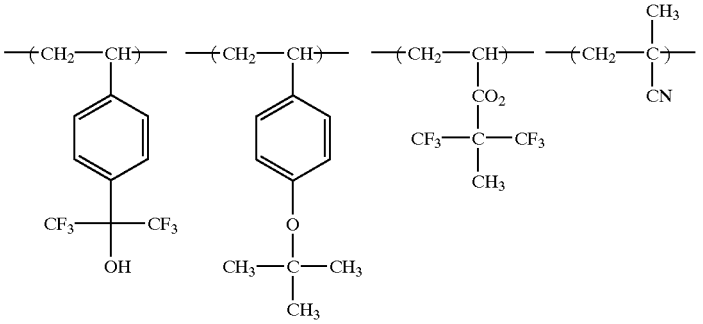<br>(40/25/5/30) | 18000 |

-continued
| | Structure | Molecular Weight |
|---|---|---|
| P-50 | 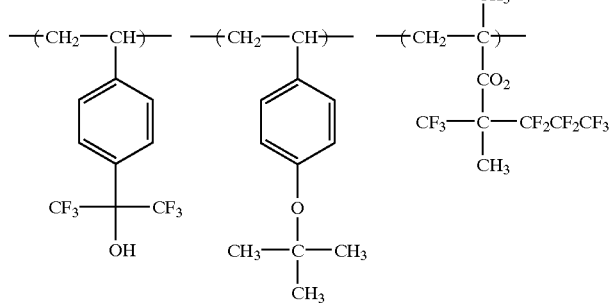 (60/25/15) | 22000 |
| P-51 | 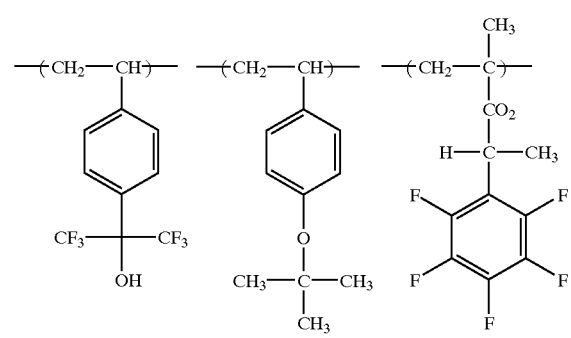 (60/30/10) | 20000 |
| P-52 | 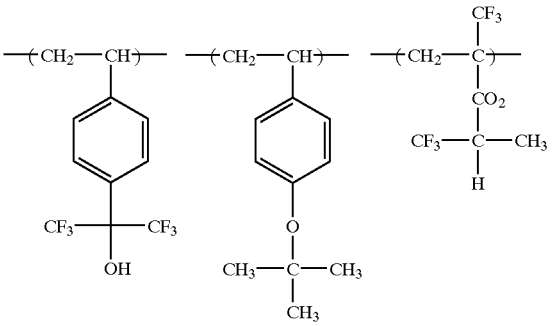 (60/25/15) | 11500 |
| P-53 | 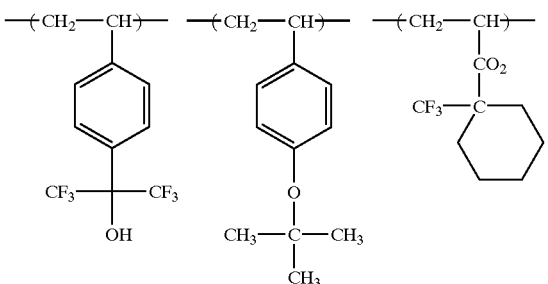 (60/20/20) | 18000 |

-continued

| | Structure | Molecular Weight |
|---|---|---|
| P-54 | (structure with four monomer units: poly(styrene with C(CF$_3$)$_2$OH), poly(styrene with O-C(CH$_3$)$_3$), poly(4-hydroxystyrene), and poly(methacrylate with CO$_2$CH(CF$_3$)$_2$)) (50/20/10/20) | 21000 |
| P-55 | (structure with four monomer units: poly(styrene with C(CF$_3$)$_2$OH), poly(styrene with O-C(CH$_3$)$_3$), maleic anhydride unit, and poly(methacrylate with CO$_2$CH(CF$_3$)$_2$)) (50/25/15/10) | 18000 |
| P-56 | (structure with five monomer units: poly(styrene with C(CF$_3$)$_2$OH), poly(styrene with O-C(CH$_3$)$_3$), maleic anhydride unit, poly(vinyl ethyl ether) OCH$_2$CH$_3$, and poly(methacrylate with CO$_2$C(CH$_3$)(CF$_3$)$_2$)) (45/25/15/5/10) | 20000 |
| P-57 | (structure with five monomer units: poly(styrene with C(CF$_3$)$_2$OH), poly(styrene with O-C(CH$_3$)$_3$), maleic anhydride unit, norbornane-type unit with CO$_2$CH(CF$_3$)$_2$, and poly(methacrylate with CO$_2$C(CH$_3$)(CF$_3$)$_2$)) (50/25/15/5/5) | 24000 |

-continued

| Structure | Molecular Weight |
|---|---|
| P-58: —(CH$_2$—CH)—  —(CH$_2$—CH)—  —(CH—Cl)—  —(CH$_2$—CH)—  —(CH$_2$—CH)— with substituents: phenyl-C(CF$_3$)$_2$OH; phenyl-O-C(CH$_3$)$_3$; cyclic anhydride; CH$_2$-C(CF$_3$)$_2$OH; CO$_2$CH(CF$_3$)$_2$ (50/25/15/5/5) | 17000 |

[Measurement of Transmittance]

To 1.36 g of each of resins (P-41) to (P-46) shown above, 0.02 g of the nonaflate salt of triphenylsulfonium (PAG4-3) and 0.02 g of an imidosulfonate compound (PAG6-19) were added; the mixture was dissolved in 8.5 g of 1-methoxy-2-propanol acetate. To the solution, 0.005 g of dicyclohexylmethylamine and 0.01 g of Megafac R08 (manufactured by Dainippon Ink and Chemicals, Inc.) as a fluorine-containing surfactant were added to give a resist composition of the invention. To 1.36 g of each of resins (P-47) to (P-58), 0.04 g of the nonaflate salt of triphenylsulfonium (PAG4-3) was added; the mixture was dissolved in 8.5 g of propylene glycol monomethyl ether acetate. To the resulting solution, 0.005 g of dicyclohexylmethylamine and 0.01 g of Megafac R08 (manufactured by Dainippon Ink and Chemicals, Inc.) as a fluorine-containing surfactant were added to give a resist composition of the invention.

As Comparative Example 4, a resist composition was prepared as a KrF resist for comparison in a similar manner as in Example 41 except that the resin of the invention described above was changed to poly[(4-hydroxystyrene)-(4-t-butoxycarbonyloxystyrene)] (copolymerization molar ratio=65/35, weight average molecular weight=15000) was used.

After filtered through a Teflon filter of 0.1 μm aperture size, each sample solution was coated on a calcium fluoride disk with use of a spin coater, and dried at 120° C. for 5 min to give a 0.1 μm thick resist film. The absorption of the coated film was measured with an Acton CAMS-507 spectrometer, and the transmittance at 157 nm was calculated. The results are shown in Table 5.

TABLE 5

| Resin of the Invention | Transmittance at 157 nm (%) |
|---|---|
| P-41 | 38 |
| P-42 | 38 |
| P-43 | 42 |
| P-44 | 46 |
| P-45 | 40 |
| P-46 | 40 |
| P-47 | 36 |
| P-48 | 38 |
| P-49 | 42 |
| P-50 | 46 |
| P-51 | 40 |
| P-52 | 44 |

TABLE 5-continued

| Resin of the Invention | Transmittance at 157 nm (%) |
|---|---|
| P-53 | 37 |
| P-54 | 37 |
| P-55 | 35 |
| P-56 | 36 |
| P-57 | 35 |
| P-58 | 35 |
| Comparative Example 4 (Acetal-based KrF resist) | 18 |

From the results in Table 5, it is seen that the measured transmittance of the coated film using the composition prepared according to the invention exceeds 35% for every sample, indicating that all the samples are sufficiently transparent at 157 nm.

[Evaluation of Coating Performance and Development Defect]

The surfactant used in each sample prepared for transmittance measurement described above was changed to the following surfactants, W-1 to W-4, to prepare resist compositions of the invention. The surfactants used are shown in Table 6.

Each code represents the following surfactants.

W1: Megafac F176 (manufactured by Dainippon Ink and Chemicals, Inc.) (fluorine-containing type)
W2: Megafac R08 (made by Dainippon Ink and Chemicals, Inc.) (fluorine-containing and silicon-based)
W3: Polysiloxane polymer KR-341 (made by Shin-Etsu Chemical Co., Ltd.)
W4: Polyoxyethylene nonyl phenyl ether After filtered through a Teflon filter of 0.1 μm aperture size, each resist solution was coated, with use of a spin coater, on a silicon wafer that had been subjected to a hexamethyldisilazane treatment, and dried on a vacuum contact type-hot plate kept at 110° C. for 90 sec to give a 0.3 μm thick resist film. The coated film was subjected to an image exposure with a KrF excimer stepper (FPA-3000EX5, a product of Canon, Inc.). Then, after post-baked at 110° C. for 90 sec, the resist film was developed with a 0.262 N TMAH aqueous solution to give a L/S pattern of 0.15 μm rule.

Development defect and coating performance were evaluated as follows.

[Number of Development Defect] For each resist pattern prepared according to the procedures described above, the number of development defect was measured with use of a KLA-2112 inspector manufactured by KLA-Tencor Corp. The primary data obtained was regarded as the number of development defect.

[Coating Performance (Uniformity over the Coated Plane)]

Each resist solution was coated on an 8-inch silicon wafer. Then, the same procedures for the preparation of the resist coating as described above were conducted to give a coated resist film for the measurement of the uniformity over the entire coated plane. With use of Lambda A manufactured by Dainippon Screen Mfg. Co., Ltd., the thickness of the coating was measured at 36 points evenly distributed along two wafer diameter directions running crosswise. The standard deviation of all the measured values was calculated. The samples in which the threefold of the standard deviation did not exceed 50 were evaluated as O, those in which the value was 50 or larger were evaluated as X.

The results of performance evaluation are shown in Table 6.

TABLE 6

| Resin (A) of the Invention | Surfactant Used | Development Defect | Coating Performance |
|---|---|---|---|
| P-41 | W1 | 30 | O |
| P-42 | W2 | 24 | O |
| P-43 | W3 | 20 | O |
| P-44 | W2 | 36 | O |
| P-45 | W2 | 30 | O |
| P-46 | W3 | 24 | O |
| P-47 | W1 | 22 | O |
| P-48 | W2 | 30 | O |
| P-49 | W3 | 30 | O |
| P-50 | W2 | 28 | O |
| P-51 | W1 | 40 | O |
| P-52 | W3 | 36 | O |
| P-53 | W3 | 35 | O |
| P-54 | W3 | 32 | O |
| P-55 | W1 | 38 | O |
| P-56 | W2 | 48 | O |
| P-57 | W1 | 46 | O |
| P-58 | W1 | 48 | O |
| P-41 | None | 2000 | X |
| P-41 | W4 | 650 | X |

From the results in Table 6, it is seen that the composition of the invention that is incorporated with a surfactant containing at least one of a group consisting of a fluorine atom and a silicon atom is superior, compared to Comparative Examples in which no such surfactant is incorporated, as for coating performance and gives rise to far fewer development defects.

[Evaluation of Image Forming Characteristics]

By using resins of the invention, resist solutions were prepared in the same way as in the term of [Measurement of Transmittance]. After filtered through a Teflon filter of 0.1 μm aperture size, each resist solution prepared above was coated on a silicon wafer that had been subjected to a hexamethyldisilazane treatment with use of a spin coater, and dried on a vacuum contact type-hot plate kept at 110° C. for 90 sec to give a 0.1 μm thick resist film. A 157 nm laser exposure-and-dissolution behavior analyzing apparatus, VUVES-4500 (manufactured by Lithotec Japan Corp.) was used for each of the resulting resist films to measure the dissolution contrast between the exposed and unexposed regions for 157 nm irradiation.

The results are shown in Table 7.

TABLE 7

| Resin of the Invention | Dissolution Contrast (tanθ) |
|---|---|
| P-41 | 6.0 |
| P-42 | 6.4 |
| P-43 | 6.8 |
| P-44 | 6.4 |
| P-45 | 6.0 |
| P-46 | 6.4 |
| P-47 | 6.4 |
| P-48 | 6.0 |
| P-49 | 6.1 |
| P-50 | 6.1 |
| P-51 | 6.0 |
| P-52 | 6.5 |
| P-53 | 6.2 |
| P-54 | 5.8 |
| P-55 | 5.9 |
| P-56 | 6.1 |
| P-57 | 6.0 |
| P-58 | 6.0 |
| Comparative Example 5 (Acetal-based KrF resist) | 5.3 *1) |

*1) The value when the resist was exposed to the KrF excimer laser (248 nm).

From the results of Table 7, it is seen that the compositions of the invention exhibit a dissolution contrast equivalent to that of the resist of the comparative example that is practically used for the KrF excimer laser, and thus have an equivalent image forming capability.

With use of a positive resist composition of the invention, one can further provide a positive resist composition with which surface roughness and storage stability are improved along with reduced development defect.

Further, one can provide a positive resist composition with reduced surface roughness and scum owing to the use of specified fluorine atom-containing resins.

Still further, with use of the positive resist composition of the invention, one can provide a positive resist composition that exhibits a sufficient transparency and a desirable image forming capability at a wavelength region as short as 157 nm, and that improves the coating performance and the development defect problem both of which are deteriorated by the use of a fluorine-containing resin.

The entire disclosure of each and every foreign patent application from which the benefit of foreign priority has been claimed in the present application is incorporated herein by reference, as if fully set forth.

What is claimed is:

1. A positive resist composition comprising:
   (A) a resin which decomposes by the action of acid to increase the solubility in an alkali developer, the resin comprising:
   a repeating unit (1) represented by the following general formula (I);
   a repeating unit (2) represented by the following general formula (II) that is copolymerizable with the repeating unit represented by the general formula (I) and has the function of decomposing by the action of acid to increase the solubility of the resin in an alkali developer;
   and
   a repeating unit (3) that is inactive to the action of acid and free of an alkali-soluble group; and
   (B) a compound capable of generating an acid upon irradiation with one an actinic ray and a radiation:

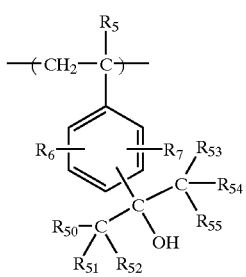

(I)

wherein $R_5$ represents a hydrogen atom, a halogen atom, a cyano group or an alkyl group which may have a substituent; $R_6$ and $R_7$, which may be the same or different, each represent a hydrogen atom, a halogen atom, a cyano group, a hydroxyl group or, an alkyl, a cycloalkyl, an alkoxyl, an acyl, an acyloxy, an alkenyl, an aryl or an aralkyl group, each of which may have a substituent; each of $R_{50}$ to $R_{55}$, which may be the same or different, represents a hydrogen atom, a fluorine atom or an alkyl group that may have a substituent; at least one of $R_{50}$ to $R_{55}$ represents a fluorine atom or an alkyl group in which at least a hydrogen atom is substituted with a fluorine atom;

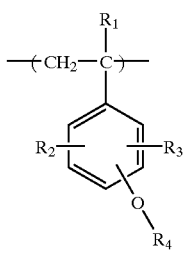

(II)

wherein $R_1$ represents a hydrogen atom, a halogen atom, a cyano group an alkyl group which may have a substituent; $R_2$ and $R_3$, which may be the same or different, each represents a hydrogen atom, a halogen atom, a cyano group, a hydroxyl group or, an alkyl, a cycloalkyl, and alkoxyl, an acyl, an acyloxy, an alkenyl, an aryl or an aralkyl group, each of which may have a substituent; $R_4$ represents a group represented by the following general formula (IV) or (V):

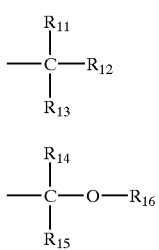

wherein $R_{11}$, $R_{12}$ and $R_{13}$, which may be the same or different, each represents an alkyl, a cycloalkyl, an alkenyl, an aralkyl, or an aryl group, each of which may have a substituent; two of $R_{11}$ to $R_{13}$ may connect together to form a ring; $R_{14}$ and $R_{15}$, which may be the same or different, each represents a hydrogen atom or an alkyl group that may have a substituent; $R_{16}$ represents an alkyl, a cycloalkyl, an aralkyl or an aryl group, each of which may have a substituent; and two of $R_{14}$ to $R_{16}$ may connect together to form a ring.

2. The positive resist composition according to claim 1, wherein the repeating unit (3) contains at least one fluorine atom.

3. The positive resist composition according to claim 1, wherein the repeating unit (3) is a repeating unit corresponding to a monomer selecting from the group consisting of: a (meth)acrylic acid ester; a (meth)acrylonitrile; and a styrene that may contain an alkyl group, an alkoxy group, an acyloxy group, a haloalkyl group, a chlorine atom, a bromine atom or a iodine atom as a substituent.

4. The positive resist composition according to claim 2, wherein the repeating unit (3) is a repeating unit selecting from the group consisting of: a repeating unit corresponding to an α-trifluoroacylic acid ester; a repeating unit corresponding to a fluorine-containing alkyl ester of (meth) acrylic acid; a repeating unit corresponding to a vinylphenol ester of a benzene sulfonic acid containing one of a fluorine atom and a fluorine-substituted alkyl group; and a repeating unit represented by the following formula (IV):

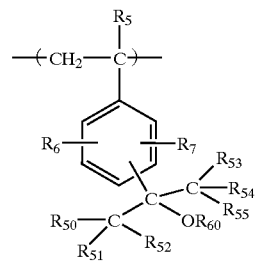

(IV)

wherein $R_5$ represents a hydrogen atom, a halogen atom, a cyano group or an alkyl group that may have a substituent; $R_6$ and $R_7$, which may be the same or different, each represent a hydrogen atom, a halogen atom, a cyano group, a hydroxyl group or, an alkyl, a cycloalkyl, an alkoxy, an acyl, an acyloxy, an alkenyl, an aryl or an aralkyl group, each of which may have a substituent; $R_{50}$ to $R_{55}$, which may be the same or different, each represent a hydrogen atom, a fluorine atom or an alkyl group that may have a substituent; at least one of $R_{50}$ to $R_{55}$ represents a fluorine atom or an alkyl group in which at least one hydrogen atom is substituted with a fluorine atom; $R_{60}$ represents an alkyl, an alkylcarbonyl, a monocyclic or polycyclic cycloalkyl, a monocyclic or polycyclic cycloalkylcarbonyl, an alkenyl, an alkenylcarbonyl, an aralkyl, an aralkylcarbonyl, an aryl or an arylcarbonyl group, each of which may have a substituent.

5. A positive resist composition comprising:

(A1) a resin which decomposes by the action of acid to increase the solubility in an alkali developer, the resin comprising a repeating unit represented by the following general formula (I), a repeating unit represented by the following general formula (II) and a repeating unit represented by the following general formula (VI); and (B) a compound capable of generating an acid upon irradiation with one of an actinic ray and a radiation:

(I)

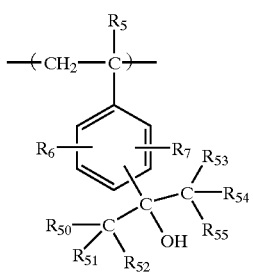

(II)

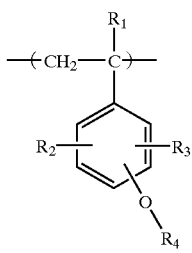

(VI)

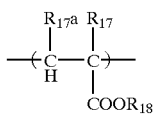

wherein $R_1$, $R_5$, $R_{17a}$ and $R_{17}$, which may be the same or different, each represent a hydrogen atom, a halogen atom, a cyano group or an alkyl group that may have substituent; $R_2$, $R_3$, $R_6$ and $R_7$, which may be the same or different, each represent a hydrogen atom, a halogen atom, a cyano group, a hydroxyl group or, an alkyl, a cycloalkyl, an alkoxy, an acyl, an acyloxy, an alkenyl, an aryl or an aralkyl group, each of which may have a substituent; $R_{50}$ to $R_{55}$, which may be the same or different, each represent a hydrogen atom, a fluorine atom or an alkyl group that may have a substituent; at least one of $R_{50}$ to $R_{55}$ represents a fluorine atom or an alkyl group in which at least one hydrogen atom is substituted with a fluorine atom; $R_4$ represents a group represented by the following general formula (IV) or (V); $R_{18}$ represents —$C(R_{18d})(R_{18e})(R_{18f})$ or —$C(R_{18d})(R_{18e})(OR_{18g})$; $R_{18d}$ to $R_{18g}$, which may be the same or different, represent a hydrogen atom or, an alkyl, a cycloalkyl, an alkenyl, an aralkyl or an aryl group, each of which may have a substituent; two of $R_{18d}$, $R_{18e}$ and $R_{18f}$, or two of $R_{18d}$, $R_{18e}$ and $R_{18g}$ may connect together to form a ring; at least one of $R_{18d}$, $R_{18e}$ and $R_{18f}$ or at least one of $R_{18d}$, $R_{18e}$ and $R_{18g}$ is a fluorine-containing group:

(IV)

$$-\overset{\underset{R_{13}}{|}}{\underset{}{C}}-R_{12}$$
$$R_{11}$$

(V)

$$-\overset{\underset{R_{15}}{|}}{\underset{}{C}}-O-R_{16}$$
$$R_{14}$$

wherein $R_{11}$, $R_{12}$ and $R_{13}$, which may be the same or different, each represent an alkyl, a cycloalkyl, an alkenyl, an aralkyl or an aryl group, each of which may have a substituent; two of $R_{11}$ to $R_{13}$ may connect together to form a ring; $R_{14}$ and $R_{15}$, which may be the same or different, each represent a hydrogen atom or an alkyl group that may have a substituent; $R_{16}$ represents an alkyl, a cycloalkyl, an aralkyl, or an aryl group, each of which may have a substituent; two of $R_{14}$ to $R_{16}$ may connect together to form a ring.

6. The positive resist composition according to claim 5, wherein $R_{18}$ in the general formula (VI) is represented by the following general formula (VI-B):

(VI-B)

wherein $R_{18h}$ represents an alkyl, an alkenyl, an alkynyl, an aralkyl or an aryl group, each of which may have a substituent; Z represents an atomic group constituting a monocyclic or polycyclic aliphatic group together with the carbon atom in general formula (VI-B); at least one of $R_{18h}$ and Z contains a fluorine atom.

7. The positive resist composition according to claim 5, wherein at least one of $R_5$ in the general formula (I) above, $R_1$ in the general formula (II) above and $R_{17}$ in the general formula (VI) above is a trifluoromethyl group.

8. The positive resist composition according to claim 5, wherein the resin (A1) further contains at least one repeating unit represented by the following general formulae (III) and (VII):

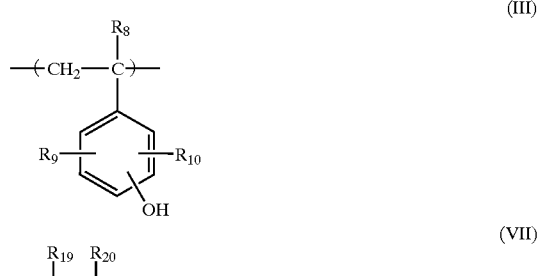

(III)

(VII)

wherein $R_8$ represents a hydrogen atom, a halogen atom, a cyano group or an alkyl group that may have a substituent; $R_9$ and $R_{10}$, which may be the same or different, each represents a hydrogen atom, a halogen atom, a cyano group or, an alkyl, a cycloalkyl, an alkoxy, an acyl, an acyloxy, an alkenyl, an aryl or an aralkyl group, each of which may have a substituent; $R_{19}$ and $R_{20}$, which may be the same or different, each represent a hydrogen atom, a halogen atom, a cyano group or an alkyl group that may have a substituent; $R_{21}$ represents a hydrogen atom, a halogen atom, an alkyl group that may have a substituent, or -$A_1$-CN; $A_1$ represents a single bond or a divalent connecting group.

9. The positive resist composition according to claim 5, wherein the resin (A1) further contains at least one of repeating units represented by the following general formulae (VIII) to (XVII):

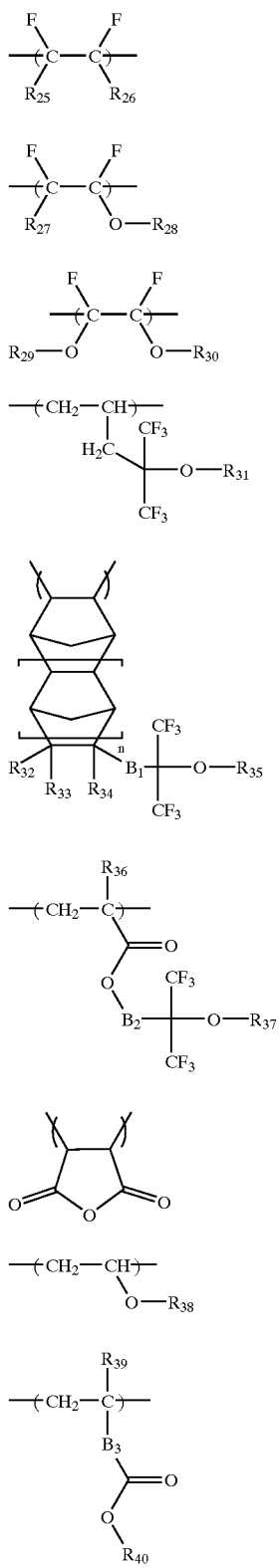

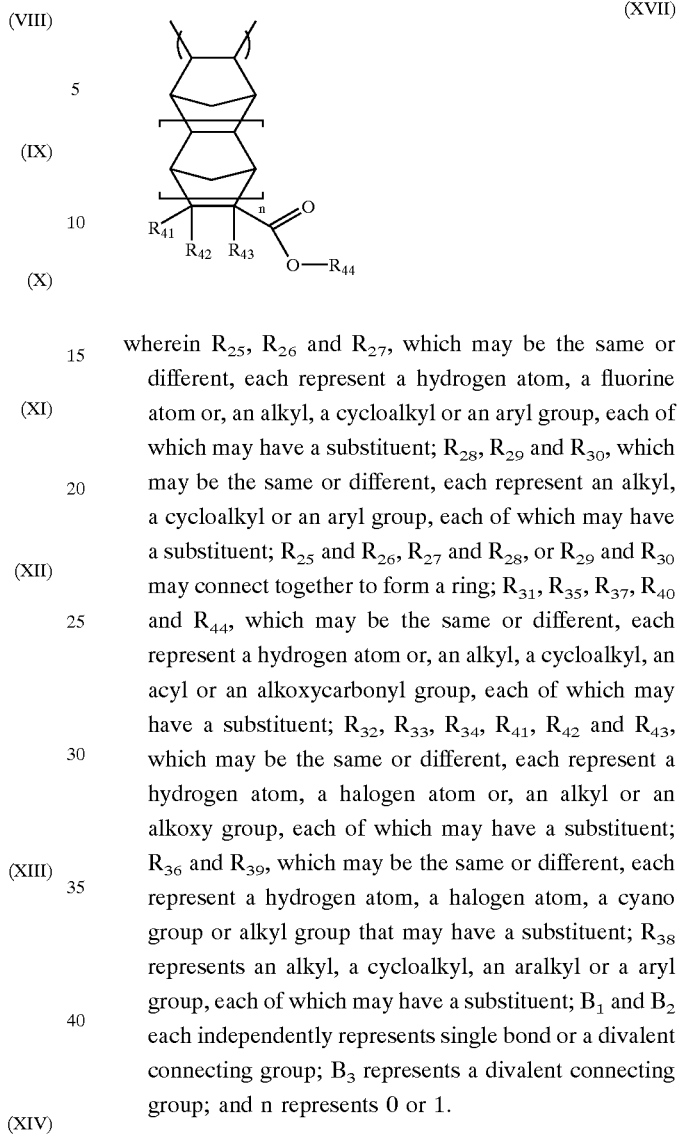

wherein $R_{25}$, $R_{26}$ and $R_{27}$, which may be the same or different, each represent a hydrogen atom, a fluorine atom or, an alkyl, a cycloalkyl or an aryl group, each of which may have a substituent; $R_{28}$, $R_{29}$ and $R_{30}$, which may be the same or different, each represent an alkyl, a cycloalkyl or an aryl group, each of which may have a substituent; $R_{25}$ and $R_{26}$, $R_{27}$ and $R_{28}$, or $R_{29}$ and $R_{30}$ may connect together to form a ring; $R_{31}$, $R_{35}$, $R_{37}$, $R_{40}$ and $R_{44}$, which may be the same or different, each represent a hydrogen atom or, an alkyl, a cycloalkyl, an acyl or an alkoxycarbonyl group, each of which may have a substituent; $R_{32}$, $R_{33}$, $R_{34}$, $R_{41}$, $R_{42}$ and $R_{43}$, which may be the same or different, each represent a hydrogen atom, a halogen atom or, an alkyl or an alkoxy group, each of which may have a substituent; $R_{36}$ and $R_{39}$, which may be the same or different, each represent a hydrogen atom, a halogen atom, a cyano group or alkyl group that may have a substituent; $R_{38}$ represents an alkyl, a cycloalkyl, an aralkyl or a aryl group, each of which may have a substituent; $B_1$ and $B_2$ each independently represents single bond or a divalent connecting group; $B_3$ represents a divalent connecting group; and n represents 0 or 1.

10. The positive resist composition according to claim 1 or 5, which further comprises a resin decomposing by the action of acid to increase the solubility in an alkali developer, the resin containing the repeating units (1) and (2).

11. The positive resist composition according to claim 1 or 5, which further comprises (D) a surfactant containing at least one of a fluorine atom and silicon atom.

12. The positive resist composition according to claim 1 or 5, which further comprises a basic compound containing a nitrogen atom as (E) an inhibitor of acid diffusion.

13. The positive resist composition according to claim 1 or 5, which is a composition to be irradiated by the $F_2$ laser light having a wavelength of 157 nm.

* * * * *